US012573812B2

(12) United States Patent
Kurosaka et al.

(10) Patent No.: US 12,573,812 B2
(45) Date of Patent: Mar. 10, 2026

(54) OPTICAL DEVICE AND LIGHT-EMITTING DEVICE

(71) Applicant: HAMAMATSU PHOTONICS K.K., Hamamatsu (JP)

(72) Inventors: Yoshitaka Kurosaka, Hamamatsu (JP); Kazuyoshi Hirose, Hamamatsu (JP); Yuu Takiguchi, Hamamatsu (JP); Akio Ito, Hamamatsu (JP); Tadataka Edamura, Hamamatsu (JP); Takahiko Yamanaka, Hamamatsu (JP); Shigeo Hara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 785 days.

(21) Appl. No.: 17/925,089

(22) PCT Filed: May 27, 2021

(86) PCT No.: PCT/JP2021/020258
§ 371 (c)(1),
(2) Date: Nov. 14, 2022

(87) PCT Pub. No.: WO2021/241701
PCT Pub. Date: Dec. 2, 2021

(65) Prior Publication Data
US 2023/0198224 A1      Jun. 22, 2023

(30) Foreign Application Priority Data

May 29, 2020      (JP) ................................. 2020-094937

(51) Int. Cl.
*H01S 3/094*          (2006.01)
*H01S 5/026*          (2006.01)
(Continued)

(52) U.S. Cl.
CPC ........ *H01S 5/026* (2013.01); *H01S 3/094092* (2013.01); *H01S 5/04254* (2019.08);
(Continued)

(58) Field of Classification Search
CPC ............... H01S 5/026; H01S 3/094092; H01S 5/04254; H01S 5/11; H01S 5/18308;
(Continued)

(56) References Cited

U.S. PATENT DOCUMENTS

2007/0280318 A1      12/2007 Yoshimoto et al.
2008/0212630 A1*     9/2008 Otake ................... H01S 3/0627
                                                               372/44.01
(Continued)

FOREIGN PATENT DOCUMENTS

CN          110546564 A      12/2019
JP          2000-332351 A    11/2000
(Continued)

OTHER PUBLICATIONS

Kurosaka, Y. et al., "Effects of non-lasing band in two-dimensional photonic-crystal lasers clarified using omnidirectional band structure," Opt. Express, 20, 2012, pp. 21773-21783.
(Continued)

*Primary Examiner* — Yuanda Zhang
(74) *Attorney, Agent, or Firm* — Faegre Drinker Biddle & Reath LLP

(57)          ABSTRACT

An optical device of one embodiment outputs light in a short-wavelength range such as a visible range. The optical device includes a UC layer, first and second light-confinement layers, and a resonance mode forming layer. The UC layer contains an upconversion material receiving excitation light in a first wavelength range and outputting light in a second wavelength range. The first light-confinement layer has a characteristic of reflecting part of the second wave-
(Continued)

length-range light. The second light-confinement layer has a characteristic of reflecting part of the second wavelength-range light and transmitting the remainder, and is disposed such that the UC layer locates between the first and second light-confinement layers. The resonance mode forming layer locates between the UC layer and the first or second light-confinement layer, includes a base layer and plural modified refractive index regions, and forms a resonance mode of the second wavelength-range light.

22 Claims, 58 Drawing Sheets

(51) Int. Cl.

| | | |
|---|---|---|
| *H01S 5/042* | (2006.01) | |
| *H01S 5/11* | (2021.01) | |
| *H01S 5/183* | (2006.01) | |
| *H01S 5/343* | (2006.01) | |
| *H01S 5/42* | (2006.01) | |

(52) U.S. Cl.
CPC ............ *H01S 5/11* (2021.01); *H01S 5/18308* (2013.01); *H01S 5/34313* (2013.01); *H01S 5/34353* (2013.01); *H01S 5/42* (2013.01); *H01S 5/423* (2013.01); *H01S 5/426* (2013.01); *H01S 2304/04* (2013.01)

(58) Field of Classification Search
CPC .... H01S 5/34313; H01S 5/34353; H01S 5/42; H01S 5/423; H01S 5/426
See application file for complete search history.

(56) References Cited

U.S. PATENT DOCUMENTS

| | | | |
|---|---|---|---|
| 2009/0161704 A1* | 6/2009 | Weichmann | H01S 5/14 |
| | | | 372/22 |
| 2016/0261093 A1 | 9/2016 | Noda et al. | |
| 2019/0288483 A1* | 9/2019 | Sugiyama | H01S 5/04256 |
| 2019/0312410 A1* | 10/2019 | Sugiyama | H01S 5/18 |
| 2021/0273411 A1* | 9/2021 | Uenoyama | H01S 5/185 |

FOREIGN PATENT DOCUMENTS

| | | | |
|---|---|---|---|
| JP | 2002-107778 A | 4/2002 | |
| JP | 2015-008278 A | 1/2015 | |
| JP | 2019-003041 A | 1/2019 | |
| WO | WO-2006/062084 A1 | 6/2006 | |
| WO | WO-2014/136607 A1 | 9/2014 | |

OTHER PUBLICATIONS

Zhou, Jing et al., "Upconversion Luminescent Materials: Advances and Applications," Chemical Reviews, 115, 2015, pp. 395-465.
International Preliminary Report on Patentability issued Dec. 8, 2022 in WO Patent Application No. PCT/JP2021/020258.

* cited by examiner

1A

Lout 16
15
14
11  } 10A
12A
12b
12a
13

27
21b
27a
21a
24  } 20A
22
23b
23a  23
25
26
28
21
27

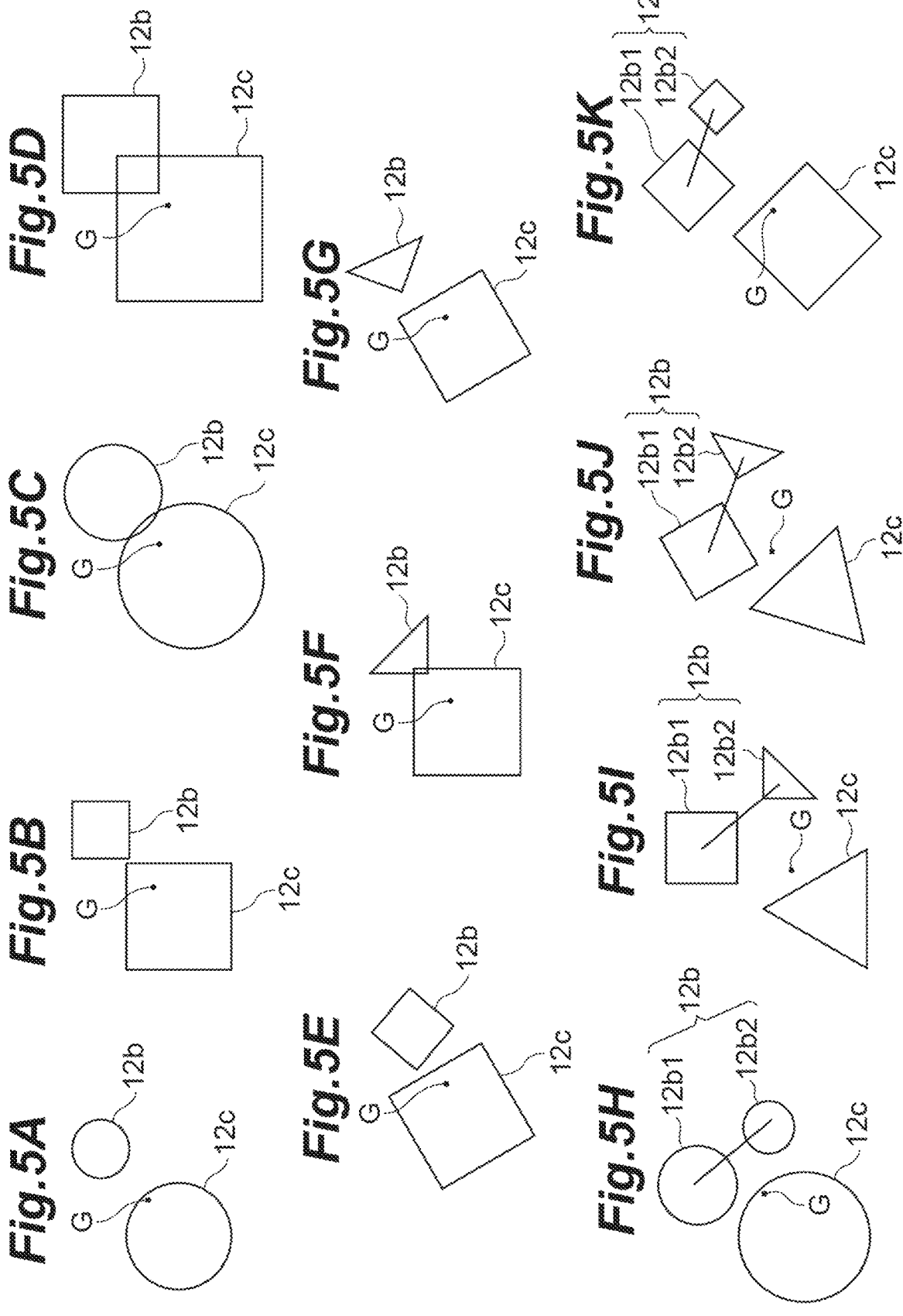

*Fig.11*
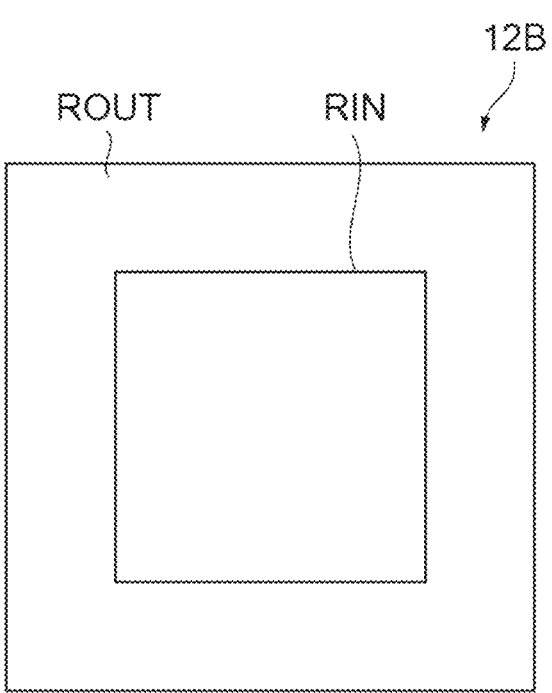
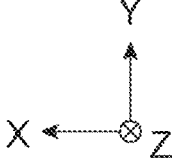

*Fig.12A*

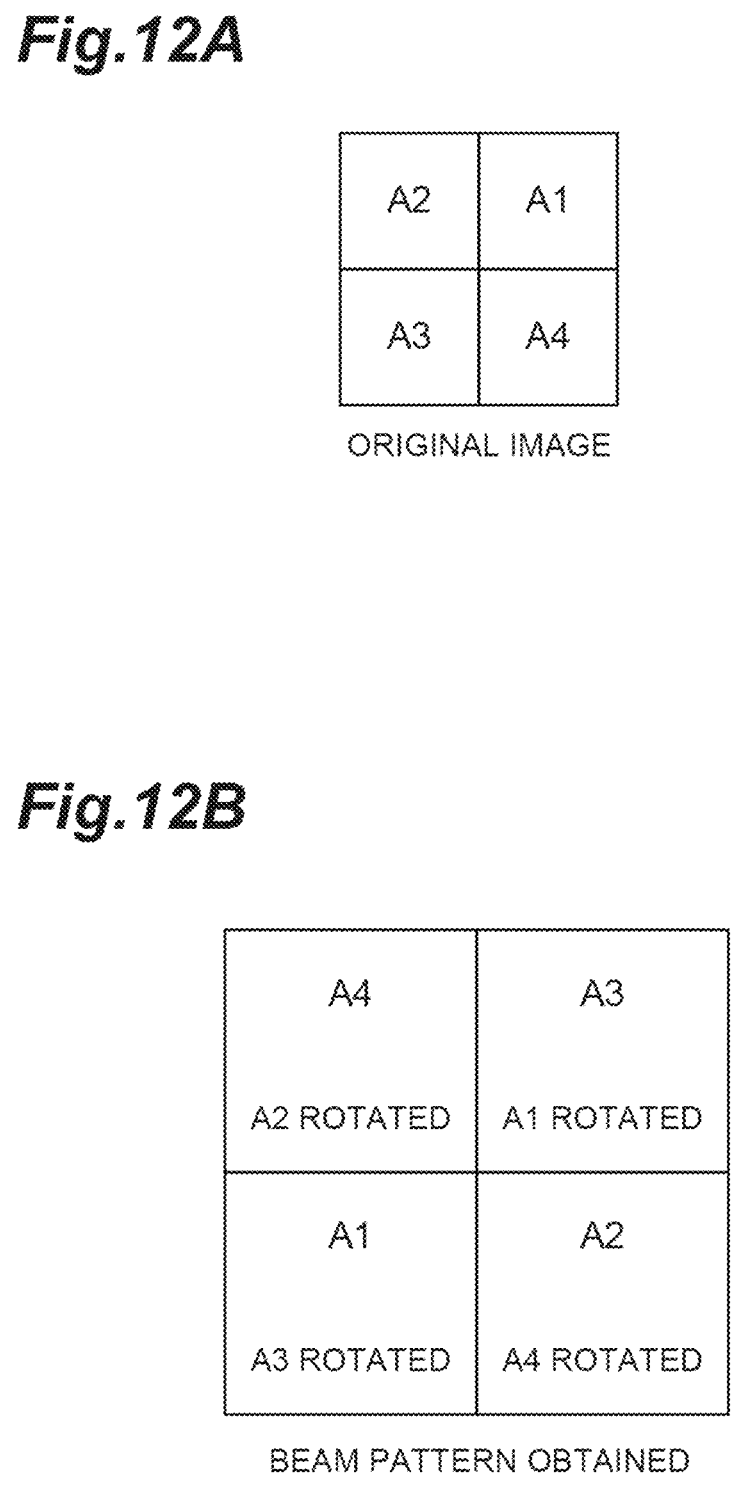

| | |
|---|---|
| A2 | A1 |
| A3 | A4 |

ORIGINAL IMAGE

*Fig.12B*

| | |
|---|---|
| A4<br><br>A2 ROTATED | A3<br><br>A1 ROTATED |
| A1<br><br>A3 ROTATED | A2<br><br>A4 ROTATED |

BEAM PATTERN OBTAINED

*Fig.43A*
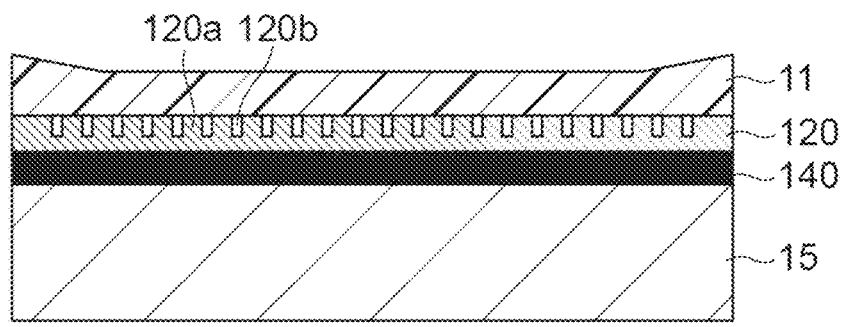
*Fig.43B*
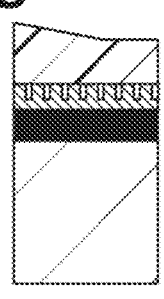 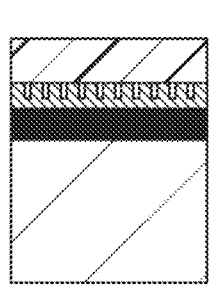 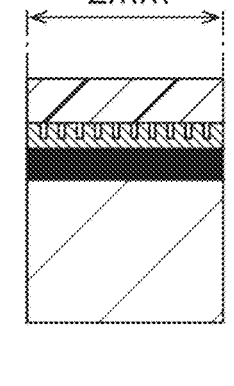 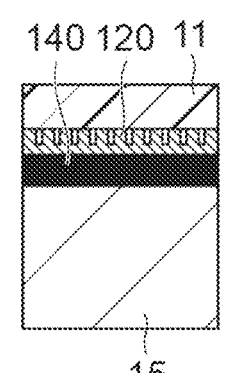 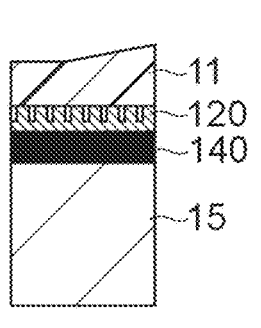
*Fig.43C*
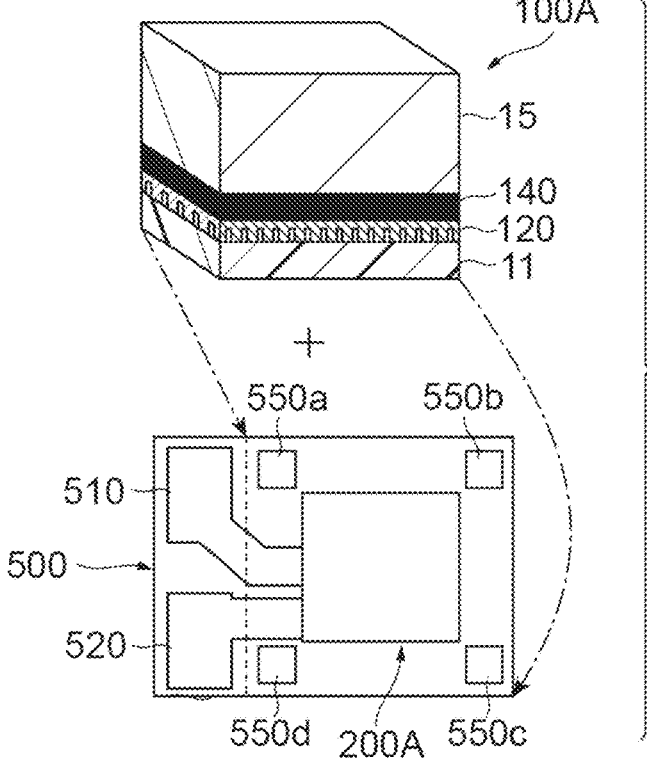

|  |  | STRUCTURE (a)<br>(PC LAYER=TiO2) | STRUCTURE (b)<br>(PC LAYER=SiN) |
|---|---|---|---|
|  | Γuc | 0.5% | 16.9% |
| DIFFRACTION INTENSITY κ2.0(cm⁻¹) | PATTERN1 (FF=10%) | 5299 | 2525 |
|  | PATTERN4 (FF=30%) | 6953 | 3313 |

*Fig.50A*
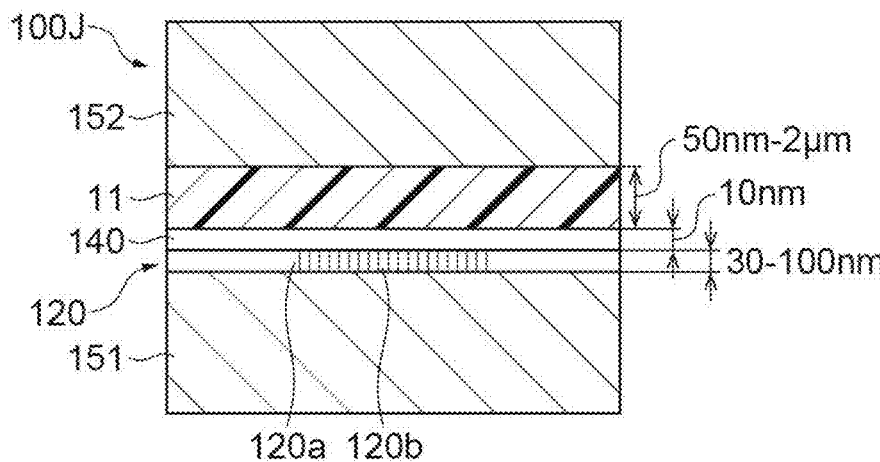
*Fig.50B*
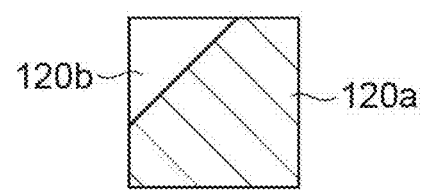
*Fig.50C*
| $K_{2,0}(cm^{-1})$ | | THICKNESS OF UC LAYER(nm) | | | | | |
|---|---|---|---|---|---|---|---|
| | | 50 | 100 | 200 | 500 | 1000 | 2000 |
| THICKNESS OF PC LAYER (nm) | 30 | 2111 | 1743 | 1553 | 1508 | 1508 | 1508 |
| | 50 | 2755 | 2493 | 2381 | 2362 | 2362 | 2362 |
| | 100 | 3368 | 3268 | 3239 | 3239 | 3239 | 3239 |
*Fig.50D*
| $\Gamma_{PC}(\%)$ | | THICKNESS OF UC LAYER(nm) | | | | | |
|---|---|---|---|---|---|---|---|
| | | 50 | 100 | 200 | 500 | 1000 | 2000 |
| THICKNESS OF PC LAYER (nm) | 30 | 41.9 | 34.8 | 31.0 | 30.1 | 30.1 | 30.1 |
| | 50 | 59.0 | 53.4 | 51.0 | 50.6 | 50.6 | 50.6 |
| | 100 | 81.1 | 78.7 | 78.0 | 78.0 | 78.0 | 78.0 |
*Fig.50E*
| $\Gamma_{UC}(\%)$ | | THICKNESS OF UC LAYER(nm) | | | | | |
|---|---|---|---|---|---|---|---|
| | | 50 | 100 | 200 | 500 | 1000 | 2000 |
| THICKNESS OF PC LAYER (nm) | 30 | 44.3 | 53.7 | 58.7 | 60.0 | 60.0 | 60.0 |
| | 50 | 30.1 | 36.8 | 39.6 | 40.0 | 40.0 | 40.0 |
| | 100 | 13.1 | 15.7 | 16.4 | 16.4 | 16.4 | 16.4 |
*Fig.50F*
| $n_{eff}$ | | THICKNESS OF UC LAYER(nm) | | | | | |
|---|---|---|---|---|---|---|---|
| | | 50 | 100 | 200 | 500 | 1000 | 2000 |
| THICKNESS OF PC LAYER (nm) | 30 | 1.64 | 1.65 | 1.65 | 1.65 | 1.65 | 1.65 |
| | 50 | 1.77 | 1.77 | 1.77 | 1.77 | 1.77 | 1.77 |
| | 100 | 1.99 | 1.99 | 1.99 | 1.99 | 1.99 | 1.99 |

*Fig.51*

| $K_{2,0}(cm^{-1})$ | | THICKNESS OF PC LAYER(nm) | | | | |
|---|---|---|---|---|---|---|
| | | 10 | 20 | 30 | 50 | 100 |
| THICKNESS OF TiO₂ LAYER (nm) | 0 | 110 | 648 | 1349 | 2455 | 3437 |
| | 5 | 241 | 826 | 1463 | 2431 | 3339 |
| | 10 | 354 | 930 | 1508 | 2362 | 3239 |
| | 20 | 470 | 1001 | 1471 | 2178 | 3012 |
| | 30 | 482 | 950 | 1354 | - | - |
| | 50 | 397 | 748 | 1058 | 1550 | 2328 |
| | 100 | - | - | - | 830 | 1418 |

| $\Gamma_{uc}(\%)$ | | THICKNESS OF PC LAYER(nm) | | | | |
|---|---|---|---|---|---|---|
| | | 10 | 20 | 30 | 50 | 100 |
| THICKNESS OF TiO₂ LAYER (nm) | 0 | 98.0 | 88.0 | 74.2 | 49.5 | 18.9 |
| | 5 | 92.8 | 79.8 | 66.0 | 43.6 | 17.1 |
| | 10 | 86.5 | 72.9 | 60.0 | 40.0 | 16.4 |
| | 20 | 71.4 | 58.7 | 48.0 | 32.6 | 14.4 |
| | 30 | 57.3 | 46.9 | 38.6 | - | - |
| | 50 | 36.5 | 30.3 | 25.5 | 18.7 | 9.9 |
| | 100 | - | - | - | 8.6 | 5.7 |

*Fig.52A*

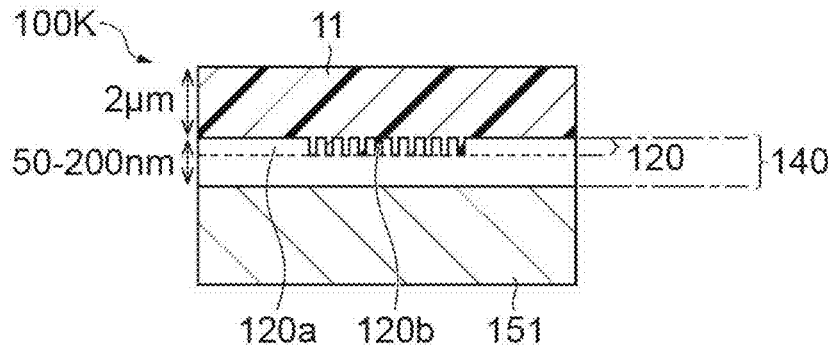

*Fig.52B*

| $K_{2,0}(cm^{-1})$ | | THICKNESS OF PHASE MODULATION LAYER(nm) | | | | | |
|---|---|---|---|---|---|---|---|
| | | 10 | 20 | 50 | 100 | 150 | 200 |
| THICKNESS OF LIGHT CONFINEMENT LAYER(nm) | 50 | 848 | 1768 | 4105 | | | |
| | 100 | 414 | 907 | 2886 | 6177 | | |
| | 200 | 0 | 0 | 90 | 20 | 4934 | 6615 |

*Fig.52C*

| $\Gamma_{PC}(\%)$ | | THICKNESS OF PHASE MODULATION LAYER(nm) | | | | | |
|---|---|---|---|---|---|---|---|
| | | 10 | 20 | 50 | 100 | 150 | 200 |
| THICKNESS OF LIGHT CONFINEMENT LAYER(nm) | 50 | 10.1 | 20.7 | 46.1 | | | |
| | 100 | 5.8 | 12.6 | 38.7 | 78.2 | | |
| | 200 | 0 | 0 | 1.4 | 0.3 | 71.2 | 93.2 |

*Fig.52D*

| $\Gamma_{uC}(\%)$ | | THICKNESS OF PHASE MODULATION LAYER(nm) | | | | | |
|---|---|---|---|---|---|---|---|
| | | 10 | 20 | 50 | 100 | 150 | 200 |
| THICKNESS OF LIGHT CONFINEMENT LAYER(nm) | 50 | 45.1 | 46.6 | 53.9 | | | |
| | 100 | 15.5 | 15.3 | 16.0 | 21.8 | | |
| | 200 | 99.3 | 100.0 | 88.9 | 99.2 | 5.0 | 6.8 |

*Fig.52E*

| $n_{eff}$ | | THICKNESS OF PHASE MODULATION LAYER(nm) | | | | | |
|---|---|---|---|---|---|---|---|
| | | 10 | 20 | 50 | 100 | 150 | 200 |
| THICKNESS OF LIGHT CONFINEMENT LAYER(nm) | 50 | 1.75 | 1.72 | 1.65 | | | |
| | 100 | 2.06 | 2.04 | 1.98 | 1.86 | | |
| | 200 | 2.31 | 2.30 | 2.28 | 2.21 | 2.21 | 2.07 |

*Fig.57A*
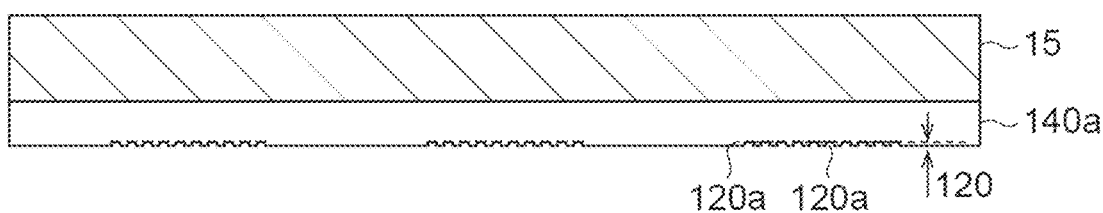
*Fig.57B*
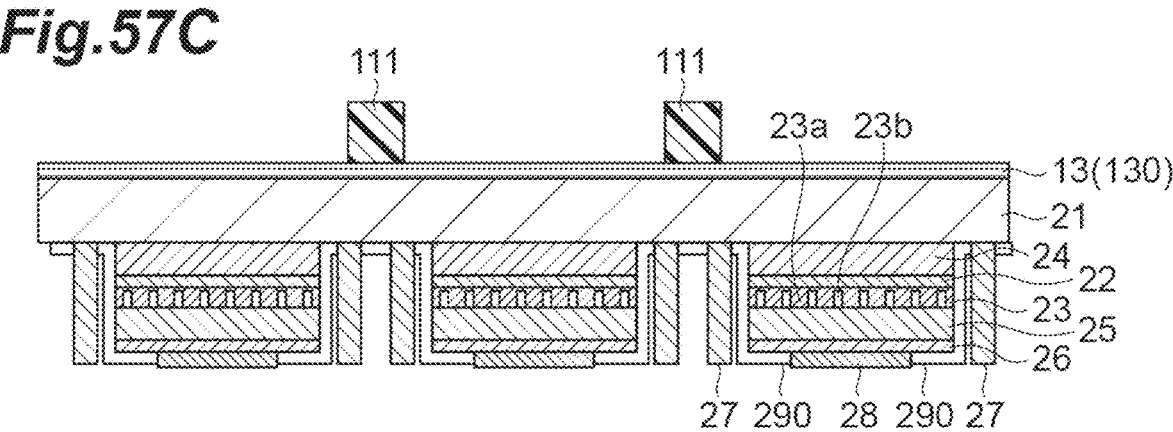
*Fig.57C*
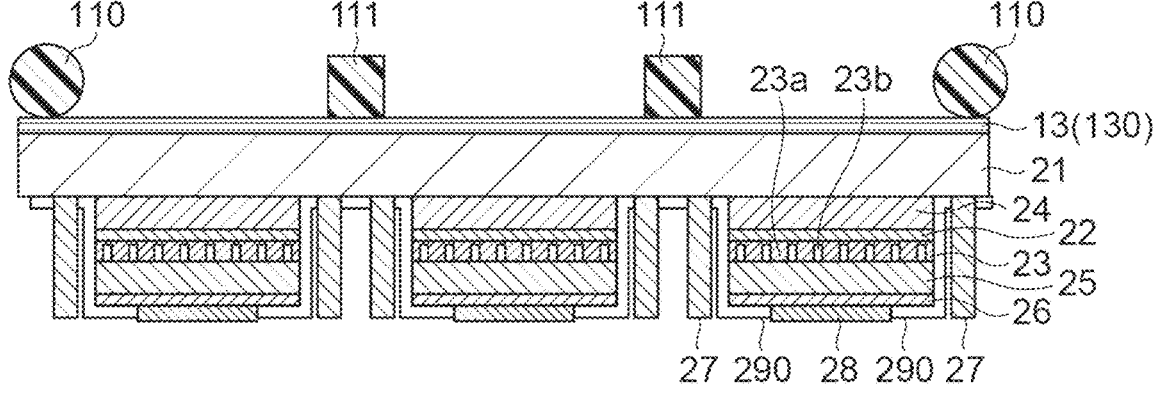
*Fig.57D*

*Fig.58A*
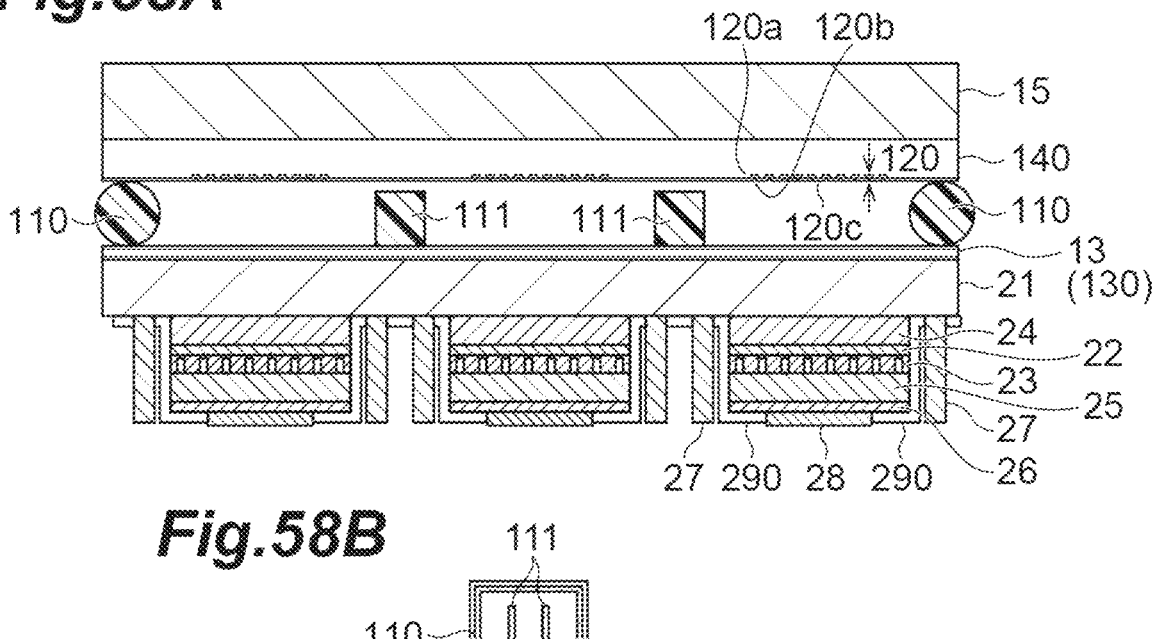
*Fig.58B*
*Fig.58C*
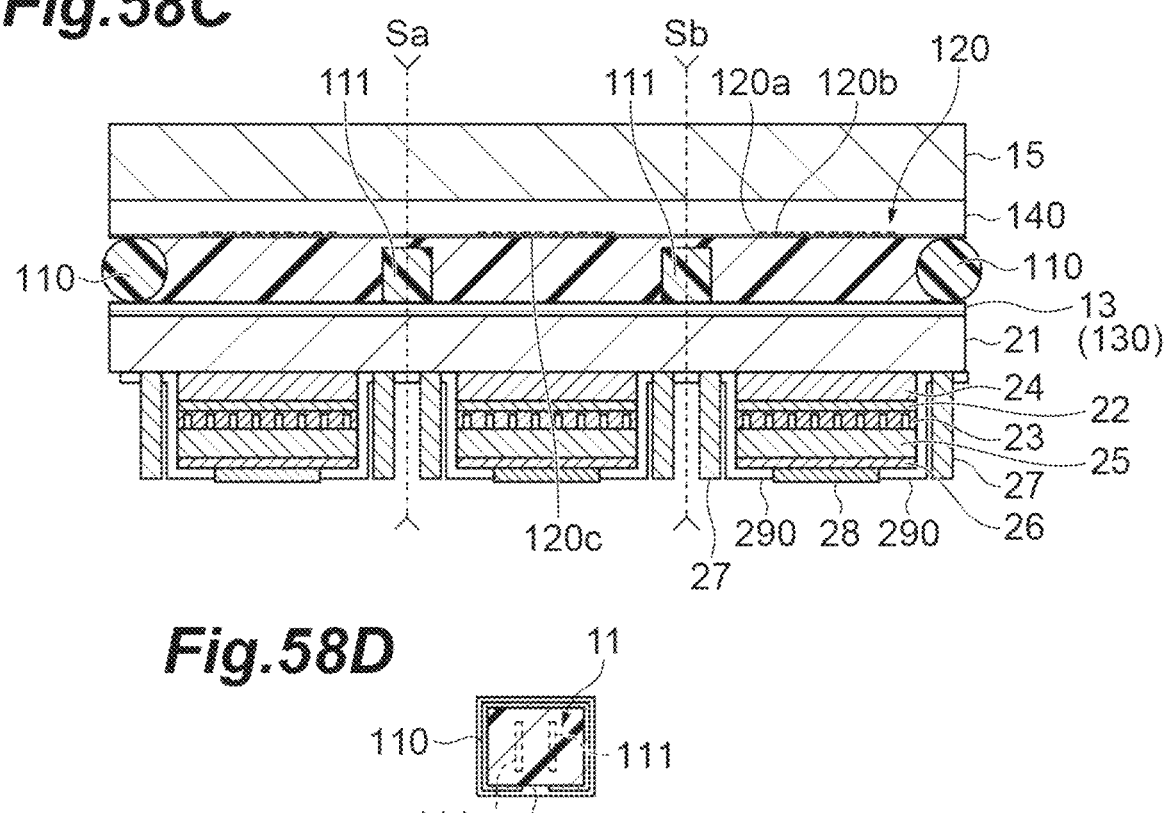
*Fig.58D*

OPTICAL DEVICE AND LIGHT-EMITTING DEVICE

TECHNICAL FIELD

The present disclosure relates to an optical device and a light-emitting device.

This application claims priority from Japanese Patent Application No. 2020-094937 filed on May 29, 2020, the content of which is relied upon and incorporated herein by reference in its entirety.

BACKGROUND ART

Patent Document 1 discloses a technique related to a semiconductor light-emitting device. The semiconductor light-emitting device includes a first conductive semiconductor layer and a second conductive semiconductor layer provided on a main surface of a substrate, an active layer that is sandwiched between the first conductive semiconductor layer and the second conductive semiconductor layer and generates light when a carrier is injected, a two-dimensional diffraction grating that is provided on a reference surface parallel to the main surface of the substrate and defines a wavelength of light to be generated in the active layer, and a light-emitting surface that is provided parallel to the main surface of the substrate and emits light generated in the active layer. The two-dimensional diffraction grating has, for example, a portion of a second refractive index provided so as to constitute the two-dimensional diffraction grating in a medium having a first refractive index, and the first refractive index is greater than the second refractive index. The two-dimensional diffraction grating is, for example, one of a triangular grating and a square grating.

CITATION LIST

Patent Literature

Patent Document 1: Japanese Patent Application Laid-Open No. 2000-332351

Non Patent Literature

Non-Patent Document 1: Jing Zhou et al., "Upconversion Luminescent Materials: Advances and Applications", Chemical Reviews, 115, pp. 395-465, (2015)

Non-Patent Document 2: Y. Kurosaka et al., "Effects of non-lasing band in two-dimensional photonic-crystal lasers clarified using omnidirectional band structure," Opt. Express 20, 21773-21783 (2012)

SUMMARY OF INVENTION

Technical Problem

As a result of studying the above-described conventional techniques, the inventors have found the following problems. That is, in a surface emitting type light-emitting element that outputs laser light in a direction intersecting the main surface of the substrate, a layer (for example, a photonic crystal layer, hereinafter, referred to as a "PC layer") that forms a resonance mode in a direction along the main surface of the substrate may be provided in the vicinity of the active layer. However, at present, a practical photonic crystal surface emitting laser or a phase modulation light-emitting element (static-iPMSEL) cannot be fabricated for a relatively short-wavelength range such as a green range or a blue range.

Specifically, in the case of a light-emitting element mainly including a GaAs-based semiconductor, the emission wavelength thereof is, for example, in a near-infrared range, and a light-emitting element having practical light output characteristics (for example, a low threshold current value) has been fabricated. However, in the case of a light-emitting element mainly including a nitride semiconductor such as GaN, the emission wavelength thereof is, for example, in the green range to the blue range, but the light confinement coefficient of the layer forming the resonance mode is excessively small due to the characteristics of the material, and thus a photonic crystal surface emitting laser or a phase modulation light-emitting element having practical light output characteristics has not yet been fabricated. In order to enrich color expression in the visible range, it is desirable to fabricate a practical photonic crystal surface emitting laser or phase modulation light-emitting element capable of outputting light having a wavelength shorter than the red range, for example, in the green range to the blue range.

The present disclosure has been made to solve the above-described problems, and an object of the present disclosure is to provide an optical device as a practical photonic crystal surface emitting laser or phase modulation light-emitting element capable of outputting light in a relatively short-wavelength range such as a green range or a blue range, and a light-emitting device including the optical device. As an example, an object is to provide a light-emitting device in which the optical device is applied to a photonic crystal surface emitting laser or a phase modulation light-emitting element as an excitation light source.

Solution to Problem

An optical device of the present disclosure includes an upconversion layer (hereinafter, referred to as a "UC layer"), a first light confinement layer (a light reflecting layer of a multilayer structure or a single layer), a second light confinement layer (a light reflecting layer of a multilayer structure or a single layer), and a resonance mode forming layer. The UC layer contains an upconversion material that receives excitation light in a first wavelength range and outputs light in a second wavelength range shorter than the first wavelength range. The first light confinement layer has a light reflection characteristic of reflecting at least a part of light in the second wavelength range. The second light confinement layer has a light reflection characteristic of reflecting a part of light in the second wavelength range and transmitting the remainder. In addition, the second light confinement layer is disposed such that the UC layer is located between the first light confinement layer and the second light confinement layer. That is, the second light confinement layer is disposed on an opposite side of the first light confinement layer with respect to the UC layer. The resonance mode forming layer is provided between the first light confinement layer and the UC layer or between the second light confinement layer and the UC layer. The resonance mode forming layer includes a base layer and a plurality of modified refractive index regions having a refractive index different from a refractive index of the base layer and two-dimensionally distributed on a reference surface perpendicular to a thickness direction of the resonance mode forming layer. As a result, the resonance mode forming layer forms a resonance mode of the light in the second wavelength range along the reference surface.

Advantageous Effects of Invention

According to the light-emitting device and the like of the present disclosure, for example, it is possible to provide a practical photonic crystal surface emitting laser or the like capable of outputting light in a relatively short-wavelength range such as a visible range.

BRIEF DESCRIPTION OF DRAWINGS

FIGS. 5A to 5K are diagrams illustrating examples of the shapes of the modified refractive index regions (part 3).
FIG. 11 is a plan view illustrating an example in which a refractive index structure illustrated in FIG. 7 is applied only to a specific region of the phase modulation layer.
FIGS. 12A and 12B are diagrams for explaining points to be noted in a case where calculation is performed using general discrete Fourier transform (or fast Fourier transform) to determine the arrangement of each modified refractive index region.

FIG. 32 is a diagram conceptually illustrating an example of a rotation angle distribution.
FIGS. 43A and 43B are diagrams for explaining a step of manufacturing an optical device (resonator unit) in the first manufacturing method,
and FIG. 43C is a diagram for explaining a step of mounting an optical device on the submount on which the excitation light source is already mounted in the first manufacturing method.

FIG. 50A illustrates an example of a cross-sectional structure of an optical device prepared for examining thickness dependency of a UC layer, FIG. 50B illustrates a hole shape applied for the examination, and FIGS. 50C to 50F are tables illustrating results of calculating a diffraction intensity $\kappa_{2,0}$, a distribution ratio $\Gamma_{PC}$, a distribution ratio $\Gamma_{UC}$, and an effective refractive index $n_{eff}$, respectively.

FIG. 51 is a table summarizing the dependence of the thickness of a light confinement layer on the thickness of a PC layer for the optical device having the cross-sectional structure illustrated in FIG. 50A.

FIG. 52A illustrates an example of a cross-sectional structure of an optical device prepared for examination, and FIGS. 52B to 52E are tables illustrating results of calculating a diffraction intensity $\kappa_{2,0}$, a distribution ratio $\Gamma_{PC}$, a distribution ratio $\Gamma_{UC}$, and an effective refractive index $n_{eff}$, respectively.

FIGS. 57A to 57D are diagrams for explaining the step of manufacturing the light-emitting device having the light confinement layer of the third structure illustrated in FIG. 54A as an example (part 3).

FIGS. 58A to 58D are diagrams for explaining the step of manufacturing the light-emitting device having the light confinement layer of the third structure illustrated in FIG. 54A as an example (part 4).

DESCRIPTION OF EMBODIMENTS

Description of Embodiments of Present Disclosure

Figure 1:
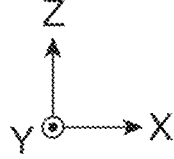
FIG. 1 is a diagram illustrating a cross-sectional structure of a light-emitting device according to a first embodiment.

First, contents of embodiments of the present disclosure will be individually listed and described.

(1) As an aspect of the present embodiment, an optical device according to the present disclosure includes a UC layer (upconversion layer), a first light confinement layer (reflecting layer or single layer), a second light confinement layer (reflecting layer or single layer), and a resonance mode forming layer. The UC layer contains an upconversion material that receives excitation light in a first wavelength range and outputs light in a second wavelength range shorter than the first wavelength range. The first light confinement layer has a light reflection characteristic of reflecting at least a part of light in the second wavelength range. The second light confinement layer has a light reflection characteristic of reflecting a part of light in the second wavelength range and transmitting the remainder. In addition, the second light confinement layer is disposed such that the UC layer is located between the first light confinement layer and the second light confinement layer. That is, the second light confinement layer is disposed on an opposite side of the first light confinement layer with respect to the UC layer. The resonance mode forming layer is provided between the first light confinement layer and the UC layer or between the second light confinement layer and the UC layer. The resonance mode forming layer includes a base layer and a plurality of modified refractive index regions having a refractive index different from a refractive index of the base layer and two-dimensionally distributed on a reference surface perpendicular to a thickness direction of the resonance mode forming layer. As a result, the resonance mode forming layer forms a resonance mode of the light in the second wavelength range along the reference surface.

The upconversion material refers to a material having a function of converting long-wavelength low-energy light such as near-infrared light into short-wavelength high-energy light. In this optical device, when the UC layer receives excitation light in the first wavelength range (for example, near infrared range), light in the second wavelength range (visible range such as a red range, a green range, or a blue range, for example) shorter than the first wavelength range is generated in the UC layer. The light in the second wavelength range is diffracted by the resonance mode forming layer while being confined between the first light confinement layer and the second light confinement layer. In the resonance mode forming layer, the resonance mode is formed along a predetermined direction (in-plane direction)

on the reference perpendicular to the thickness direction of the resonance mode forming layer, and laser light of a mode corresponding to the arrangement of the plurality of modified refractive index regions is generated. The laser light travels in the thickness direction of the resonance mode forming layer, passes through a second light reflecting layer, and is outputted to the outside of the optical device.

As described above, according to the above-described optical device, it is possible to output laser light having a relatively short wavelength based on excitation light having a relatively long wavelength. In addition, it is not necessary to use a nitride semiconductor such as GaN for the resonance mode forming layer, and the degree of freedom in selecting a material for the resonance mode forming layer is high. Therefore, it is also easy to increase the light confinement coefficient of the resonance mode forming layer. Therefore, according to the optical device according to the present disclosure, it is possible to provide a practical photonic crystal surface emitting laser or phase modulation light-emitting element (static-iPMSEL) capable of outputting light in a relatively short-wavelength range such as a visible range, for example.

Note that each of the first and second light confinement layers may be a light reflecting layer having a multilayer structure such as a dielectric multilayer film, or may be a single layer comprised of a single material having a substantially uniform refractive index distribution along at least the thickness direction (direction from the first light confinement layer toward the second light confinement layer) of the light confinement layer and having a refractive index lower than the refractive index of the UC layer. In addition, the resonance mode forming layer may be embedded in a light confinement layer having a single layer structure or on a surface region of the light confinement layer having the single layer structure. Specifically, in a case where the second light confinement layer includes a resonance mode forming layer, as one aspect of the present disclosure, the second light confinement layer has a single-layer structure in which a part of the second light confinement layer including a layer surface facing the UC layer constitutes a base layer, and a plurality of recesses for defining a plurality of modified refractive index regions are provided on the layer surface.

(2) As an aspect of the present embodiment in which a second light confinement layer has a single-layer structure in which a resonance mode forming layer is embedded, the optical device also includes a UC layer, a first light confinement layer (single layer), the second light confinement layer (reflecting layer or single layer), and the resonance mode forming layer, similarly to the above-described aspect. The UC layer receives excitation light in a first wavelength range and outputs light in a second wavelength range shorter than the first wavelength range. The first light confinement layer has a light reflection characteristic of reflecting at least a part of light in the second wavelength range. The second light confinement layer has a light reflection characteristic of reflecting a part of light in the second wavelength range and transmitting the remainder. In addition, the second light confinement layer has a single-layer structure in which the UC layer is disposed so as to be located between the first light confinement layer and the second light confinement layer, and a resonance mode of light in the second wavelength range is formed therein. The resonance mode forming layer forms the resonance mode of the light in the second wavelength range. Specifically, the resonance mode forming layer includes a base layer provided on a side on which a layer surface of the second light confinement layer facing the UC layer is located and constituting a part of the second light confinement layer, and a plurality of modified refractive index regions that are defined by a plurality of recesses two-dimensionally distributed on the layer surface of the second light confinement layer and have a refractive index different from the refractive index of the base layer.

(3) As one aspect of the present disclosure, the resonance mode forming layer may be a PC layer (photonic crystal layer) in which a plurality of modified refractive index regions are periodically arranged. In this case, the light in the second wavelength range outputted from the UC layer is diffracted by the PC layer while being confined between the first light confinement layer and the second light confinement layer. In the PC layer, a resonance mode is formed along a predetermined direction (in-plane direction) on a reference surface perpendicular to the thickness direction of the PC layer, and light oscillates at a wavelength corresponding to the arrangement period of the plurality of modified refractive index regions, and laser light is generated. For example, in a case where the arrangement period is a length of one wavelength of light in square lattice crystal, a part of the laser light is diffracted in the thickness direction of the PC layer, passes through the second light reflecting layer, and is outputted to the outside of the optical device. In addition to the PC layer, a phase modulation layer or the like can be applied to the resonance mode forming layer.

(4) The optical device may be an optical device (for example, a phase modulation light-emitting element) that outputs an optical image. That is, as one aspect of the present disclosure, in a virtual square lattice set on a reference surface on which a plurality of modified refractive index regions are to be formed, each of the plurality of modified refractive index regions may be arranged such that a line segment connecting the center of gravity of the modified refractive index region and a corresponding lattice point among lattice points of the virtual square lattice has a rotation angle corresponding to an optical image with respect to the virtual square lattice in a state where the center of gravity of each of the plurality of modified refractive index regions is separated from a corresponding lattice point among the lattice points of the virtual square lattice. In this case, the light in the second wavelength range outputted from the UC layer is diffracted by the resonance mode forming layer while being confined between the first light confinement layer and the second light confinement layer. In the resonance mode forming layer, the center of gravity of each of the plurality of modified refractive index regions has a rotation angle set for each of the modified refractive index regions around the lattice point of the virtual square lattice. In such a case, as compared with a case where the centers of gravity of the plurality of modified refractive index regions are located on the lattice points of the square lattice, the light intensity of the light outputted in the thickness direction (in other words, the direction perpendicular to the light output surface of the optical device) of the resonance mode forming layer, that is, the light intensity of the 0th-order light decreases, and light intensities of high-order light outputted in a direction inclined with respect to the direction, for example, light intensities of the +1st-order light and the −1st-order light increase. Furthermore, since the rotation angle of the center of gravity of each modified refractive index region around the lattice point is individually set according to the optical image, it is possible to modulate the phase of light independently for each modified refractive index region and output an optical image having an arbitrary shape in the second wavelength range.

(5) The optical device may be an optical device (for example, a phase modulation light-emitting element) that outputs an optical image. As one aspect of the present disclosure, in a virtual square lattice set on a reference surface on which a plurality of modified refractive index regions are to be formed, the position of the center of gravity of each of the plurality of modified refractive index regions may be located on a straight line that passes through a corresponding lattice point among lattice points of the virtual square lattice and that is inclined with respect to the square lattice, and a distance between the center of gravity thereof and the corresponding lattice point may be individually set according to an optical image. Light in the second wavelength range outputted from the UC layer is diffracted by the resonance mode forming layer while being confined between the first light confinement layer and the second light confinement layer. In the resonance mode forming layer, the center of gravity of each of the plurality of modified refractive index regions is arranged on a straight line that passes through a lattice point of the virtual square lattice and is inclined with respect to the square lattice. Even in such a case, the light intensity of the light (0th-order light) outputted in the direction perpendicular to the light output surface decreases, and the light intensity of high-order light such as +1st-order light and −1st-order light outputted in the direction inclined with respect to the direction increases. Furthermore, since the distance between the center of gravity of each modified refractive index region and the corresponding lattice point is individually set according to the optical image, it is possible to modulate the phase of light independently for each modified refractive index region and output an optical image having an arbitrary shape in the second wavelength range.

(6) As an aspect of the present disclosure, a diffractive optical element (DOE) disposed on an opposite side of the UC layer with respect to the second light confinement layer may be further included (that is, the second light confinement layer is located between the diffractive optical element and the UC layer). In this case, by forming in advance a phase distribution based on an optical image of an arbitrary shape in the diffractive optical element, laser light in the second wavelength range that has passed through (has been outputted from) the second light confinement layer can be converted into an optical image of an arbitrary shape. Therefore, an optical image having an arbitrary shape in the second wavelength range can be outputted.

(7) As an aspect of the present disclosure, a spatial light modulator disposed on an opposite side of the UC layer with respect to the second light confinement layer may be further included (that is, the second light confinement layer is located between the spatial light modulator and the UC layer). In this case, by presenting a phase pattern based on an optical image of an arbitrary shape in the spatial light modulator, laser light in the second wavelength range outputted through the second light confinement layer can be converted into an optical image of an arbitrary shape. Therefore, an optical image having an arbitrary shape in the second wavelength range can be outputted.

(8) As an aspect of the present disclosure, a dichroic mirror disposed on an opposite side of the UC layer with respect to the second light confinement layer may be further included (that is, the second light confinement layer is located between the dichroic mirror and the UC layer). The light transmittance of the dichroic mirror for light in the second wavelength range is greater than the light transmittance of the dichroic mirror for light in the first wavelength range. In this case, even if a part of excitation light passes through the second light confinement layer and is mixed with the light in the second wavelength range without being absorbed by the UC layer, the excitation light is less likely to pass through the dichroic mirror than the light in the second wavelength range, and thus a component of the excitation light is reduced in the light that has passed through the dichroic mirror. Therefore, it is possible to suppress mixing of the excitation light into the light in the second wavelength range outputted from the optical device.

(9) As one aspect of the present disclosure, the first wavelength range may be a near-infrared range, and the second wavelength range may be a visible range. As described above, light in the near-infrared range can be easily obtained by, for example, a light-emitting device mainly including a GaAs-based semiconductor. On the other hand, light in the visible range, particularly in the green range to the blue range, can be obtained by a light-emitting device mainly including a nitride semiconductor such as GaN, for example, but it is difficult to obtain practical light output characteristics in a photonic crystal surface emitting laser or a phase modulation light-emitting element due to the characteristics of the material. On the other hand, according to the optical device according to the present disclosure, it is not necessary to use a nitride semiconductor such as GaN for the resonance mode forming layer, and the degree of freedom in selecting a material for the resonance mode forming layer is high. Therefore, it is possible to provide a practical photonic crystal surface emitting laser or phase modulation light-emitting element capable of outputting light in the visible range. As a result, color expression in the visible range can be enriched.

(10) In addition, as one aspect, a light-emitting device according to the present disclosure includes an optical device having the above-described structure and an excitation light source integrated with the optical device via the first light confinement layer. With this configuration, excitation light outputted from the excitation light source can be supplied to the UC layer. According to this light-emitting device, for example, it is possible to provide a practical surface emission type self-light-emitting device capable of outputting light in a relatively short-wavelength range such as a visible range.

(11) As an aspect of the present disclosure, the excitation light source may include a photonic crystal surface emitting laser disposed on an opposite side of the UC layer with respect to the first light confinement layer (that is, the first light confinement layer is disposed between the UC layer and the photonic crystal surface emitting laser). In addition, the light transmittance of the first light confinement layer for light in the first wavelength range is preferably greater than the light transmittance of the first light confinement layer for light in the second wavelength range. In this case, excitation light outputted from the photonic crystal surface emitting laser passes through the first light confinement layer and is supplied to the UC layer. Therefore, light in the second wavelength range can be suitably outputted from the optical device. In addition, according to this light-emitting device, since the optical device is formed on the light output surface of the photonic crystal surface emitting laser while the stacking directions are the same, it is possible to easily manufacture the light-emitting device in which the optical device and the excitation light source are integrated.

(12) As one aspect of the present disclosure, in the photonic crystal surface emitting laser or the phase modulation light-emitting element, the PC layer that is larger than a light-emitting region may be provided in order to suppress reflection at the end of the region. In this case, in the above-described light-emitting device, the area of the PC layer of the photonic crystal surface emitting laser viewed from the stacking direction of the photonic crystal surface emitting laser is larger than the area of the UC layer viewed from the stacking direction of the optical device. Further-more, in this case, as one aspect of the present disclosure, the photonic crystal surface emitting laser includes a semicon-ductor substrate, a semiconductor stack, a first electrode, and a second electrode. The semiconductor substrate has a main surface and a back surface. The semiconductor stack is provided on the main surface of the semiconductor substrate and includes an active layer and a PC layer. The first electrode is comprised of a metal material and is provided on the back surface of the semiconductor substrate. The second electrode is provided on the semiconductor stack. The first electrode may have an opening through which the excitation light passes, and at least a part of the first light confinement layer may be disposed in the opening of the first electrode. Since the first electrode provided on the back surface of the semiconductor substrate is comprised of metal, a larger current can be supplied as compared with a transparent electrode, and the light emission intensity of the photonic crystal surface emitting laser can be increased. In addition, since at least a part of the first light confinement layer is disposed in the opening of the first electrode, the first light confinement layer and the back surface of the semiconductor substrate can be brought close to each other. Further, in the light-emitting device according to the present disclosure, each of the active layer, the PC layer, and the phase modulation layer may be sandwiched between cladding layers having a lower refractive index at the top and the bottom. This makes it possible to effectively confine light in the active layer and the PC layer.

(13) As an aspect of the present disclosure, the excitation light source may include a plurality of photonic crystal surface emitting lasers disposed on an opposite side of the UC layer with respect to the first light confinement layer (that is, the first light confinement layer is disposed between the UC layer and the plurality of photonic crystal surface emitting lasers). In addition, the plurality of photonic crystal surface emitting lasers are arranged one-dimensionally or two-dimensionally along the surface of the first light con-finement layer. The light transmittance of the first light confinement layer for light in the first wavelength range is greater than the light transmittance of the first light confine-ment layer for light in the second wavelength range. In this case, since excitation light outputted from the plurality of photonic crystal surface emitting lasers passes through the first light confinement layer and is supplied to the UC layer, light in the second wavelength range can be suitably out-putted from the optical device. In addition, according to this light-emitting device, since the excitation light is generated using the plurality of photonic crystal surface emitting lasers arranged one-dimensionally or two-dimensionally side by side, the area of the optical device viewed from the light output direction can be further increased. Therefore, for example, the area of the optical image outputted from the light-emitting device can be further increased.

(14) As one aspect of the present disclosure, in a con-figuration in which the plurality of photonic crystal surface emitting lasers are provided, each photonic crystal surface emitting laser may include a semiconductor substrate, a semiconductor stack, a first electrode, and a second elec-trode. The semiconductor substrate has a main surface and a back surface. The semiconductor stack is provided on the main surface of the semiconductor substrate and includes an active layer and a PC layer. The first electrode is provided on the back surface of the semiconductor substrate and is comprised of a transparent conductive film. The second electrode is provided on the semiconductor stack. In addi-tion, the excitation light passes through the first electrode and reaches the first light confinement layer. In this case, as compared with a case where the first electrode is a metal electrode having an opening, a current density distribution supplied to the active layer of the photonic crystal surface emitting laser can be made uniform. Therefore, a light intensity distribution in a plane perpendicular to the output direction of the excitation light can be made nearly uniform, and the uniformity of the excitation of the UC layer can be improved.

(15) As one aspect of the present disclosure, the area of the PC layer of the photonic crystal surface emitting laser as viewed from the stacking direction of the photonic crystal surface emitting laser may be smaller than the area of the UC layer as viewed from the stacking direction of the optical device. Furthermore, in this case, as one aspect of the present disclosure, the photonic crystal surface emitting laser includes a semiconductor substrate, a semiconductor stack, a first electrode, and a second electrode. The semi-conductor substrate has a main surface and a back surface. The semiconductor stack is provided on the main surface of the semiconductor substrate and includes an active layer and a PC layer. The first electrode is provided on a region of the main surface of the semiconductor substrate that is exposed without being covered with the semiconductor stack. The second electrode is provided on the semiconductor stack. In this configuration, the first light confinement layer is dis-posed on the back surface of the semiconductor substrate. As described above, since both the first electrode and the second electrode are disposed on the main surface side of the semiconductor substrate, it is easy to mount the light-emitting device according to the present disclosure on a submount. Also, as an aspect of the present disclosure, the excitation light source may include a plurality of photonic crystal surface emitting lasers disposed on an opposite side of the UC layer with respect to the first light confinement layer (that is, the first light confinement layer is disposed between the UC layer and the plurality of photonic crystal surface emitting lasers). In addition, the plurality of photonic crystal surface emitting lasers are arranged one-dimension-ally or two-dimensionally along the surface of the first light confinement layer. The light transmittance of the first light confinement layer for light in the first wavelength range is greater than the light transmittance of the first light confine-ment layer for light in the second wavelength range.

As described above, each aspect listed in the section of [Description of Embodiments of Present Disclosure] is applicable to each of all the remaining aspects or to all combinations of these remaining aspects.

Details of Embodiments of Present Disclosure

Hereinafter, specific structures of an optical device and a light-emitting device according to the present disclosure will be described in detail with reference to the accompanying drawings. Note that the present invention is not limited to these examples, but is indicated by the claims, and is intended to include meanings equivalent to the claims and all modifications within the scope. In the description of the drawings, the same elements are denoted by the same reference signs, and redundant description is omitted.

First Embodiment

FIG. 1 is a cross-sectional view illustrating a configura-tion of a light-emitting device 1A according to a first embodiment of the present disclosure. The light-emitting device 1A includes an optical device 10A and an excitation light source 20A. The excitation light source 20A generates excitation light in a first wavelength range. The first wavelength range is, for example, a near-infrared range (0.75 μm to 1.4 μm). In one example, the wavelength of the excitation light is 940 nm. Each of the optical device 10A and the excitation light source 20A of the first embodiment is a photonic crystal surface emitting laser (PCSEL). The optical device 10A receives excitation light from the excitation light source 20A and outputs light Lout in a second wavelength range shorter than the first wavelength range. The second wavelength range is included in the visible range, and is, for example, a red range (620 nm to 750 nm), a green range (495 nm to 570 nm), or a blue range (450 nm to 495 nm). The optical device 10A and the excitation light source 20A will be specifically described below. For easy understanding, an XYZ orthogonal coordinate system is defined in the drawings as necessary. The light-emitting device 1A forms a standing wave along a predetermined direction (in-plane direction) on a reference surface parallel to the X-Y plane, and outputs the light Lout in a direction (Z-axis direction) perpendicular to a light output surface.

The optical device 10A of the first embodiment includes a UC layer 11 (upconversion layer), a PC layer 12A (photonic crystal layer), a first light reflecting layer 13 as a first light confinement layer, and a second light reflecting layer 14 as a second light confinement layer. These layers are parallel to the X-Y plane and are stacked along the Z-axis direction (matching the thickness direction of each layer). The light Lout passes through the second light reflecting layer 14 (and is outputted from the second light reflecting layer 14). Details of an upconversion material are described in Non-Patent Document 1, for example.

According to Non-Patent Document 1, the UC layer 11 is a layer containing the upconversion material. The UC layer 11 may be comprised of only the upconversion material, or the upconversion material may be present and dispersed inside resin. The upconversion material is a material that receives excitation light in the first wavelength range and outputs light in the second wavelength range. Unlike a normal emission phenomenon in which a high-energy (short-wavelength) photon is excited to generate a low-energy (long-wavelength) photon, upconversion is a phenomenon in which a low-energy (long-wavelength) photon is excited to generate a high-energy (short-wavelength) photon. In addition, as phenomena in which light having a shorter wavelength is generated from light having a certain wavelength, there are two-photon absorption-based luminescence and second harmonic generation, but the upconversion is different from these phenomena.

The upconversion includes upconversion by lanthanoid ions ($Er^{3+}$, $Ho^{3+}$, $Tm^{3+}$, and the like) and upconversion based on so-called triplet-triplet annihilation (TTA). According to Non-Patent Document 1, most of the currently known upconversion materials contain lanthanoid ions as a sensitizer and a luminescent agent. This is because f electrons of the lanthanoid ions have a large energy level, and many of the f electrons have a long lifetime (ms). The mechanism of the lanthanoid upconversion process is classified into three main processes: absorption in an excited state, energy transfer upconversion, and photon avalanche.

As the main raw material (upconversion material) of the resin (ultraviolet curable resin) applicable to the UC layer 11, at least one selected from the group consisting of acrylate and methacrylate is preferable as a photopolymerizable monomer. The photopolymerizable monomer selected may be either a monofunctional monomer or a polyfunctional monomer. Examples of the monofunctional monomer include carboxyethyl acrylate, isobonyl acrylate, octyl acrylate, lauryl acrylate, stearyl acrylate, nonylphenoxypolyethylene glycol acrylate, dicyclopentenyl acrylate, dicyclopentenyloxyethyl acrylate, dicyclopentanyl acrylate, benzyl acrylate, phenoxyethyl acrylate, dicyclopentenyloxyethyl methacrylate, dicyclopentanyl methacrylate, benzyl methacrylate, octyl methacrylate, and 2-ethylhexyl-diglycol acrylate. Examples of the polyfunctional monomer include diethylene glycol acrylate, 1,4-butanediol diacrylate, 1,6-hexanediol acrylate, 1,9-nonanediol diacrylate, polypropylene glycol diacrylate, EO-modified bisphenol A diacrylate, dicyclopentanyl diacrylate, neopentyl glycol-modified trimethylolpropane diacrylate, 4,4'-diacryloyloxystilbene, diethylene glycol methacrylate, 1,4-butanediol dimethacrylate, 1,6-hexanediol methacrylate, 1,9-nonanediol dimethacrylate, dicyclopentanyl dimethacrylate, neopentyl glycol dimethacrylate, EO-modified bisphenol A dimethacrylate, tris (2-acryloyloxyethyl) isocyanurate, and caprolactone-modified dipentaerythritol hexaacrylate.

The PC layer 12A which is a diffraction grating layer functions as a resonance mode forming layer in the first embodiment. The PC layer 12A is provided between the first light reflecting layer 13 or the second light reflecting layer 14 and the UC layer 11 (in the illustrated example, between the first light reflecting layer 13 and the UC layer 11). In the illustrated example, the PC layer 12A is adjacent to the UC layer 11.

The PC layer 12A includes a base layer 12a and a plurality of modified refractive index regions 12b. The base layer 12a is comprised of a first refractive index medium. The plurality of modified refractive index regions 12b are comprised of a second refractive index medium having a refractive index different from the refractive index of the first refractive index medium, and are present in the base layer 12a. The base layer 12a may be comprised of, for example, an inorganic material such as $SiO_2$ or an organic material such as resin. The constituent material of the base layer 12a may have insulating properties, may be a semiconductor, or may have conductivity. Each of the modified refractive index regions 12b may be a hole or may have a structure in which a solid medium is embedded in a hole. When the modified refractive index regions 12b are holes, the PC layer 12A may further include a layer for covering the holes on the base layer 12a. The constituent material of this layer may be the same as or different from the constituent material of the base layer 12a.

The plurality of modified refractive index regions 12b are two-dimensionally and periodically arranged in a plane (plane parallel to the X-Y plane) perpendicular to the thickness direction (Z-axis direction) of the PC layer 12A. In a case where the effective refractive index (equivalent refractive index) is $n_1$, the wavelength $\lambda_1$ ($=a_1 \times n_1$, where $a_1$ represents a lattice spacing) selected by the PC layer 12A is in the emission wavelength range (second wavelength range) of the UC layer 11. The PC layer 12A forms a resonance mode of light having the wavelength $\lambda_1$ on a plane perpendicular to the thickness direction of the PC layer 12A. The arrangement period of the plurality of modified refractive index regions 12b is set such that the light having the wavelength $\lambda_1$ performs Γ-point oscillation or M-point oscillation. Therefore, the PC layer 12A can select the wavelength $\lambda_1$ among emission wavelengths of the UC layer 11 and output light with the selected wavelength $\lambda_1$ to the outside.

Figure 2:
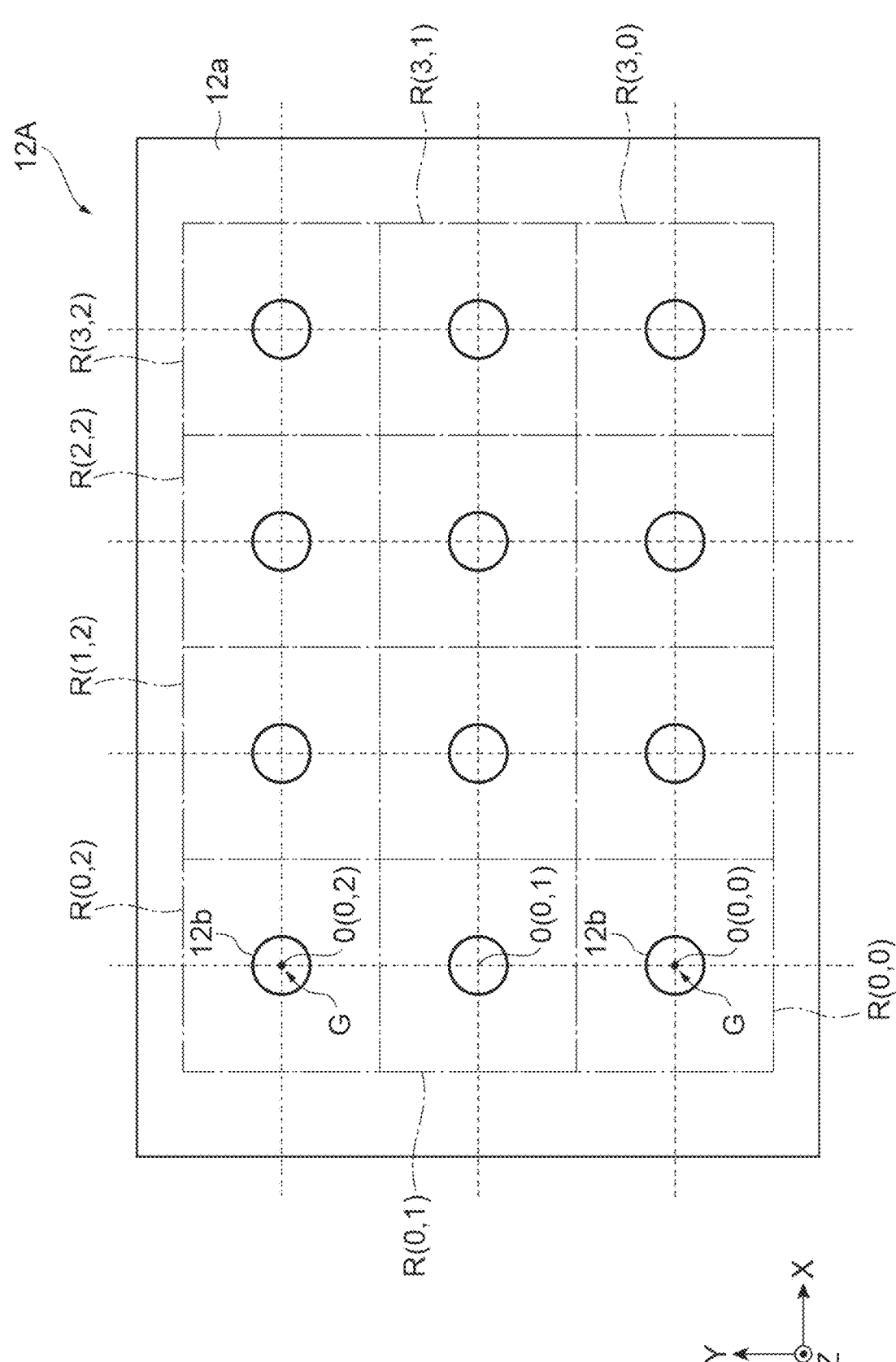
FIG. 2 is a plan view of a PC layer.

FIG. 2 is a plan view of the PC layer 12A. Here, in the PC layer 12A, a virtual square lattice is set on a plane (reference surface) parallel to the X-Y plane. One side of the square lattice is parallel to the X-axis, and the other side is parallel to the Y-axis. In this case, square unit constituent regions R centered on lattice points O of the square lattice can be set two-dimensionally over a plurality of columns (x=0, 1, 2, 3) along the X-axis and a plurality of rows (y=0, 1, 2) along the Y-axis. Each of the unit constituent regions R is a region surrounded by straight lines each bisecting lattice points of the virtual square lattice. One or two or more of the plurality of modified refractive index regions 12b are provided in each unit constituent region R. The planar shape of each modified refractive index region 12b is, for example, a circular shape. In the unit constituent region R(x, y), the center of gravity G of the modified refractive index region 12b overlaps (matches) the lattice point O(x, y). Note that the periodic structure of the plurality of modified refractive index regions 12b is not limited thereto, and for example, a triangular lattice may be set instead of the square lattice.

Figures 3A, 3B, 3C, 3D, 3E, 3F, 3G:
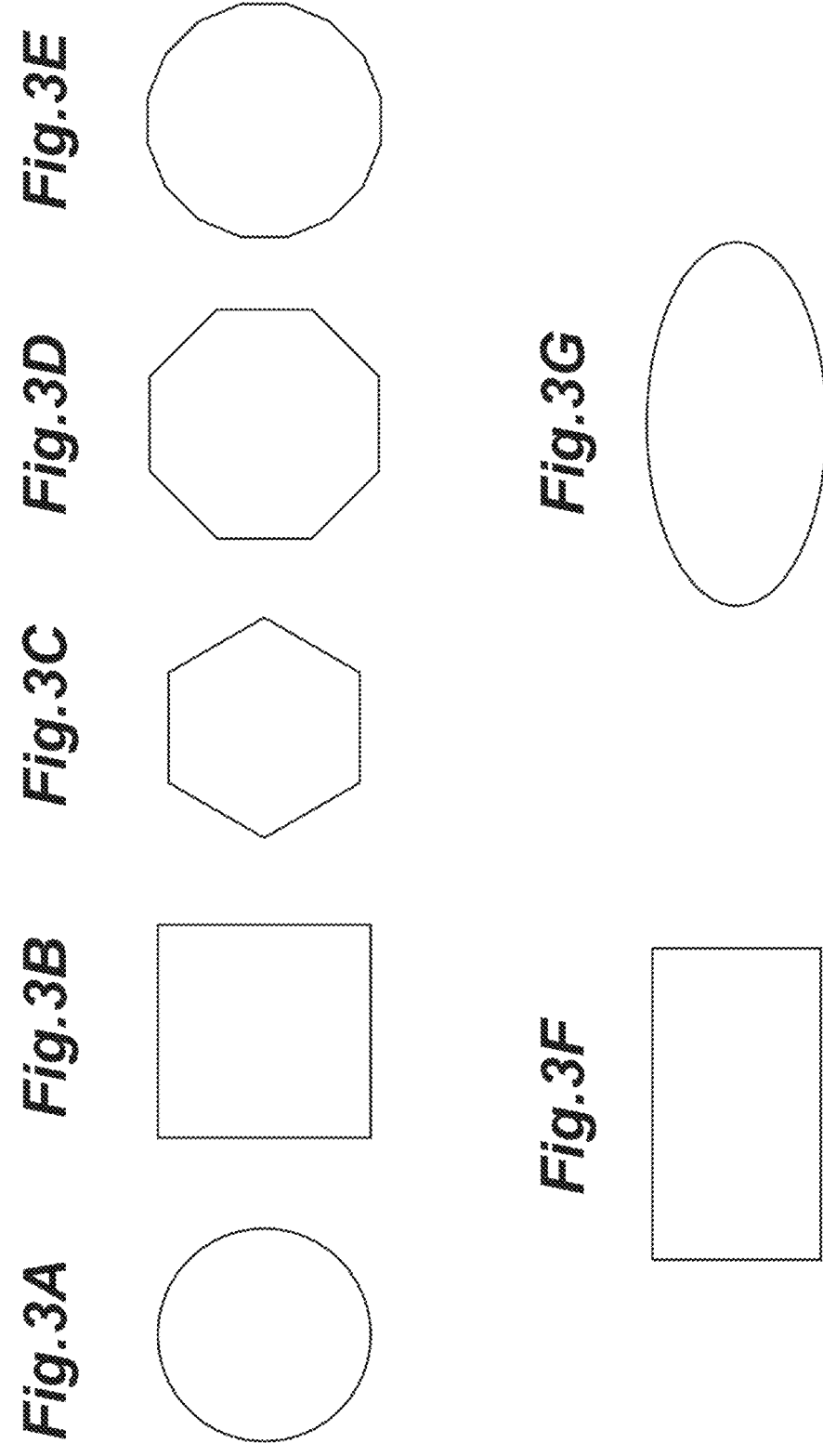
FIGS. 3A to 3G are diagrams illustrating examples of shapes of modified refractive index regions (part 1).

FIG. 2 illustrates an example in which the shape of each modified refractive index region 12b on the reference surface is circular, but each modified refractive index region 12b may have a shape other than the circular shape. For example, the shape of each modified refractive index region 12b may have mirror-image symmetry (line symmetry). Here, the mirror-image symmetry (line symmetry) means that the planar shape of the modified refractive index region 12b located on one side of a straight line on the reference surface parallel to the X-Y plane and the planar shape of the modified refractive index region 12b located on the other side of the straight line can be mirror-image symmetric (line symmetric) with each other. As examples of the shape having the mirror-image symmetry (line symmetry), for example, a perfect circle is illustrated in FIG. 3A, a square is illustrated in FIG. 3B, a regular hexagon is illustrated in FIG. 3C, a regular octagon is illustrated in FIG. 3D, a regular hexadecagon is illustrated in FIG. 3E, a rectangle is illustrated in FIG. 3F, and an ellipse is illustrated in FIG. 3G.

Figures 4A, 4B, 4C, 4D, 4E, 4F, 4G, 4H, 4I, 4J, 4K:
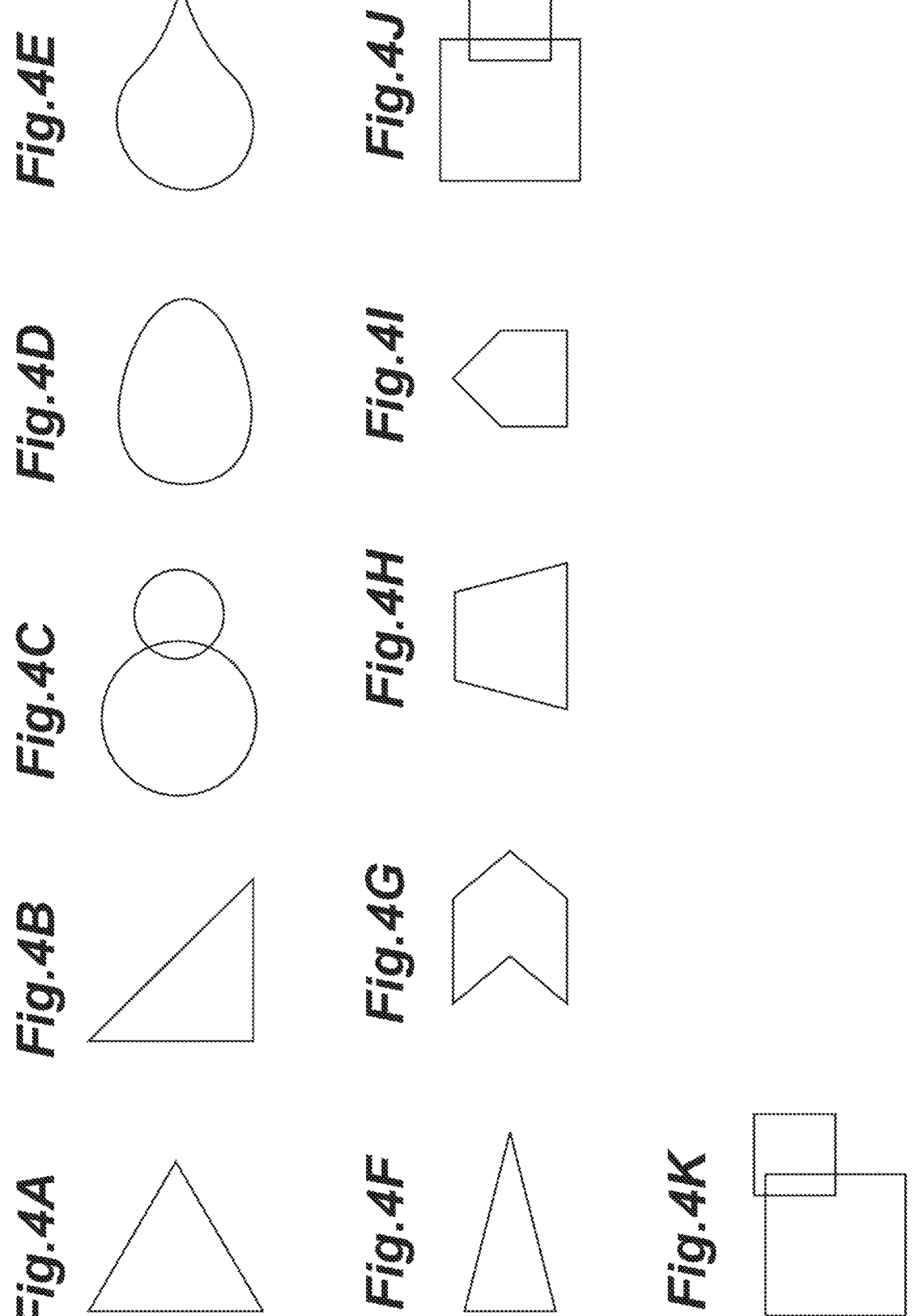
FIGS. 4A to 4K are diagrams illustrating examples of the shapes of the modified refractive index regions (part 2).

The shape of each modified refractive index region 12b defined on the reference surface parallel to the X-Y plane may be a shape having no rotational symmetry of 180°. Examples of the shape include, for example, an equilateral triangle illustrated in FIG. 4A, a right-angled isosceles triangle illustrated in FIG. 4B, a shape in which two circles or ellipses partially overlap each other as illustrated in FIG. 4C, an egg shape (shape deformed such that a dimension in the short axis direction near one end along the long axis of an ellipse becomes smaller than a dimension in the short axis direction near the other end) illustrated in FIG. 4D, a teardrop shape (shape in which one end portion along the major axis of an ellipse is deformed into a pointed end portion protruding along the major axis direction) illustrated in FIG. 4E, an isosceles triangle illustrated in FIG. 4F, an arrow shape (shape in which one side of a rectangle is recessed in a triangular shape and the opposing side is pointed in a triangular shape) illustrated in FIG. 4G, a trapezoid illustrated in FIG. 4H, a pentagon illustrated in FIG. 4I, and a shape in which two rectangles partially overlap each other as illustrated in FIG. 4J, and a shape in which two rectangles partially overlap each other and do not have mirror-image symmetry as illustrated in FIG. 4K. As described above, since the shape of each modified refractive index region 12b does not have the rotational symmetry of 180°, higher light output can be obtained.

FIGS. 5A to 5K are plan views illustrating other examples of the shape of each modified refractive index region defined on the reference surface parallel to the X-Y plane. In this example, a plurality of modified refractive index regions 12c different from the plurality of modified refractive index regions 12b are further provided. Each of the modified refractive index regions 12c is comprised of a second refractive index medium having a refractive index different from that of the first refractive index medium of the base layer 12a. Similarly to the modified refractive index regions 12b, each of the modified refractive index regions 12c may be a hole or may have a structure in which a solid medium is embedded in a hole. The modified refractive index regions 12c are provided in one-to-one correspondence with the modified refractive index regions 12b. The center of gravity G of each combination of the modified refractive index regions 12b and 12c is located on a lattice point of the unit constituent region R constituting the virtual square lattice. The modified refractive index regions 12b and 12c are included in the range of the unit constituent region R constituting the virtual square lattice.

The planar shape of each modified refractive index region 12c is, for example, circular, but the modified refractive index regions 12c may have various shapes similarly to the modified refractive index regions 12b. FIGS. 5A to 5K illustrate examples of shapes and relative relationships of the modified refractive index regions 12b and 12c in the XY plane. FIGS. 5A and 5B illustrate a mode in which the modified refractive index regions 12b and 12c have the same shape. FIGS. 5C and 5D illustrate a mode in which the modified refractive index regions 12b and 12c have the same shape and partially overlap each other. FIG. 5E illustrates a mode in which the modified refractive index regions 12b and 12c have the same shape and the modified refractive index regions 12b and 12c are rotated relative to each other. FIG. 5F illustrates a mode in which the modified refractive index regions 12b and 12c have different shapes. FIG. 5G illustrates a mode in which the modified refractive index regions 12b and 12c have different shapes and the modified refractive index regions 12b and 12c are rotated relative to each other.

In addition, as illustrated in FIGS. 5H to 5K, the modified refractive index region 12b may include two regions 12b1 and 12b2 separated from each other. Then, the distance between the center (corresponding to the center of gravity of the single modified refractive index region 12b) of gravity of a combination of the regions 12b1 and 12b2 and the center of gravity of the modified refractive index region 12c may be arbitrarily set in the unit constituent region R. In addition, in this case, as illustrated in FIG. 5H, the regions 12b1 and 12b2 and the modified refractive index regions 12c may have the same shape. Alternatively, as illustrated in FIG. 5I, shapes of two of the regions 12b1 and 12b2 and the modified refractive index region 12c may be different from the other region. In addition, as illustrated in FIG. 5J, in addition to the angle of a straight line connecting the regions 12b1 and 12b2 with respect to the X-axis, the angle of the modified refractive index region 12c with respect to the X-axis may be arbitrarily set in the unit constituent region R. In addition, as illustrated in FIG. 5K, while the regions 12b1 and 12b2 and the modified refractive index region 12c maintain the same relative angle, the angle of a straight line connecting the regions 12b1 and 12b2 with respect to the X-axis may be arbitrarily set in the unit constituent region R.

Note that a plurality of modified refractive index regions 12b may be provided in each unit constituent region R. Here, the unit constituent region R refers to a region having the minimum area in a region surrounded by a perpendicular bisector of a lattice point of a certain unit constituent region R and a lattice point of another unit constituent region arranged periodically, and corresponds to a Wigner-Seitz cell in solid physics. In this case, a plurality of modified refractive index regions 12b included in one unit constituent region R may have the same shape, and the centers of gravity of the modified refractive index regions 12b may be separated from each other. In addition, the shapes of the modified refractive index regions 12b may be the same between the unit constituent regions R, and may overlap each other between the unit constituent regions R by either a translation operation or a translation operation and a rotation operation. In that case, fluctuation of a photonic band structure is reduced, and a spectrum having a narrow line width can be obtained. Alternatively, the shapes of the modified refractive index regions are not necessarily the same between the unit constituent regions R, and the shapes may be different between the adjacent unit constituent regions R.

In the above-described structure, the modified refractive index regions 12b are holes, but in the modified refractive index regions 12b, an inorganic material having a refractive index different from the refractive index of the base layer 12a may be embedded in the holes. In that case, for example, after holes of the base layer 12a are formed by etching, the inorganic material may be embedded in the holes using a chemical vapor deposition method or the like. In addition, after the modified refractive index regions 12b are formed by embedding the inorganic material in the holes of the base layer 12a, the same inorganic material as the modified refractive index regions 12b may be further deposited thereon. When the modified refractive index regions 12b are holes, an inert gas such as argon or nitrogen, or a gas such as hydrogen or air may be sealed in the holes.

Refer again to FIG. 1. The first light reflecting layer 13 has a light reflection characteristic of reflecting at least a part of light in the second wavelength range including an emission wavelength of the UC layer 11. The first light reflecting layer 13 is located on the excitation light source 20A side with respect to the UC layer 11 and the PC layer 12A. The first light reflecting layer 13 includes, for example, a dielectric multilayer film (multilayer structure). The first light reflecting layer 13 of the first embodiment is a dichroic mirror, reflects light in the second wavelength range including the emission wavelength of the UC layer 11, and transmits light in the first wavelength range including a wavelength of excitation light outputted from the excitation light source 20A. In the illustrated example, the first light reflecting layer 13 is adjacent to the PC layer 12A. Note that it is not limited to the illustrated example, and another layer or gap may be provided between the first light reflecting layer 13 and the PC layer 12A (or the UC layer 11 when the UC layer 11 is present between the first light reflecting layer 13 and the PC layer 12A).

The second light reflecting layer 14 has a light reflection characteristic of reflecting a part of light having the emission wavelength (second wavelength range) of the UC layer 11 and transmitting the remainder The second light reflecting layer 14 is located on the opposite side of the excitation light source 20A with respect to the UC layer 11 and the PC layer 12A, and sandwiches the UC layer 11 and the PC layer 12A together with the first light reflecting layer 13. The second light reflecting layer 14 includes, for example, a dielectric multilayer film (multilayer structure). In the example of FIG. 1, the second light reflecting layer 14 is adjacent to the UC layer 11. Note that it is not limited to the example of FIG. 1, and another layer or gap may be provided between the second light reflecting layer 14 and the UC layer 11 (or the PC layer 12A when the PC layer 12A is present between the UC layer 11 and the second light reflecting layer 14).

The light-emitting device 1A of the first embodiment further includes a substrate 15 and a dichroic mirror 16. The substrate 15 is comprised of a material that transmits light having the emission wavelength (second wavelength range) of the UC layer 11, for example, a quartz plate. The second light reflecting layer 14 is formed on one surface of the substrate 15, and the dichroic mirror 16 is formed on the other surface. The dichroic mirror 16 is disposed on the opposite side of the UC layer 11 with respect to the second light reflecting layer 14. The dichroic mirror 16 reflects light in the first wavelength range including a wavelength of excitation light and transmits light in the second wavelength range including the emission wavelength of the UC layer 11. In other words, the light transmittance of the dichroic mirror 16 for light in the second wavelength range is greater than the light transmittance of the dichroic mirror 16 for light in the first wavelength range. The dichroic mirror 16 includes, for example, a dielectric multilayer film.

The dielectric multilayer films constituting the first light reflecting layer 13, the second light reflecting layer 14, and the dichroic mirror 16 are formed by alternately stacking a first layer having a first refractive index and a second layer having a second refractive index different from the first refractive index. The wavelength-light reflection (or transmission) characteristics of the dielectric multilayer films are determined based on the refractive index difference between the first refractive index and the second refractive index, the thicknesses of the first and second layers, and the number of stacked first and second layers. As a constituent material of the first and second layers, for example, titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), zirconium oxide ($ZrO_2$), and the like can be applied.

The thickness of the UC layer 11 is, for example, 0.1 μm or more and 50 μm or less. The thickness of the PC layer 12A is, for example, 70 nm. The thickness of the first light reflecting layer 13 is, for example, 10 μm. The thickness of the second light reflecting layer 14 is, for example, 10 μm.

Next, the excitation light source 20A of the first embodiment will be described. The excitation light source 20A is integrated with the optical device 10A via the first light reflecting layer 13 and supplies excitation light to the UC layer 11. As described above, the excitation light source 20A of the first embodiment is a PCSEL and is disposed at a position sandwiching the first light reflecting layer 13 together with the UC layer 11.

The excitation light source 20A includes a semiconductor substrate 21 having a main surface 21a and a back surface 21b, a semiconductor stack provided on the main surface 21a of the semiconductor substrate 21, a first electrode 27 (n-electrode), and a second electrode 28 (p-electrode). The semiconductor stack includes an active layer 22, a PC layer 23 (photonic crystal layer), a first cladding layer 24, a second cladding layer 25, and a contact layer 26. The first cladding layer 24 is provided on the main surface 21a of the semiconductor substrate 21, and is in contact with the main surface 21a of the semiconductor substrate 21 in one example. The second cladding layer 25 is provided on the first cladding layer 24. The active layer 22 is provided between the first cladding layer 24 and the second cladding layer 25. The energy band gap of the first cladding layer 24 and the energy band gap of the second cladding layer 25 are wider than the energy band gap of the active layer 22. The PC layer 23 is provided between the first cladding layer 24 and the active layer 22 or between the active layer 22 and the second cladding layer 25. In the example of FIG. 1, the PC layer 23 is provided between the active layer 22 and the second cladding layer 25, and is in contact with the second cladding layer 25 and the active layer 22. The contact layer 26 is provided on the second cladding layer 25. The thickness direction of the semiconductor substrate 21, the active layer 22, the PC layer 23, the first cladding layer 24, the second cladding layer 25, and the contact layer 26 matches the Z-axis direction.

If necessary, a light guide layer for adjusting a light distribution may be provided between the first cladding layer 24 and the active layer 22 and/or between the active layer 22 and the second cladding layer 25. The light guide layer may include a carrier barrier layer for efficiently confining carriers in the active layer 22. When the light guide layer is provided between the active layer 22 and the second cladding layer 25, the PC layer 23 is provided between the second cladding layer 25 and the light guide layer.

The PC layer 23 (diffraction grating layer) includes a base layer 23a and a plurality of modified refractive index regions 23b. The base layer 23a is a semiconductor layer comprised of a third refractive index medium. The plurality of modified refractive index regions 23b are comprised of a fourth refractive index medium having a refractive index different from that of the third refractive index medium, and are present in the base layer 23a. The plurality of modified refractive index regions 23b are two-dimensionally and periodically arranged on a reference surface (plane parallel to the X-Y plane) perpendicular to the thickness direction of the PC layer 23. In a case where the effective refractive index (equivalent refractive index) is $n_2$, the wavelength $\lambda_2$ ($=a_2 \times n_2$, where $a_2$ represents a lattice spacing) selected by the PC layer 23 is in the emission wavelength range (first wavelength range) of the active layer 22. The arrangement period of the plurality of modified refractive index regions 23b is set such that light having the wavelength $\lambda_2$ performs $\Gamma$-point oscillation. Therefore, the PC layer 23 can perform diffraction in the Z-axis direction by selecting the wavelength $\lambda_2$ among emission wavelengths of the active layer 22. Note that variations in the arrangement (however, the arrangement period is excluded) and shapes of the plurality of modified refractive index regions 23b are similar to those of the PC layer 12A described above (see FIGS. 2, 3A to 3G, 4A to 4K, and 5A to 5K).

The first electrode 27 is a metal electrode provided on the back surface 21b of the semiconductor substrate 21. The first electrode 27 is in ohmic contact with the semiconductor substrate 21. The first electrode 27 has a rectangular frame shape having an opening 27a through which excitation light passes as viewed along a direction perpendicular to the back surface 21b of the semiconductor substrate 21. The back surface 21b of the semiconductor substrate 21 is exposed from the first electrode 27 through the opening 27a, and the exposed portion faces the first light reflecting layer 13 of the optical device 10A. In one example, at least a part of the first light reflecting layer 13 in the thickness direction of the first light reflecting layer 13 is disposed in the opening 27a and is in contact with the back surface 21b of the semiconductor substrate 21.

The planar shape and size of the first light reflecting layer 13 match the planar shape and size of the UC layer 11. On the other hand, the planar shape and size of the outer edge of first electrode 27 match the planar shape and size of the PC layer 23. Therefore, the area of the PC layer 23 as viewed along the stacking direction (Z-axis direction) of the excitation light source 20A is larger than the area of the UC layer 11 as viewed from the stacking direction (Z-axis direction) of the optical device 10A by at least the first electrode 27. In other words, as viewed from the Z-axis direction, the contour of the UC layer 11 is located inside the contour of the PC layer 23.

The second electrode 28 is a metal electrode provided on the semiconductor stack (on the contact layer 26 in the example of FIG. 1) in a region (central region of the semiconductor stack) onto which at least the opening 27a of the first electrode 27 is projected. The second electrode 28 is in ohmic contact with the contact layer 26. Note that a portion of the contact layer 26 not in contact with the second electrode 28 may be removed. The second electrode 28 also has a function of reflecting light generated in the active layer 22.

As an example, the semiconductor substrate 21 is a GaAs substrate, and the first cladding layer 24, the active layer 22, the PC layer 23, the second cladding layer 25, and the contact layer 26 are comprised of a GaAs-based semiconductor. The first cladding layer 24 is an AlGaAs layer. The active layer 22 has a multiple quantum well structure (barrier layer: AlGaAs/quantum well layer: InGaAs, the number of well layers is, for example, three). The base layer 23a of the PC layer 23 is an AlGaAs layer or a GaAs layer, and the modified refractive index regions 23b are holes. The second cladding layer 25 is an AlGaAs layer. The contact layer 26 is a GaAs layer. In this case, the thickness of the semiconductor substrate 21 is, for example, 150 μm. The thickness of the first cladding layer 24 is, for example, 2000 nm. The thickness of the active layer 22 is, for example, 140 nm. The thickness of the PC layer 23 is, for example, 300 nm. The thickness of the second cladding layer 25 is, for example, 2000 nm. The thickness of the contact layer 26 is, for example, 200 nm. Assuming that the emission wavelength is 980 nm, the refractive index of the first cladding layer 24 is, for example, about 3.11, the refractive index of the active layer 22 is, for example, about 3.49, the refractive index of the second cladding layer 25 is, for example, about 3.27, and the refractive index of the contact layer 26 is, for example, about 3.52.

The first cladding layer 24 is of the same conductivity type as that of the semiconductor substrate 21, and the second cladding layer 25 and the contact layer 26 are of a conductivity type opposite to that of the semiconductor substrate 21. In one example, the semiconductor substrate 21 and the first cladding layer 24 are of n-type, and the second cladding layer 25 and the contact layer 26 are of p-type. When the PC layer 23 is provided between the active layer 22 and the first cladding layer 24, the PC layer 23 is of the same conductivity type as that of the semiconductor substrate 21. Conversely, when the PC layer 23 is provided between the active layer 22 and the second cladding layer 25, the PC layer 23 is of the conductivity type opposite to that of the semiconductor substrate 21. The impurity concentration is, for example, $1 \times 10^{16}$ to $1 \times 10^{21}/\mathrm{cm}^3$. In an intrinsic type (i-type) in which no impurity is intentionally added, the impurity concentration is $1 \times 10^{16}/\mathrm{cm}^3$ or less. The active layer 22 is not limited to the intrinsic type (i-type), and may be doped. Regarding the impurity concentration of the PC layer 23, the PC layer 23 may be of the intrinsic type (i-type) when it is necessary to suppress the effect of loss due to light absorption via the impurity level, for example.

The material of the first electrode 27 is appropriately selected according to the constituent material of the semiconductor substrate 21. When the semiconductor substrate 21 is an n-type GaAs substrate, the first electrode 27 may contain, for example, a mixture of Au and Ge. In one example, the first electrode 27 has an AuGe single layer or a stacked structure of an AuGe layer and an Au layer. The material of the second electrode 28 is appropriately selected according to the constituent material of the contact layer 26. When the contact layer 26 is comprised of p-type GaAs, the second electrode 28 can be comprised of, for example, a material containing at least one of Cr, Ti, and Pt and Au, and has, for example, a stacked structure of a Cr layer and an Au layer. However, the materials of the first electrode 27 and the second electrode 28 are not limited thereto as long as the ohmic junction can be obtained.

The light-emitting device 1A of the first embodiment having the above configuration operates as follows. When a drive current is supplied between the first electrode 27 and the second electrode 28, recombination of electrons and holes occurs in the active layer 22, and light in the first wavelength range (for example, near infrared range) is outputted from the active layer 22. The electrons and holes contributing to the light emission, and the generated light are efficiently distributed between the first cladding layer 24 and the second cladding layer 25. The light outputted from the active layer 22 is distributed between the first cladding layer 24 and the second cladding layer 25, enters the PC layer 23, and forms a resonance mode in a direction along the main surface 21a of the semiconductor substrate 21 according to the lattice structure inside the PC layer 23. Then, light oscillates with a wavelength corresponding to the arrangement period of the plurality of modified refractive index regions 23b, and laser light that is excitation light is generated. The excitation light diffracted in the Z-axis direction from the PC layer 23 travels in a direction perpendicular to the main surface 21a of the semiconductor substrate 21, and is directly outputted from the back surface 21b to the optical device 10A through the opening 27a, or is reflected on the second electrode 28 and then outputted from the back surface 21b to the optical device 10A through the opening 27a.

In the optical device 10A, when the UC layer 11 receives excitation light in the first wavelength range, light in the second wavelength range (for example, a visible range such as a red range, a green range, or a blue range) shorter than the first wavelength range is generated in the UC layer 11. The light in the second wavelength range is diffracted by the PC layer 12A while being confined between the first light reflecting layer 13 and the second light reflecting layer 14. In the PC layer 12A, a resonance mode is formed along a predetermined direction (in-plane direction) on a plane perpendicular to the thickness direction (Z-axis direction) of the PC layer 12A, and light oscillates with a wavelength corresponding to the arrangement period of the plurality of modified refractive index regions 12b (laser light Lout is generated). The laser light Lout travels in the thickness direction of the PC layer 12A, passes through the second light reflecting layer 14, and is outputted to the outside of the optical device 10A.

As described above, according to the optical device 10A of the first embodiment, it is possible to output the laser light Lout having a relatively short wavelength such as green light or blue light on the basis of excitation light having a relatively long wavelength such as near-infrared light or red light. In addition, since it is not necessary to use a nitride semiconductor such as GaN for the PC layer 12A and the degree of freedom in selecting a material for the PC layer 12A is high, it is also easy to increase the light confinement coefficient of the PC layer 12A. In addition, it is not necessary to use a high-cost GaN substrate. Therefore, according to the first embodiment, it is possible to provide the optical device 10A as a practical and low-cost PCSEL capable of outputting light in a relatively short-wavelength range such as the visible range, for example.

As in the first embodiment, the layer forming the resonance mode in the optical device 10A may be the PC layer 12A in which the plurality of modified refractive index regions 12b are periodically arranged. In this case, for example, it is possible to provide a practical PCSEL capable of outputting light in a relatively short-wavelength range such as the visible range.

As in the first embodiment, the optical device 10A may include a dichroic mirror 16 disposed on the opposite side of the UC layer 11 with respect to the second light reflecting layer 14 and having a light transmittance for light in the second wavelength range that is greater than a light transmittance for light in the first wavelength range. In this case, even if a part of the excitation light passes through the second light reflecting layer 14 and is mixed with the light in the second wavelength range without being absorbed by the UC layer 11, the excitation light is less likely to pass through the dichroic mirror 16 than the light in the second wavelength range, and thus a component of the excitation light is reduced in the light Lout that has passed through the dichroic mirror 16. Therefore, it is possible to effectively suppress mixing of the excitation light into the light Lout in the second wavelength range outputted from the optical device 10A.

As in the first embodiment, the first wavelength range may be the near-infrared range, and the second wavelength range may be the visible range. The light in the near-infrared range can be easily obtained by, for example, a light-emitting element mainly including a GaAs-based semiconductor. On the other hand, light in the visible range such as the green range to the blue range can be obtained by a light-emitting element mainly including a nitride semiconductor such as GaN, for example. However, in a PCSEL, it is difficult to obtain practical light output characteristics due to material characteristics. On the other hand, according to the optical device 10A of the first embodiment, since it is not necessary to use a nitride semiconductor such as GaN for the PC layer 12A and the degree of freedom in selecting a material for the PC layer 12A is high, it is possible to provide a practical PCSEL capable of outputting light in the visible range. As a result, color expression in the visible range can be enriched.

The light-emitting device 1A of the first embodiment includes the optical device 10A and the excitation light source 20A that is integrated with the optical device 10A and supplies excitation light to the UC layer 11. According to this light-emitting device 1A, for example, it is possible to provide a practical surface emission type self-light-emitting device capable of outputting light in a relatively short-wavelength range such as the visible range.

As in the first embodiment, the excitation light source 20A may include a PCSEL disposed at a position sandwiching the first light reflecting layer 13 together with the UC layer 11, and the light transmittance of the first light reflecting layer 13 for light in the first wavelength range may be greater than the light transmittance of the first light reflecting layer 13 for light in the second wavelength range. In this case, since the excitation light outputted from the excitation light source 20A passes through the first light reflecting layer 13 and is supplied to the UC layer 11, the light Lout in the second wavelength range can be suitably outputted from the optical device 10A. In addition, according to the light-emitting device 1A, since the optical device 10A is formed on the light output surface (the back surface 21b of the semiconductor substrate 21) of the excitation light source 20A while the stacking directions are the same, the light-emitting device 1A in which the optical device 10A and the excitation light source 20A are integrated can be easily manufactured.

As in the first embodiment, the area of the PC layer 23 viewed from the stacking direction of the excitation light source 20A may be larger than the area of the UC layer 11 viewed from the stacking direction of the optical device 10A. In the PCSEL, a photonic crystal larger than the light-emitting region may be provided in order to suppress reflection at the region end. In this case, the area of the PC layer 23 of the PCSEL viewed from the stacking direction of the PCSEL is larger than the area of the UC layer 11 viewed from the stacking direction of the optical device 10A.

As in the first embodiment, the excitation light source 20A which is a photonic crystal surface emitting laser may include a semiconductor substrate 21, a semiconductor stack, a first electrode 27 comprised of metal, and a second electrode 28. The semiconductor stack is provided on the main surface 21a of the semiconductor substrate 21 and includes an active layer 22 and a PC layer 23. The first electrode 27 is provided on the back surface 21b of the semiconductor substrate 21. The second electrode 28 is provided on the semiconductor stack. The first electrode 27 may have an opening 27a through which excitation light passes, and at least a part of the first light reflecting layer 13 in the thickness direction of the first light reflecting layer 13 may be disposed in the opening 27a of the first electrode 27. Since the first electrode 27 provided on the back surface 21b of the semiconductor substrate 21 is comprised of metal, a larger current can be supplied as compared with a transparent electrode, and as a result, the emission intensity of the excitation light source 20A can be increased. Therefore, the intensity of light in the second wavelength range outputted from the UC layer 11 can be increased, and laser oscillation in the optical device 10A can be more stably performed. At least a part of the first light reflecting layer 13 in the thickness direction of the first light reflecting layer 13 is disposed in the opening 27a of the first electrode 27, so that the first light reflecting layer 13 and the back surface 21b of the semiconductor substrate 21 can be brought close to each other.

Here, a method of manufacturing the light-emitting device 1A of the first embodiment will be described. First, crystal growth of the first cladding layer 24, the active layer 22, and the base layer 23a of the PC layer 23 is performed in this order on the main surface 21a of the semiconductor substrate 21 by, for example, metal organic chemical vapor deposition (MOCVD). Next, an electron beam resist is applied onto the surface of the base layer 23a, and the modified refractive index regions 23b are patterned by an electron beam lithography method. Then, the pattern of the electron beam resist is transferred to the base layer 23a by, for example, inductively coupled plasma (ICP) etching, and the PC layer 23 is formed. After the electron beam resist is removed, crystal growth of the second cladding layer 25 and the contact layer 26 is performed in this order on the PC layer 23 by, for example, MOCVD.

Subsequently, in order to thin the semiconductor substrate 21, the back surface 21b of the semiconductor substrate 21 is polished, and thereafter, mirror polishing is performed on the back surface 21b. Then, the first electrode 27 having the opening 27a is formed on the back surface 21b by photolithography, a vacuum deposition method, and a lift-off method. In addition, the second electrode 28 is formed on the surface of the contact layer 26 by photolithography, a vacuum deposition method, and a lift-off method. Note that either the formation of the first electrode 27 or the formation of the second electrode 28 may be performed first.

Furthermore, a dielectric multilayer film as the first light reflecting layer 13 is formed on the back surface 21b in the opening 27a of the first electrode 27 by, for example, a vacuum vapor deposition method. Subsequently to the formation of the first light reflecting layer 13, the base layer 12a (for example, an $SiO_2$ film) of the PC layer 12A is formed on the first light reflecting layer 13 by, for example, a vacuum deposition method. An electron beam resist is applied onto the surface of the base layer 12a, and the modified refractive index regions 12b are patterned by an electron beam lithography method. Then, the pattern of the electron beam resist is transferred to the base layer 12a by, for example, inductively coupled plasma (ICP) etching (formation of the PC layer 12A).

Subsequently, the first electrode 27 is exposed by photolithography and wet etching. Then, an upconversion material is applied onto the PC layer 12A by a method such as spin coating or screen printing, and the UC layer 11 is formed. Thereafter, the semiconductor substrate 21 and each layer formed on the semiconductor substrate 21 are cut into a chip shape by dicing.

Subsequently, the substrate 15 is prepared, and a dielectric multilayer film as the second light reflecting layer 14 is formed on one surface of the substrate 15 by, for example, a vacuum vapor deposition method. Further, a dielectric multilayer film as the dichroic mirror 16 is formed on the other surface of the substrate 15 by, for example, a vacuum vapor deposition method. Either the second light reflecting layer 14 or the dichroic mirror 16 may be formed first. Then, the second light reflecting layer 14 and the UC layer 11 are bonded. Alternatively, the substrate 15 is fixed to the UC layer 11 such that the second light reflecting layer 14 and the UC layer 11 are adjacent to each other. The light-emitting device 1A of the first embodiment is manufactured through the above-described steps.

Second Embodiment

In the first embodiment described above, the optical device 10A including the PC layer 12A in which the modified refractive index regions 12b are periodically arranged has been described. However, the optical device of the present disclosure is not limited to the PC layer (photonic crystal layer) in which the modified refractive index regions are periodically arranged, and may include various resonance mode forming layers. In recent years, a phase modulation light-emitting element that outputs an arbitrary optical image by controlling a phase spectrum and an intensity spectrum of light outputted from a plurality of light-emitting points arranged two-dimensionally has been studied. Such a phase modulation light-emitting element is called a static-integrable phase modulating (S-iPM) laser, and outputs an optical image of a spatial arbitrary shape. The resonance mode forming layer may include a configuration used for such an S-iPM laser.

Figure 6:
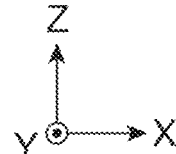
FIG. 6 is a diagram illustrating a cross-sectional structure of a light-emitting device according to a second embodiment.

FIG. 6 is a diagram illustrating a cross-sectional structure of a light-emitting device 1B according to a second embodiment. The light-emitting device 1B of the second embodiment includes an optical device 10B instead of the optical device 10A of the first embodiment. Note that the configuration of an excitation light source 20A included in the light-emitting device 1B is similar to that of the first embodiment. A difference between the optical device 10B of the second embodiment and the optical device 10A of the first embodiment is a configuration of a resonance mode forming layer. The optical device 10B of the second embodiment includes a phase modulation layer 12B as the resonance mode forming layer instead of the PC layer 12A of the above-described embodiment.

Figure 7:
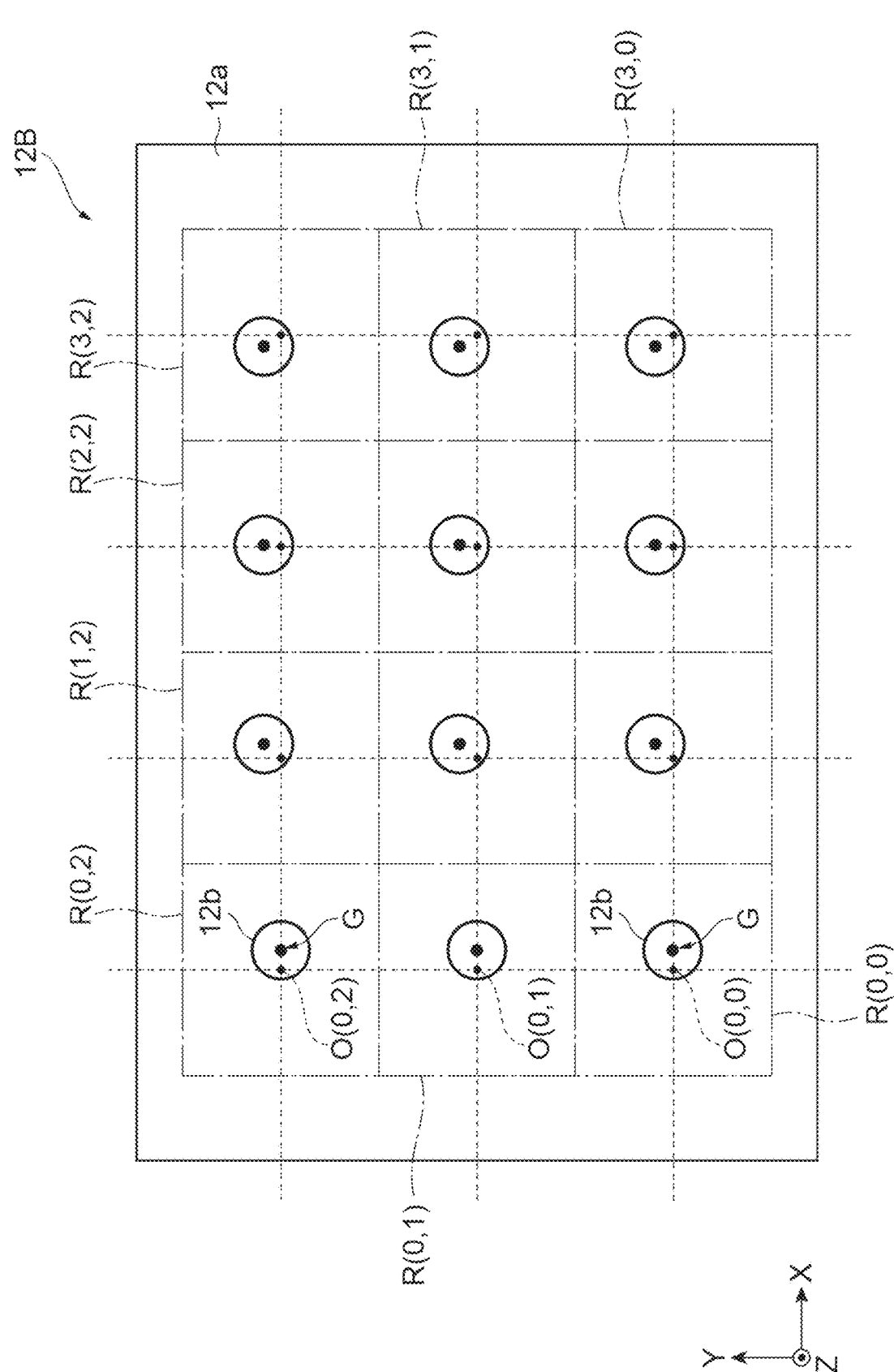
FIG. 7 is a plan view of a phase modulation layer.

FIG. 7 is a plan view of the phase modulation layer 12B. The phase modulation layer 12B includes a base layer 12a including a first refractive index medium and modified refractive index regions 12b including a second refractive index medium having a refractive index different from that of the first refractive index medium. Here, in the phase modulation layer 12B, a virtual square lattice is set on a reference plane parallel to the X-Y plane. One side of the square lattice is parallel to the X-axis, and the other side is parallel to the Y-axis. In this case, square unit constituent regions R centered on lattice points O of the square lattice can be set two-dimensionally over a plurality of columns (x=0, 1, 2, 3) along the X-axis and a plurality of rows (y=0, 1, 2) along the Y-axis. Each of the modified refractive index regions 12b is provided in a respective one of the unit constituent regions R. The planar shapes of the modified refractive index regions 12b can be various shapes such as a circular shape, similarly to the first embodiment described above. In the unit constituent region R(x, y), the center of gravity G of the modified refractive index region 12b is disposed away from the corresponding lattice point O(x, y).

Figure 8:
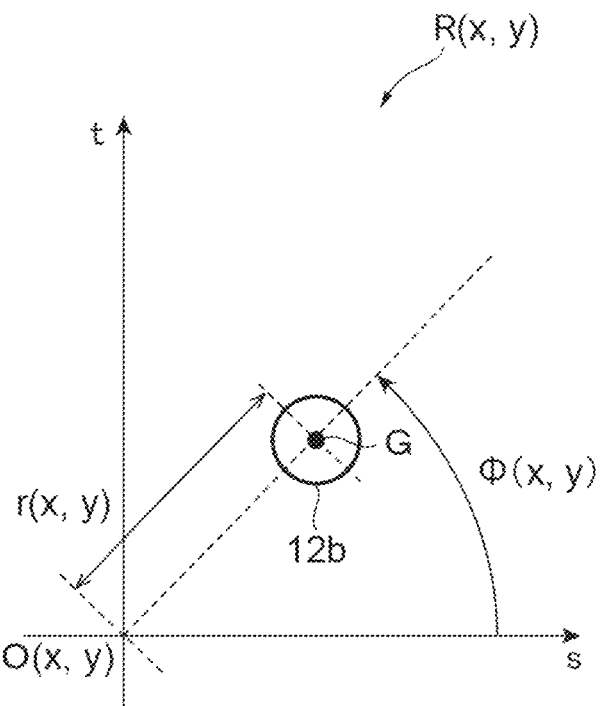
FIG. 8 is an enlarged view of a part of the phase modulation layer.

As illustrated in FIG. 8, a position in the unit constituent region R(x, y) is defined by an s-axis parallel to the X-axis and a t-axis parallel to the Y-axis, and an intersection (origin) of the s-axis and the t-axis is the lattice point O(x, y). In the unit constituent region R(x, y), an angle formed by a direction from the lattice point O(x, y) toward the center of gravity G and the s-axis is $\varphi(x, y)$. The x component indicates the position of the x-th lattice point O along the X-axis, and the y component indicates the position of the y-th lattice point O along the Y-axis. When the rotation angle $\varphi(x, y)$ is 0°, the direction of a vector connecting the lattice point O (x, y) and the center of gravity G matches the positive direction of the s-axis. In addition, the length of the vector connecting the lattice point O(x, y) and the center of gravity G is r(x, y). In one example, r(x, y) is constant regardless of x and y (over the entire phase modulation layer 12B).

As illustrated in FIG. 7, in the phase modulation layer 12B, the rotation angle $\varphi$ of the center of gravity G of the modified refractive index region 12b around the lattice point O is independently and individually set for each unit constituent region R according to a desired optical image. The rotation angle $\varphi(x, y)$ in the unit constituent region R(x, y) has a specific value for each position (unit constituent region R) determined by the values of the x component and the y component, but is not necessarily expressed by a specific function. That is, the rotation angle distribution $\varphi(x, y)$ is determined from a phase distribution extracted from a complex amplitude distribution obtained by performing the inverse Fourier transform on the desired optical image. Note that, when the complex amplitude distribution is obtained from the desired optical image, reproducibility of a beam pattern is improved by applying an iterative algorithm such as the Gerchberg-Saxton (GS) algorithm generally used at the time of calculation for hologram generation.

In the second embodiment, light outputted from the UC layer 11 is diffracted by the phase modulation layer 12B while being confined between the first light reflecting layer 13 and the second light reflecting layer 14, and forms a predetermined mode according to the lattice structure inside the phase modulation layer 12B. The laser light scattered in and outputted from the phase modulation layer 12B passes through the second light reflecting layer 14 and is outputted to the outside. In this case, the 0th-order light is outputted in the thickness direction (Z-axis direction) of the phase modulation layer 12B. On the other hand, the +1st-order light and the −1st-order light are outputted in any spatial direction including the Z-axis direction and a direction inclined with respect to the Z-axis direction.

Figure 9:
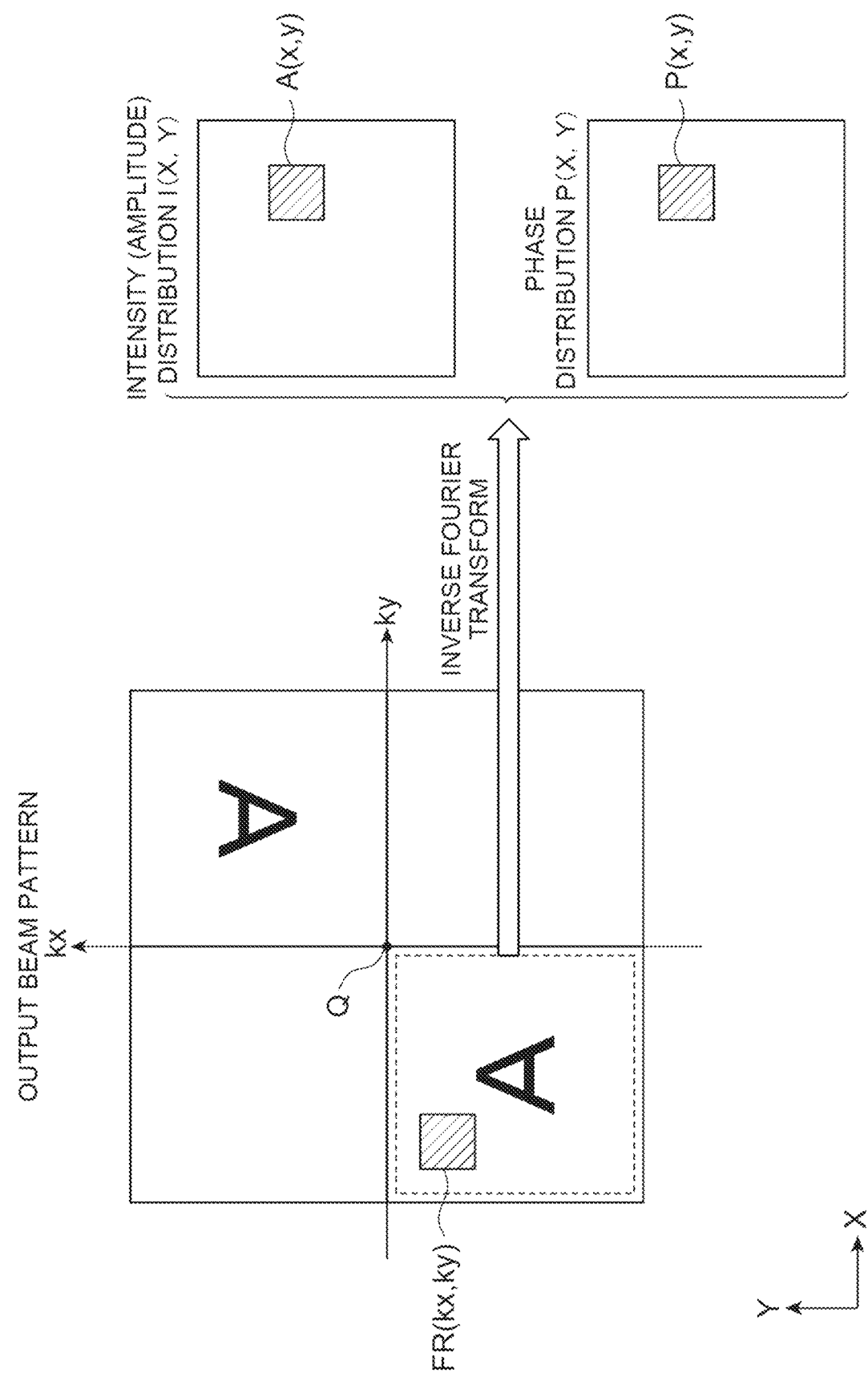
FIG. 9 is a diagram for explaining a relationship between an optical image obtained by forming an output beam pattern of an optical device and a rotation angle distribution in the phase modulation layer.

FIG. 9 is a diagram for explaining a relationship between an optical image obtained by forming the output beam pattern of the optical device 10B according to the second embodiment and the rotation angle distribution $\varphi(x, y)$ in the phase modulation layer 12B. Note that the center Q of the output beam pattern is located in the Z-axis direction from the center of the optical output surface of the optical device 10B, and FIG. 9 illustrates four quadrants with the center Q as the origin. Although FIG. 9 illustrates a case where optical images are obtained in the first quadrant and the third quadrant as an example, it is also possible to obtain images in the second quadrant and the fourth quadrant or all the quadrants. In the second embodiment, as illustrated in FIG. 9, a point-symmetric optical image with respect to the origin is obtained. FIG. 9 illustrates, as an example, a case where a character "A" is obtained as +1st-order diffracted light in the third quadrant and a pattern obtained by rotating the character "A" by 180 degrees is obtained as −1st-order diffracted light in the first quadrant. Note that, in the case of a rotationally symmetric optical image (for example, a cross, a circle, a double circle, or the like), the images are super-imposed and observed as one optical image.

An optical image obtained by forming the output beam pattern of the optical device 10B according to the second embodiment includes at least one of a spot, a straight line, a cross, a line drawing, a lattice pattern, a photograph, a stripe pattern, computer graphics (CG), and a character. Here, in order to obtain a desired optical image, the rotation angle distribution $\varphi(x, y)$ of the modified refractive index region 12b of the phase modulation layer 12B is determined by the following procedure.

First, as a first precondition, in an XYZ orthogonal coordinate system defined by a Z-axis matching a normal direction and an X-Y plane including X and Y axes orthogonal to each other and matching one surface of the phase modulation layer 12B including the plurality of modified refractive index regions 12b, a virtual square lattice constituted by M1 (an integer of 1 or more)×N1 (an integer of 1 or more) unit configuration regions R each having a square shape is set on the XY plane.

Figure 10:
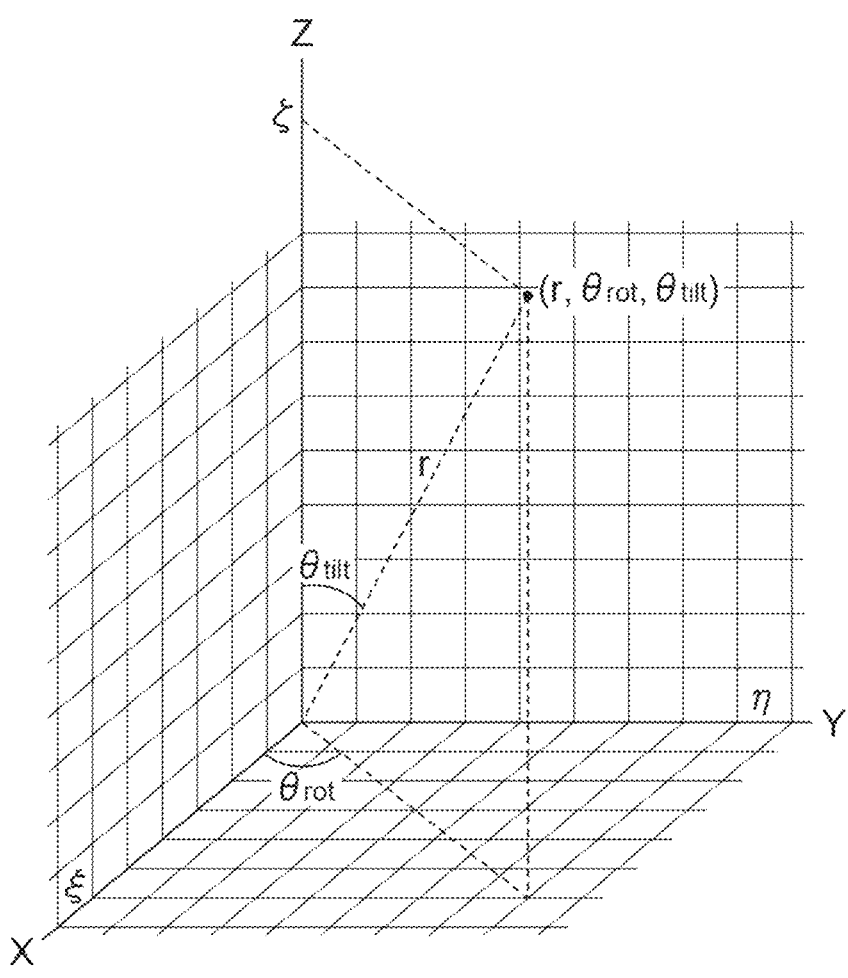
FIG. 10 is a diagram for explaining coordinate transformation from spherical coordinates to coordinates in an XYZ orthogonal coordinate system.
Figure 13A:
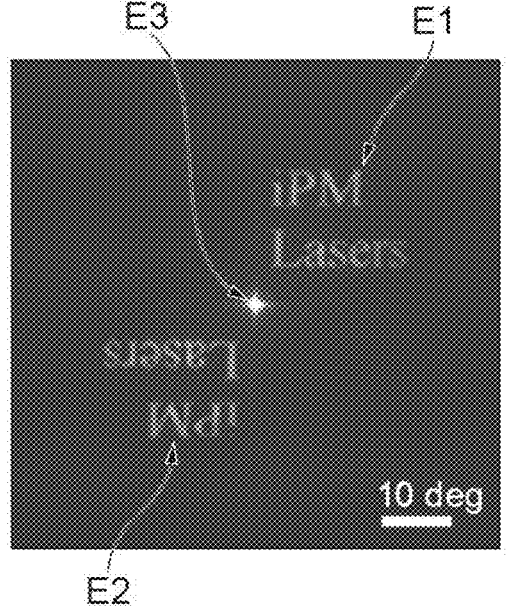
FIGS. 13A to 13D are diagrams illustrating examples of a beam pattern (optical image) outputted from a GaAs-based S-iPM laser in a near-infrared wavelength band.
Figure 13B:
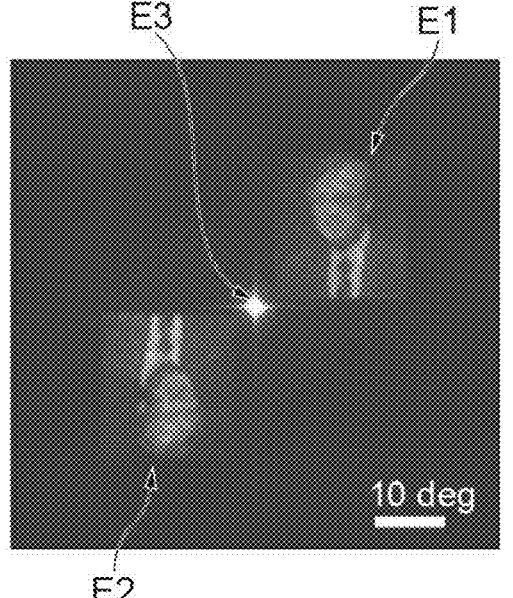
Figure 13C:
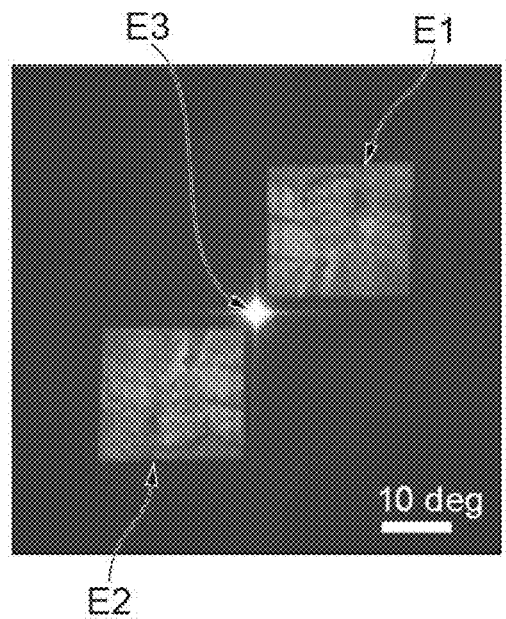
Figure 13D:
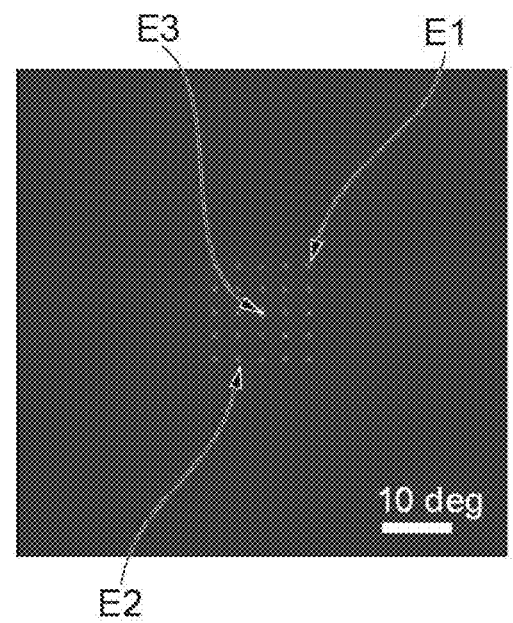

As a second precondition, it is assumed that coordinates $(\xi, \eta, \zeta)$ in the XYZ orthogonal coordinate system satisfy relationships represented by the following Formulas (1) to (3) with respect to spherical coordinates $(r, \theta_{rot}, \theta_{tilt})$ defined by a radius length r, an inclination angle $\theta_{tilt}$ from the Z-axis, and a rotation angle $\theta_{rot}$ from the X-axis specified on the XY plane as illustrated in FIG. 10. Note that FIG. 10 is a diagram for explaining coordinate transformation from spherical coordinates $(r, \theta_{rot}, \theta_{tilt})$ to coordinates $(\xi, \eta, \zeta)$ in the XYZ orthogonal coordinate system, and a designed optical image on a predetermined plane set in the XYZ orthogonal coordinate system, which is a real space, is expressed by the coordinates $(\xi, \eta, \zeta)$.

$$\xi = r \sin \theta_{tilt} \cos \theta_{rot} \qquad (1)$$

$$\eta = r \sin \theta_{tilt} \sin \theta_{rot} \qquad (2)$$

$$\zeta = r \cos \theta_{tilt} \qquad (3)$$

US 12,573,812 B2

27

When a beam pattern corresponding to an optical image outputted from the optical device 10B is a set of bright spots directed in a direction defined by the angles $\theta_{tilt}$ and $\theta_{rot}$, the angles $\theta_{tilt}$ and $\theta_{rot}$ are converted into a coordinate value $k_x$ on the Kx-axis which is a normalized wave number defined by the following Formula (4) and corresponds to the X-axis and a coordinate value $k_y$ on the Ky-axis which is a normalized wave number defined by the following Formula (5), corresponds to the Y-axis, and is orthogonal to the Kx-axis. Each of the normalized wave numbers means a wave number normalized using a wave number corresponding to the lattice spacing of the virtual square lattice as 1.0. In this case, in a wave number space defined by the Kx-axis and the Ky-axis, a specific wave number range including the beam pattern corresponding to the optical image is constituted by M2 (an integer of 1 or more)×N2 (an integer of 1 or more) image regions FR each having a square shape. Note that the integer M2 does not need to match the integer M1. Similarly, the integer N2 does not need to match the integer N1. In addition, Formula (4) and Formula (5) are disclosed in, for example, Non-Patent Document 2 described above.

$$k_x = \frac{a}{\lambda}\sin\theta_{tilt}\cos\theta_{rot} \tag{4}$$

$$k_y = \frac{a}{\lambda}\sin\theta_{tilt}\sin\theta_{rot} \tag{5}$$

a: a lattice constant of the virtual square lattice
$\lambda$: an oscillation wavelength of the optical device 10B

As a third precondition, in the wave number space, a complex amplitude F(x, y) obtained by performing two-dimensional inverse discrete Fourier transform to transform each image region $FR(k_x, k_y)$ specified by the coordinate component $k_x$ (an integer of 0 to M2−1) in the Kx-axis direction and the coordinate component $k_y$ (an integer of 0 to N2−1) in the Ky-axis direction to a unit constituent region R(x, y) on the XY plane specified by the coordinate component x (an integer of 0 to M1−1) in the X-axis direction and the coordinate component y (an integer of 0 to N1−1) in the Y-axis direction is given by the following Formula (6) with j as an imaginary unit. Furthermore, the complex amplitude F(x, y) is defined by the following Formula (7) when the amplitude term is A(x, y) and the phase term is P(x, y). Furthermore, as a fourth precondition, the unit constituent region R(x, y) is defined by an s-axis and a t-axis that are parallel to the X-axis and the Y-axis, respectively, and are orthogonal to each other at a lattice point O(x, y) that is the center of the unit constituent region R(x, y).

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \tag{6}$$

$$F(x, y) = A(x, y)\times\exp[jP(x, y)] \tag{7}$$

Under the first to fourth preconditions, the phase modulation layer 12B is configured to satisfy the following first and second conditions. That is, the first condition is that the center of gravity G is arranged in a state of being separated from the lattice point O(x, y) in the unit constituent region R(x, y). In addition, the second condition is that, in a state in which the length r(x, y) of a line segment from the lattice point O(x, y) to the corresponding center of gravity G is set to a common value in each of the M1×N1 unit configuration regions R, the corresponding modified refractive index region 12b is arranged in the unit constituent region R(x, y) such that an angle $\varphi(x, y)$ formed by the line segment connecting the lattice point O(x, y) and the corresponding center of gravity G and the s-axis satisfies $\varphi(x,y)=C\times P(x,y)+B,$ where C is a proportional constant, for example, 180/π and
B is an arbitrary constant, for example, 0.

FIG. 11 is a plan view illustrating an example in which the refractive index structure illustrated in FIG. 7 is applied only to a specific region of the phase modulation layer. In the example illustrated in FIG. 11, a refractive index structure (for example, the structure illustrated in FIG. 7) for outputting a target beam pattern is formed inside a square inner region RIN. On the other hand, in an outer region ROUT surrounding the inner region RIN, a perfect circular modified refractive index region whose position of the center of gravity matches the position of the lattice point of the square lattice is arranged. The lattice spacing of the square lattice that is virtually set is the same both inside the inner region RIN and inside the outer region ROUT. In the case of this structure, since light is distributed also in the outer region ROUT, there is an advantage that it is possible to suppress the generation of high frequency noise (so-called window function noise) caused by a rapid change in the intensity of light in the peripheral portion of the inner region RIN. In addition, since it is possible to suppress the leakage of light in the in-plane direction, it is possible to improve the efficiency of conversion from the excitation light to the light Lout.

As a method of obtaining an intensity distribution and a phase distribution from the complex amplitude distribution obtained by the two-dimensional inverse Fourier transform, for example, the intensity (amplitude) distribution I(x, y) can be calculated by using the abs function of numerical analysis software "MATLAB" of MathWorks, Inc., and the phase distribution P(x, y) can be calculated by using the angle function of MATLAB.

Here, points to be noted in a case where the rotation angle distribution $\varphi(x, y)$ is obtained from the result of performing the inverse Fourier transform on the optical image and the arrangement of each of the modified refractive index regions 12b is calculated using general discrete Fourier transform (or fast Fourier transform) will be described. The output beam pattern illustrated in FIG. 12A that is a desired optical image is calculated from the complex amplitude distribution obtained by the inverse Fourier transform and is as illustrated in FIG. 12B. When the space is divided into four quadrants A1, A2, A3, and A4 as illustrated in FIGS. 12A and 12B, a pattern in which a pattern obtained by rotating the first quadrant illustrated in FIG. 12A by 180 degrees and a pattern of the third quadrant of in FIG. 12A are superimposed appears in the first quadrant of the output beam pattern illustrated in FIG. 12B. In the second quadrant of the beam pattern, a pattern in which a pattern obtained by rotating the second quadrant illustrated in FIG. 12A by 180 degrees and a pattern of the fourth quadrant illustrated in FIG. 12A are superimposed appears. In the third quadrant of the beam pattern, a pattern in which a pattern obtained by rotating the third quadrant illustrated in FIG. 12A by 180 degrees and a pattern of the first quadrant illustrated in FIG. 12A are superimposed appears. In the fourth quadrant of the beam pattern, a pattern in which a pattern obtained by rotating the fourth quadrant illustrated in FIG. 12A by 180 degrees and a pattern of the second quadrant illustrated in FIG. 12A are superimposed appears. In this case, the patterns rotated by 180 degrees are patterns formed as −1st-order light components.

Therefore, when an optical image having a value only in the first quadrant is used as the optical image (original optical image) before the inverse Fourier transform, the first quadrant of the original optical image appears in the third quadrant of the obtained beam pattern, and a pattern obtained by rotating the first quadrant of the original optical image by 180 degrees appears in the first quadrant of the obtained beam pattern.

FIGS. 13A to 13D illustrate examples of a beam pattern (optical image) outputted from a GaAs-based S-iPM laser in a near-infrared wavelength band using the same principle as that of the second embodiment. The center of each of FIGS. 13A to 13D is located in the Z-axis direction from the center of the light output surface of the S-iPM laser. As illustrated in FIGS. 13A to 13D, the S-iPM laser outputs +1st-order light including a first optical image portion E1 outputted in a first direction inclined with respect to an axis extending in the Z-axis direction from the center of the light output surface, −1st-order light including a second optical image portion E2 outputted in a second direction symmetric with the first direction with respect to the axis, and rotationally symmetric with the first optical image portion E1 with respect to the axis, and 0th-order light E3 traveling on the axis. The same applies to the optical device 10B of the second embodiment.

In the second embodiment, light in the second wavelength range outputted from the UC layer 11 is diffracted by the phase modulation layer 12B while being confined between the first light reflecting layer 13 and the second light reflecting layer 14, and as a result, a predetermined mode corresponding to the lattice structure inside the phase modulation layer 12B is formed. In the phase modulation layer 12B, the center of gravity of each of the plurality of modified refractive index regions 12b has a rotation angle $\varphi(x, y)$ set for each modified refractive index region 12b around the lattice point of the virtual square lattice. In such a case, as compared with a case where the centers of gravity G of the plurality of modified refractive index regions 12b are located on the lattice points of the square lattice (see FIG. 2), the light intensity of the light outputted in the thickness direction (in other words, the Z-axis direction perpendicular to the light output surface of the optical device 10B) of the phase modulation layer 12B, that is, the light intensity of the 0th-order light decreases, and light intensities of high-order light outputted in a direction inclined with respect to the direction, for example, light intensities of the +1st-order light and the −1st-order light increase. Furthermore, since the rotation angle $\varphi(x, y)$ of the center of gravity G of each modified refractive index region 12b around the lattice point is individually set according to a desired optical image, the phase of the light is independently modulated for each of the modified refractive index regions 12b, and as a result, an optical image of an arbitrary spatial shape can be outputted in the Z-axis direction perpendicular to the light output surface and in a direction inclined with respect to the Z-axis direction. This optical image (output light Lout) passes through the second light reflecting layer 14 and the dichroic mirror 16 and is outputted to the outside of the optical device 10B.

Also in the optical device 10B of the second embodiment, similarly to the above-described first embodiment, it is possible to output the light Lout having a relatively short wavelength such as green light or blue light on the basis of excitation light having a relatively long wavelength such as near-infrared light or red light. In addition, since it is not necessary to use a nitride semiconductor such as GaN for the phase modulation layer 12B and the degree of freedom in selecting a material for the phase modulation layer 12B is high, it is also easy to increase the light confinement coefficient of the phase modulation layer 12B. Therefore, according to the second embodiment, it is possible to provide the optical device 10B as a practical phase modulation light-emitting element capable of outputting a two-dimensional optical image in a relatively short-wavelength range such as the visible range, for example. Note that the optical device 10B of the second embodiment can be manufactured through steps similar to those of the optical device 10A of the first embodiment.

Third Embodiment

Figure 14:
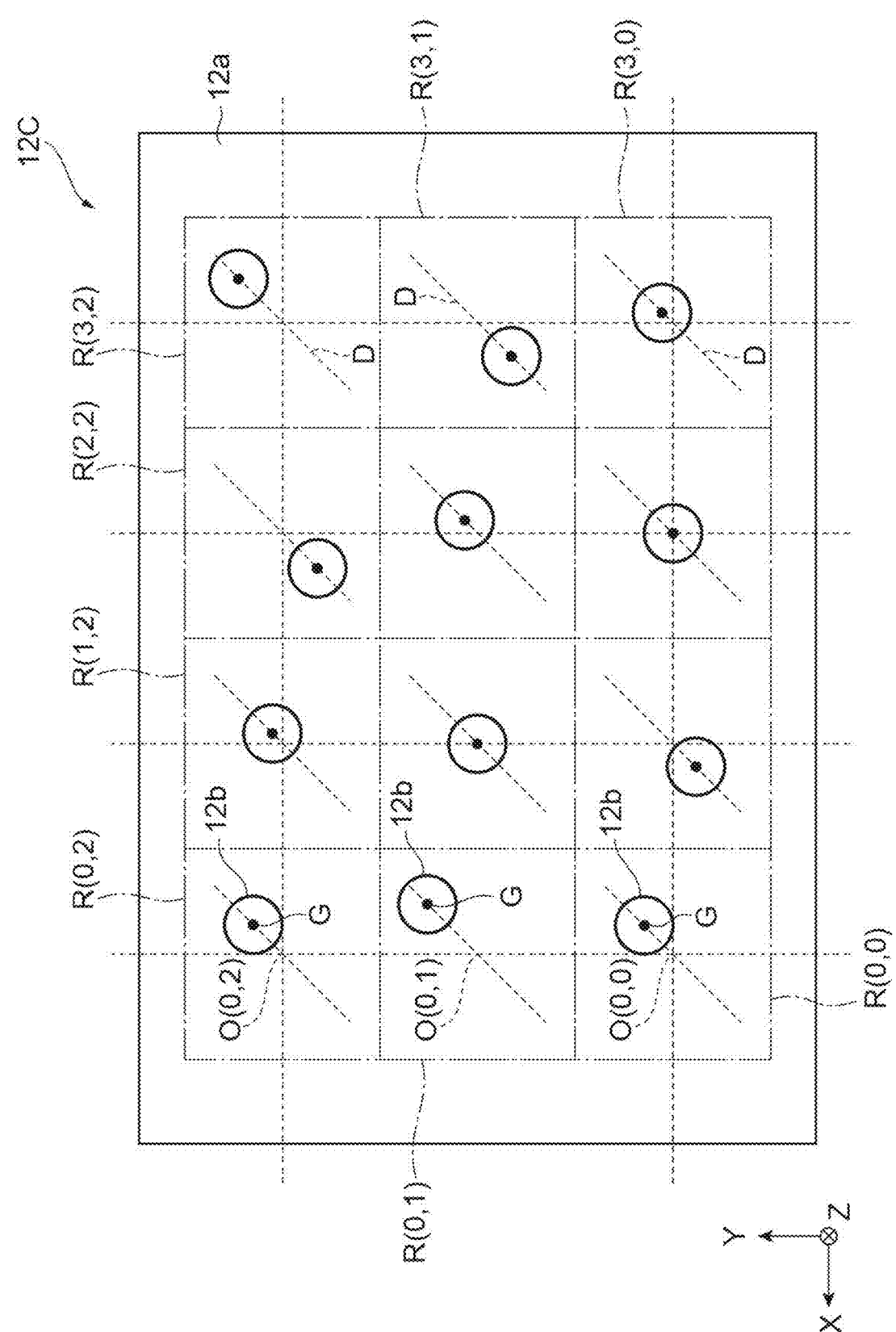
FIG. 14 is a plan view of a phase modulation layer as a resonance mode forming layer included in an optical device according to a third embodiment.

The S-iPM laser is not limited to the configuration of the second embodiment described above. For example, even with the configuration of a phase modulation layer of a third embodiment, the S-iPM laser can be suitably fabricated. FIG. 14 is a plan view of a phase modulation layer 12C as a resonance mode forming layer included in an optical device according to the third embodiment. In addition, FIG. 15 is a diagram illustrating a positional relationship of modified refractive index regions 12b in the phase modulation layer 12C.

Figure 15:
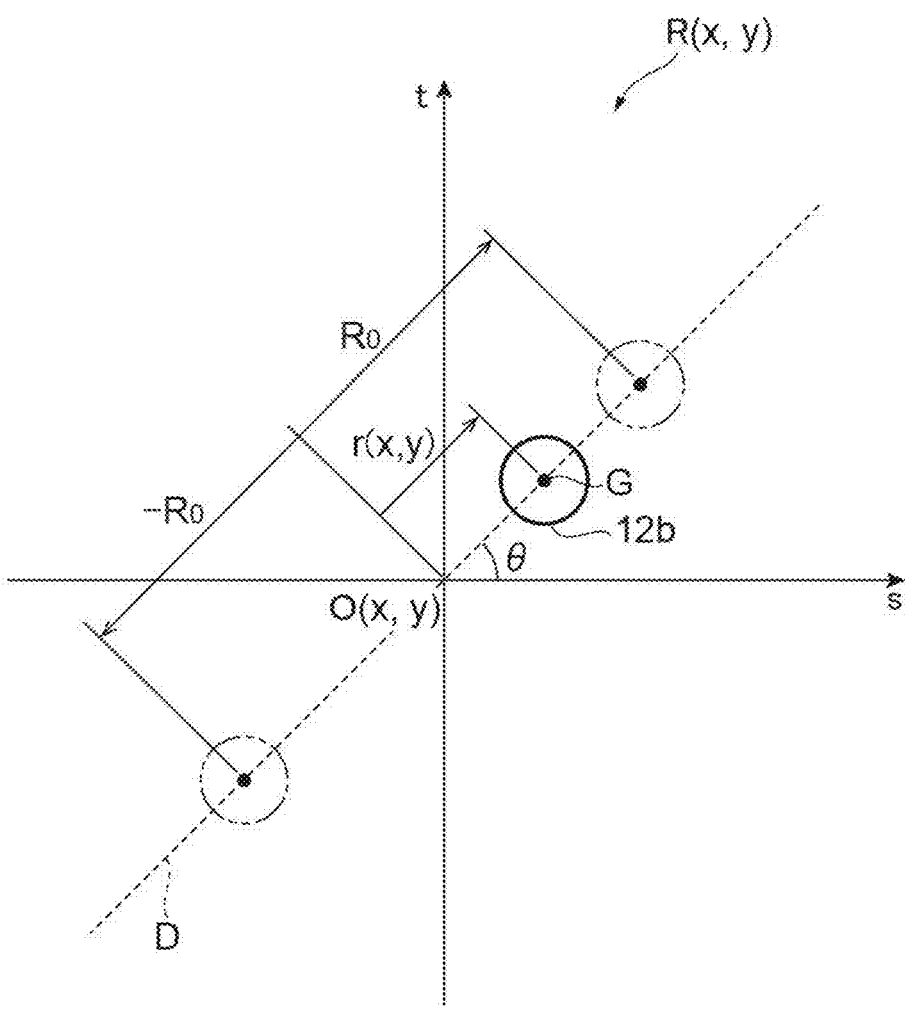
FIG. 15 is a diagram illustrating a positional relationship of modified refractive index regions in the phase modulation layer.

As illustrated in FIGS. 14 and 15, in each unit constituent region R(x, y) of the phase modulation layer 12C, the center of gravity G of each modified refractive index region 12b is arranged on a straight line D. The straight line D is a straight line that passes through a corresponding lattice point O(x, y) of the unit constituent region R(x, y) and is inclined with respect to each side of a square lattice. In other words, the straight line D is a straight line inclined with respect to both the X-axis and the Y-axis. An inclination angle of the straight line D with respect to one side (X-axis) of the square lattice is $\theta$. The inclination angle $\theta$ is constant in the phase modulation layer 12C. The inclination angle $\theta$ satisfies $0° < \theta < 90°$, and in one example, $\theta = 45°$. Alternatively, the inclination angle $\theta$ satisfies $180° < \theta < 270°$, and in one example, $\theta = 225°$. When the inclination angle $\theta$ satisfies $0° < \theta < 90°$ or $180° < \theta < 270°$, the straight line D extends from the first quadrant to the third quadrant of the coordinate plane defined by the X-axis and the Y-axis. Alternatively, the inclination angle $\theta$ satisfies $90° < \theta < 180°$, and in one example, $\theta = 135°$. Alternatively, the inclination angle $\theta$ satisfies $270° < \theta < 360°$, and in one example, $\theta = 315°$. When the inclination angle $\theta$ satisfies $90° < \theta < 180°$ or $270° < \theta < 360°$, the straight line D extends from the second quadrant to the fourth quadrant of the coordinate plane defined by the X-axis and the Y-axis. As described above, the inclination angle $\theta$ is an angle excluding $0°$, $90°$, $180°$, and $270°$. Setting such an inclination angle $\theta$ can contribute to both an optical wave traveling in the X-axis direction and an optical wave traveling in the Y-axis direction in an optical output beam. Here, it is assumed that a distance between the lattice point O(x, y) of the unit constituent region R(x, y) and the center of gravity G is r(x, y). The x component indicates the position of the x-th lattice point O on the X-axis, and the y component indicates the position of the y-th lattice point O on the Y-axis. When the distance r(x, y) is a positive value, the center of gravity G is located in the first quadrant (or the second quadrant). When the distance r(x, y) is a negative value, the center of gravity G is located in the third quadrant (or the fourth quadrant). When the distance r(x, y) is 0, the lattice point O matches the center of gravity G.

The distance r(x, y) between the center of gravity G of each modified refractive index region 12b and the corresponding lattice point O(x, y) in the unit constituent region R(x, y) illustrated in FIG. 14 is individually set for each modified refractive index region 12b according to a desired optical image. A distribution of the distances r(x, y) has a specific value for each of positions (unit constituent regions) determined by the values of the x components and the y components, but is not necessarily represented by a specific function. The distribution of the distances r(x, y) is determined from a phase distribution extracted from a complex amplitude distribution obtained by performing inverse Fourier transform on the desired optical image. That is, the distance r(x, y) is set to 0 in a case where the phase P(x, y) at certain coordinates (x, y) illustrated in FIG. 15 is $P_0$, the distance r(x, y) is set to the maximum value $R_0$ in a case where the phase P(x, y) is $\pi+P_0$, and the distance r(x, y) is set to the minimum value $-R_0$ in a case where the phase P(x, y) is $-\pi+P_0$. Then, for an intermediate phase P(x, y), the distance r(x, y) is set such that $r(x, y)=\{P(x, y)-P_0\}\times R_0/\pi$. Here, the initial phase $P_0$ can be arbitrarily set. When the lattice spacing of the square lattice is a, the maximum value $R_0$ of r(x, y) is, for example, in the following range.

$$0 \le R_0 \le \frac{a}{\sqrt{2}} \qquad (8)$$

Note that, when the complex amplitude distribution is obtained from the desired optical image, reproducibility of a beam pattern is improved by applying an iterative algorithm such as the GS algorithm generally used at the time of calculation for hologram generation.

In the third embodiment, the desired optical image can be obtained by determining the distribution of the distances r(x, y) of the modified refractive index regions 12b of the phase modulation layer 12C according to the following procedure. That is, under the first to fourth preconditions described in the above-described second embodiment, the phase modulation layer 12C is configured to satisfy the following conditions. That is, the modified refractive index regions 12b are arranged in the unit constituent regions R(x, y) such that the distances r(x, y) from the lattice points O(x, y) to the centers of gravity G of the corresponding modified refractive index regions 12b satisfy $r(x, y)=C\times(P(x, y)-P_0)$, where C is a proportional constant, for example, $R_0/\pi$, and $P_0$ is any constant, for example, 0.

That is, the distance r(x, y) is set to 0 in a case where the phase P(x, y) at certain coordinates (x, y) is $P_0$, the distance r(x, y) is set to the maximum value $R_0$ in a case where the phase P(x, y) is $\pi+P_0$, and the distance r(x, y) is set to the minimum value $-R_0$ in a case where the phase P(x, y) is $-\pi+P_0$. In a case where it is desired to obtain the desired optical image, the optical image may be subjected to inverse discrete Fourier transform, and a distribution of the distances r(x, y) according to the phases P(x, y) of the complex amplitudes may be given to the plurality of modified refractive index regions 12b. The phase P(x, y) and the distance r(x, y) may be proportional to each other.

Note that, also in the third embodiment, the refractive index structure illustrated in FIG. 14 may be applied only to the specific region of the phase modulation layer 12C. For example, as in the example illustrated in FIG. 11, a refractive index structure (for example, the structure illustrated in FIG. 14) for outputting a target beam pattern may be formed inside the square inner region RIN. In this case, in an outer region ROUT surrounding the inner region RIN, a perfect circular modified refractive index region whose position of the center of gravity matches the position of the lattice point of the square lattice is arranged. The lattice spacing of the square lattice that is virtually set is the same both inside the inner region RIN and inside the outer region ROUT. In the case of this structure, since light is distributed also in the outer region ROUT, there is an advantage that it is possible to suppress the generation of high frequency noise (so-called window function noise) caused by a rapid change in the intensity of light in the peripheral portion of the inner region RIN. In addition, since it is possible to suppress the leakage of light in the in-plane direction, it is possible to improve the efficiency of conversion from the excitation light to the light Lout.

As a method of obtaining an intensity distribution and a phase distribution from the complex amplitude distribution obtained by the inverse Fourier transform, for example, the intensity distribution I(x, y) can be calculated by using the abs function of numerical analysis software "MATLAB" of MathWorks, Inc., and the phase distribution P(x, y) can be calculated by using the angle function of MATLAB. Note that points to be noted in a case where the phase distribution P(x, y) is obtained from the result of performing the inverse Fourier transform on the optical image, and the distance r(x, y) of each modified refractive index region 12b is calculated using general discrete Fourier transform (or fast Fourier transform) are similar to those in the second embodiment described above.

In the third embodiment, light in the second wavelength range outputted from the UC layer 11 is diffracted by the phase modulation layer 12C while being confined between the first light reflecting layer 13 and the second light reflecting layer 14, and as a result, a predetermined mode corresponding to the lattice structure inside the phase modulation layer 12C is formed. In the phase modulation layer 12C, the center of gravity G of each of the plurality of modified refractive index regions 12b is arranged on a straight line D that passes through the lattice point O of the virtual square lattice and is inclined with respect to the square lattice. The distance r(x, y) between the center of gravity G of each modified refractive index region 12b and the corresponding lattice point O(x, y) is individually set for each unit constituent region R(x, y) according to an optical image. In such a case, as compared with a case where the centers of gravity G of the plurality of modified refractive index regions 12b are located on the lattice points O of the square lattice (see FIG. 2), the light intensity of the light outputted in the thickness direction (in other words, the Z-axis direction perpendicular to the light output surface of the optical device) of the phase modulation layer 12C, that is, the light intensity of the 0th-order light decreases, and light intensities of high-order light outputted in a direction inclined with respect to the direction, for example, light intensities of the +1st-order light and the −1st-order light increase. Furthermore, since the distance r(x, y) between the center of gravity G of each of the modified refractive index regions 12b and the corresponding lattice point O is individually set according to a desired optical image, it is possible to modulate the phase of light independently for each of the modified refractive index regions 12b and output an optical image having an arbitrary spatial shape in a direction inclined with respect to the Z-axis direction and the Z-axis direction perpendicular to the light output surface. This optical image (output light Lout) passes through the second light reflecting layer 14 and the dichroic mirror 16 and is outputted to the outside of the optical device.

Also in the optical device of the third embodiment, similarly to the above-described first and second embodiments, it is possible to output light Lout having a relatively short wavelength such as green light or blue light on the basis of excitation light having a relatively long wavelength such as near-infrared light or red light. In addition, since it is not necessary to use a nitride semiconductor such as GaN for the phase modulation layer 12C and the degree of freedom in selecting a material for the phase modulation layer 12C is high, it is also easy to increase the light confinement coefficient of the phase modulation layer 12C. Therefore, according to the third embodiment, it is possible to provide the optical device as a practical phase modulation light-emitting element capable of outputting a two-dimensional optical image in a relatively short-wavelength range such as the visible range, for example. Note that the optical device of the third embodiment can be manufactured through steps similar to those of the optical device 10A of the first embodiment.

(First Modification)

Figure 16:
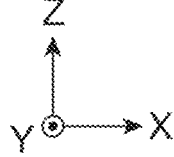
FIG. 16 is a diagram illustrating a cross-sectional structure of a light-emitting device according to a first modification.

FIG. 16 is a diagram illustrating a cross-sectional structure of a light-emitting device 1C according to a first modification. The light-emitting device 1C of the first modification includes an optical device 10C instead of the optical device 10A of the first embodiment. Note that the configuration of an excitation light source 20A is similar to that of the first embodiment. The optical device 10C of the first modification includes a diffractive optical element (DOE) 17 in addition to the configuration of the optical device 10A of the first embodiment. The diffractive optical element 17 is arranged at a position sandwiching the second light reflecting layer 14 together with the UC layer 11. In the example of FIG. 16, the diffractive optical element 17 is formed on a surface of a pair of surfaces of the substrate 15 opposite to the surface on which the second light reflecting layer 14 is formed. For this reason, the dichroic mirror 16 illustrated in FIG. 1 cannot be formed on the surface of the substrate 15. However, a dichroic mirror 16 formed on another substrate may be optically coupled to the diffractive optical element 17.

The diffractive optical element 17 is an optical device that spatially controls a phase distribution of transmitted light by irregularities (in this case, the depths (heights) of the irregularities are set independently for each of unit constituent regions R arranged two-dimensionally) formed on a surface of a light transmissive substrate (for example, the substrate 15). In the first modification, for example, the diffractive optical element 17 can be provided by forming the irregularities on the surface of the substrate 15.

According to the first modification, since a phase distribution based on an optical image of an arbitrary shape is formed in advance in the diffractive optical element 17, laser light in the second wavelength range outputted through the second light reflecting layer 14 can be converted into an optical image of an arbitrary shape. Therefore, according to the first modification, an optical image having an arbitrary shape in the second wavelength range can be outputted. The optical device 10C of the first modification can be suitably manufactured by performing a step of forming the diffractive optical element 17 instead of the step of forming the dielectric multilayer film as the dichroic mirror 16 on the other surface of the substrate 15 in the step of manufacturing the optical device 10A of the first embodiment. The diffractive optical element 17 is formed by, for example, applying an electron beam resist to the surface of the substrate 15, patterning the electron beam resist by electron beam lithography, and then performing dry etching on the surface of the substrate 15. Note that a substrate that is different from the substrate 15 and on which the diffractive optical element 17 is formed may be attached to the substrate 15.

(Second Modification)

Figure 17:
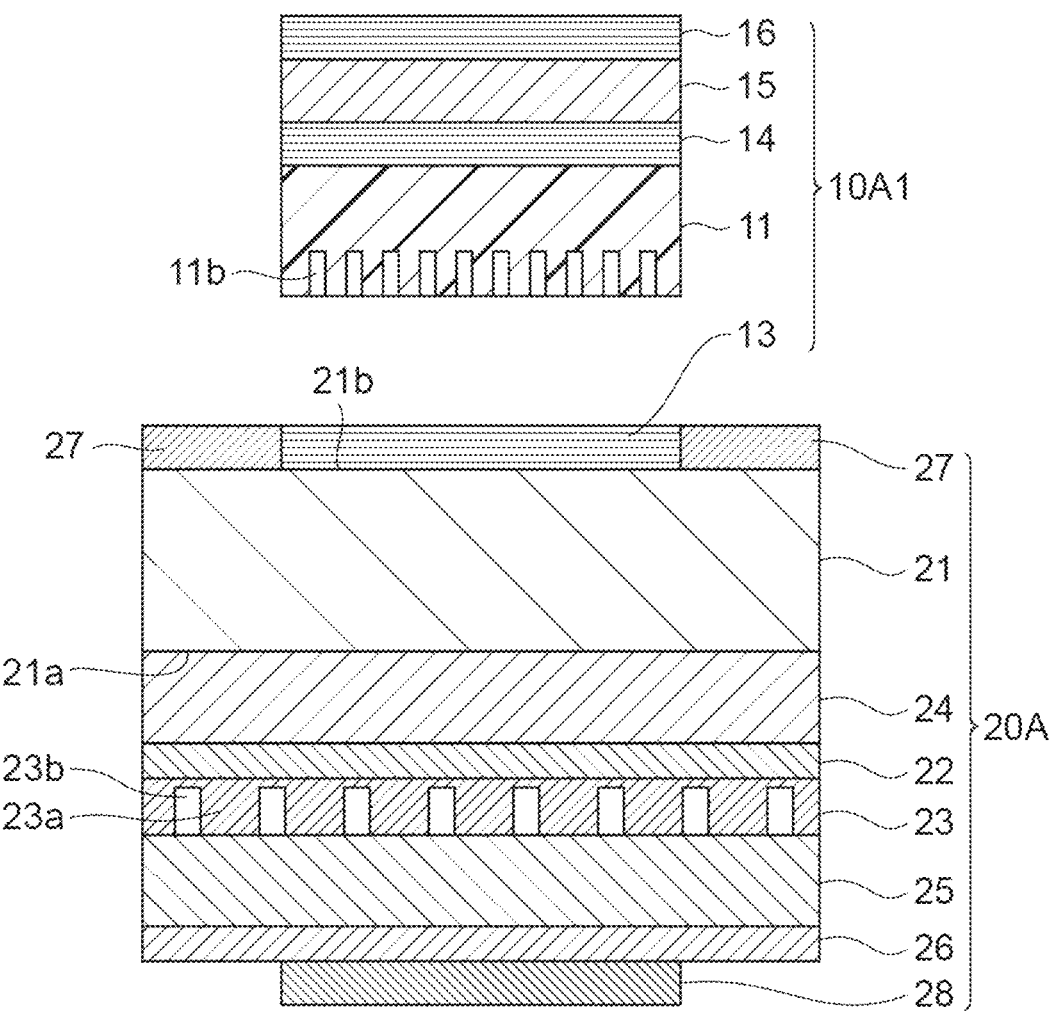
FIG. 17 is a cross-sectional view illustrating a step of manufacturing a light-emitting device according to a second modification.

FIG. 17 is a cross-sectional view illustrating a step of manufacturing a light-emitting device 1D according to a second modification. The light-emitting device 1D of the second modification includes an optical device 10A1 and an excitation light source 20A. The optical device 10A1 is different from the optical device 10A of the first embodiment in that the optical device 10A1 does not include the PC layer 12A, and instead, a part of a UC layer 11 in the thickness direction of the UC layer 11 functions as a PC layer by forming modified refractive index regions 11b in the UC layer 11. Other configurations of the optical device 10A1 are similar to those of the optical device 10A of the first embodiment. In the second modification, after the second light reflecting layer 14 and the dichroic mirror 16 are formed on both surfaces of the substrate 15, an upconversion material dispersed in resin is applied onto the second light reflecting layer 14. Subsequently, the PC layer is formed by forming the modified refractive index regions 11b in the resin layer by a nanoimprint method or the like. Then, the first light reflecting layer 13 is formed on the back surface 21b of the semiconductor substrate 21, and the first light reflecting layer 13 and the PC layer are bonded. The excitation light source is not limited to the excitation light source 20A which is a PCSEL, and various other surface emission type excitation light sources can be applied as the excitation light source. The distribution of the modified refractive index regions 11b is not limited to the distribution of the first embodiment, and may be the distribution of the second embodiment or the third embodiment (see FIG. 7 or 14). In the second modification, the first light reflecting layer 13 and the PC layer are bonded to each other, but may be separated from each other. In that case, excitation light is spatially propagated from the first light reflecting layer 13 and supplied to the UC layer 11.

(Third Modification)

Figure 18:
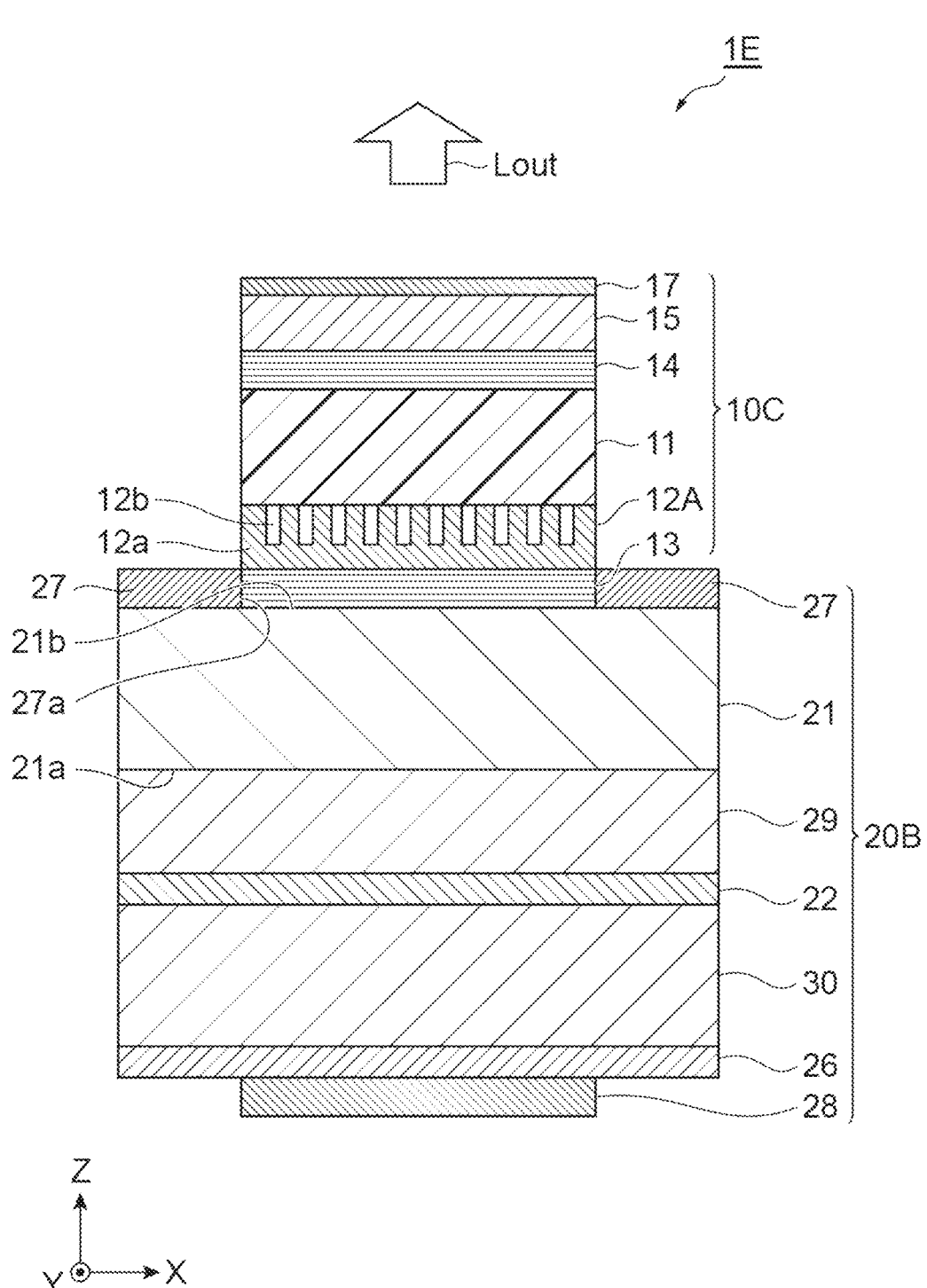
FIG. 18 is a diagram illustrating a cross-sectional structure of a light-emitting device according to a third modification.

FIG. 18 is a diagram illustrating a cross-sectional structure of a light-emitting device 1E according to a third modification. The light-emitting device 1E of the third modification includes an excitation light source 20B instead of the excitation light source 20A of the first modification. Note that the configuration of an optical device 10C is similar to that of the first modification. The excitation light source 20B of the third modification is a vertical cavity surface emitting laser (VCSEL), and includes a semiconductor substrate 21, a first DBR layer 29, an active layer 22, a second DBR layer 30, a contact layer 26, a first electrode 27, and a second electrode 28.

The first DBR layer 29 and the second DBR layer 30 have a configuration for a distributed Bragg reflector (DBR), and specifically, are formed by alternately stacking a first semiconductor layer and a second semiconductor layer having a refractive index different from that of the first semiconductor layer. The film thicknesses of the first and second semiconductor layers can be defined as $\lambda/4nd$ (nd: the refractive index of the corresponding semiconductor layer) with respect to the laser wavelength $\lambda$. In this case, phases of reflected light are aligned, and high reflectance can be obtained. The first DBR layer 29 is provided on the main surface 21a of the semiconductor substrate 21, and is in contact with the main surface 21a of the semiconductor substrate 21 in one example. The second DBR layer 30 is provided on the first DBR layer 29. The active layer 22 is provided between the first DBR layer 29 and the second DBR layer 30. The film thickness of the active layer 22 can be set to be an integral multiple of $\lambda/2na$ (na: the effective refractive index of the active layer). By arranging a quantum well having an optical gain at the position of the antinode of an electric field, a mode gain can be increased, and an oscillation threshold current can be lowered. The contact layer 26 is provided on the second DBR layer 30. The energy band gap of the first DBR layer 29 and the energy band gap of the second DBR layer 30 are wider than the energy band gap of the active layer 22. The thickness direction of the semiconductor substrate 21, the active layer 22, the first DBR layer 29, the second DBR layer 30, and the contact layer 26 matches the Z-axis direction.

The first electrode 27 is a metal electrode provided on the back surface 21b of the semiconductor substrate 21. The second electrode 28 is a metal electrode provided on the contact layer 26. The materials and shapes of the first electrode 27 and the second electrode 28 are similar to those of the excitation light source 20A of the first embodiment. Note that the contact layer 26 located outside the second electrode 28 in plan view can be removed. In this case, since current injection into an unnecessary region is suppressed, a current can be efficiently injected into the light-emitting unit (active layer 22).

In one example, the semiconductor substrate 21 is a GaAs substrate. The first DBR layer 29, the active layer 22, the second DBR layer 30, and the contact layer 26 are comprised of a GaAs-based semiconductor. The first DBR layer 29 is an AlGaAs layer. The active layer 22 has a multiple quantum well structure (barrier layer: AlGaAs/quantum well layer: InGaAs). The second DBR layer 30 is an AlGaAs layer. The contact layer 26 is a GaAs layer.

The first DBR layer 29 is of the same conductivity type as that of the semiconductor substrate 21, and the second DBR layer 30 and the contact layer 26 are of a conductivity type opposite to that of the semiconductor substrate 21. In one example, the semiconductor substrate 21 and the first DBR layer 29 are of n-type, and the second DBR layer 30 and the contact layer 26 are of p-type. The impurity concentration is, for example, $1\times10^{16}$ to $1\times10^{21}/cm^3$. In an intrinsic type (i-type) in which no impurity is intentionally added, the impurity concentration is $1\times10^{16}/cm^3$ or less. The active layer 22 is not limited to the intrinsic type (i-type), and may be doped.

The excitation light source 20B of the third modification operates as follows. When a drive current is supplied between the first electrode 27 and the second electrode 28, recombination of electrons and holes occurs in the active layer 22, and light in the first wavelength range (for example, near infrared range) is outputted from the active layer 22. This light resonates in the Z-axis direction between the first DBR layer 29 and the second DBR layer 30 to oscillate to form laser light as excitation light. A part of the laser light passes through the first DBR layer 29 and is outputted from the back surface 21b of the semiconductor substrate 21 to the optical device 10C through the opening 27a.

As in the third modification, the excitation light source may be a VCSEL. Also in this case, excitation light can be suitably supplied to the UC layer 11 of the optical device 10C. Note that the light-emitting device 1E may include the optical device 10A of the first embodiment, the optical device 10B of the second embodiment, or the optical device of the third embodiment, instead of the optical device 10C.

Further, as in the second modification, the optical device and the excitation light source may be separated and optically coupled.

(Fourth Modification)

Figure 19:
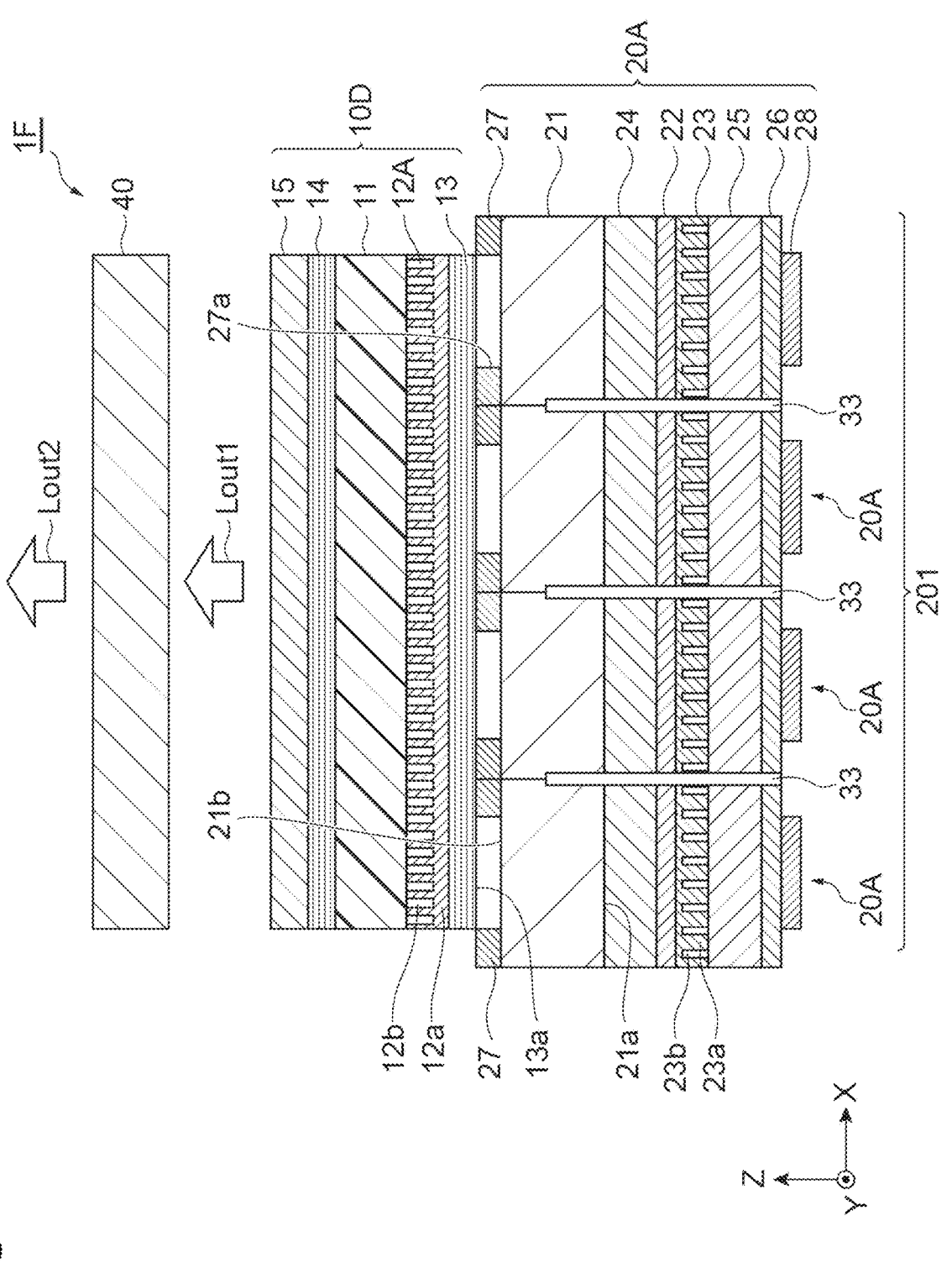
FIG. 19 is a diagram illustrating a cross-sectional structure of a light-emitting device according to a fourth modification.

FIG. 19 is a diagram illustrating a cross-sectional structure of a light-emitting device 1F according to a fourth modification. The light-emitting device 1F of the fourth modification includes an optical device 10D, an excitation light source 201, and a spatial light modulator 40. The optical device 10D has a configuration in which the dichroic mirror 16 is removed from the optical device 10A of the first embodiment, but may have the dichroic mirror 16. In addition, the size of the optical device 10D viewed from the Z-axis direction is much larger than the size of the optical device 10A of the first embodiment viewed from the Z-axis direction.

The excitation light source 201 is integrated with the optical device 10D and supplies excitation light to the UC layer 11. The excitation light source 201 includes a plurality of excitation light sources 20A. Similarly to the first embodiment, these excitation light sources 20A are PCSELs and are arranged at positions sandwiching the first light reflecting layer 13 together with the UC layer 11. In addition, these excitation light sources 20A are arranged side by side in a one-dimensional or two-dimensional manner along a surface 13a of the first light reflecting layer 13. The back surface 21b of the semiconductor substrate 21 of these excitation light sources 20A faces the front surface 13a of the first light reflecting layer 13 with a gap formed by the opening 27a of the first electrode 27 therebetween. A slit 33 for electrical separation is formed at a boundary between the excitation light sources 20A adjacent to each other. In the plurality of excitation light sources 20A, the semiconductor substrate 21 may be common. In this case, the excitation light source 201 is a laser element array in which a plurality of PCSELs are formed on the common semiconductor substrate 21.

The spatial light modulator 40 is optically coupled to the optical device 10D, and is disposed at a position sandwiching the second light reflecting layer 14 together with the UC layer 11. The spatial light modulator 40 has, for example, a light transmission type configuration. In the example of FIG. 19, the spatial light modulator 40 is disposed on the opposite side of the second light reflecting layer 14 with respect to the substrate 15. The spatial light modulator 40 may be integrated with the optical device 10D, or may be disposed away from the optical device 10D.

The spatial light modulator 40 has a plurality of pixels arranged two-dimensionally, and presents a hologram to the plurality of pixels to independently modulate the phase of laser light Lout1 outputted from the optical device 10D for each pixel. The spatial light modulator 40 has, for example, a liquid crystal type configuration. In a case where the spatial light modulator 40 is of a liquid crystal type, individual voltages constituting a hologram are applied to a plurality of two-dimensionally arranged pixel electrodes. As a result, the magnitude of an electric field applied to a liquid crystal layer is controlled for each pixel electrode. The optical path length in the liquid crystal layer of each pixel changes according to the magnitude of the electric field. Thus, the phase of light can be modulated independently for each pixel. Note that the type of the spatial light modulator 40 is not limited to the liquid crystal type, and various types of spatial light modulators may be applied. The spatial light modulator 40 outputs an optical image Lout2 after the phase modulation by the hologram.

According to the fourth modification, by presenting a phase pattern based on an optical image of an arbitrary shape in the spatial light modulator 40, the laser light Lout1 in the second wavelength range outputted after passing through the second light reflecting layer 14 can be converted into the optical image Lout2 of an arbitrary shape. Therefore, according to the fourth modification, the optical image Lout2 having an arbitrary shape in the second wavelength range can be outputted. In addition, it is also possible to dynamically change the optical image Lout2 by temporally changing the phase pattern to be presented to the spatial light modulator 40.

Further, as in the fourth modification, the excitation light source 201 may include a plurality of excitation light sources 20A, and the plurality of excitation light sources 20A may be arranged one-dimensionally or two-dimensionally along the surface 13$a$ of the first light reflecting layer 13. Then, the light transmittance of the first light reflecting layer 13 for light in the wavelength range (first wavelength range) of the excitation light may be greater than the light transmittance of the first light reflecting layer 13 for light in the emission wavelength range (second wavelength range) of the UC layer 11. In this case, since the excitation light outputted from the excitation light source 201 passes through the first light reflecting layer 13 and is supplied to the UC layer 11, the laser light Lout1 in the second wavelength range can be suitably outputted from the optical device 10D. In addition, according to the light-emitting device 1F of the fourth modification, since the excitation light is generated using the plurality of excitation light sources 20A arranged one-dimensionally or two-dimensionally, the area of the optical device 10D viewed from the light output direction can be further increased. Therefore, the area of the optical image Lout2 outputted from the light-emitting device 1F can be further increased.

In the manufacturing of the light-emitting device 1F according to the fourth modification, element separation is performed by forming the slit 33 after the step of forming the first electrode 27 and the second electrode 28 of the first embodiment. In addition, a step of arranging the spatial light modulator 40 is performed instead of the step of forming the dielectric multilayer film as the dichroic mirror 16 on the other surface of the substrate 15. In addition, the first light reflecting layer 13, the PC layer 12A, and the UC layer 11 are formed on one surface of a light transmissive substrate (for example, a quartz substrate), and the back surface of the substrate is bonded to the first electrode 27.

(Fifth Modification)

Figure 20:
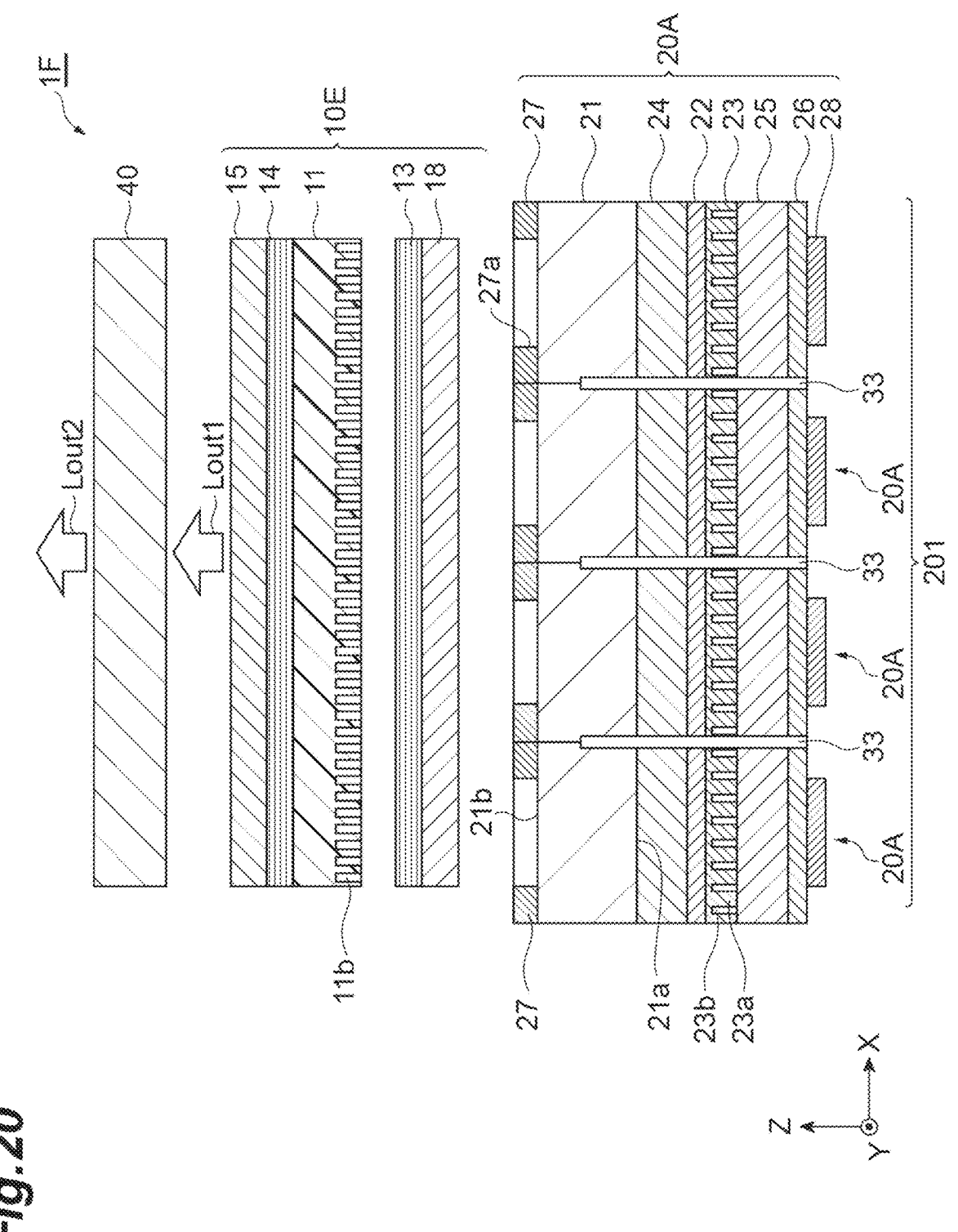
FIG. 20 is a cross-sectional view illustrating a step of manufacturing a light-emitting device according to a fifth modification.

FIG. 20 is a cross-sectional view illustrating a step of manufacturing a light-emitting device 1G according to a fifth modification. The light-emitting device 1G includes an optical device 10E and an excitation light source 201. The optical device 10E is different from the optical device 10D of the fourth modification in that the optical device 10E does not include a PC layer 12A, and instead, a part of a UC layer 11 in the thickness direction of the UC layer 11 functions as a PC layer by forming modified refractive index regions 11$b$ in the UC layer 11. Other configurations of the optical device 10E are similar to those of the optical device 10D of the fourth modification. In the fifth modification, after the second light reflecting layer 14 is formed on one surface of the substrate 15, an upconversion material dispersed in resin is applied onto the second light reflecting layer 14. Subsequently, the PC layer is formed by forming the modified refractive index regions 11$b$ in the resin layer by a nanoimprint method or the like. Then, the first light reflecting layer 13 is formed on one surface of the light transmissive substrate 18, and the first light reflecting layer 13 and the PC layer are bonded. In addition, the other surface of the substrate 18 and the first electrode 27 are bonded. Finally, the spatial light modulator 40 is arranged. The distribution of the modified refractive index regions 11$b$ is not limited to the distribution of the first embodiment, and may be the distribution of the second embodiment or the third embodiment (see FIG. 7 or 14). In the fifth modification, the first light reflecting layer 13 and the PC layer are bonded to each other, but may be separated from each other. In that case, excitation light is spatially propagated from the first light reflecting layer 13 and supplied to the UC layer 11.

(Sixth Modification)

Figure 21:
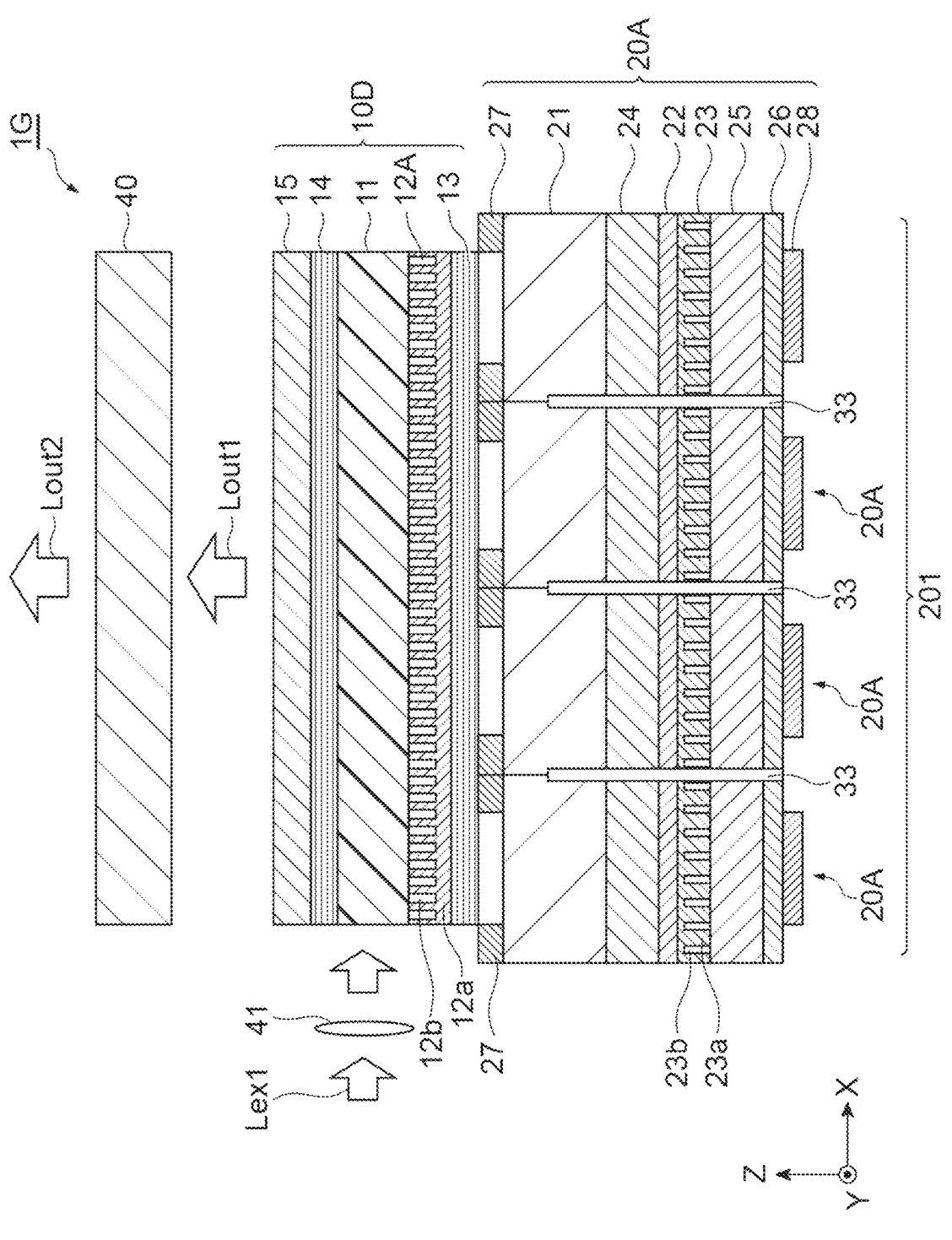
FIG. 21 is a diagram illustrating a cross-sectional structure of a light-emitting device according to a sixth modification.

FIG. 21 is a diagram illustrating a cross-sectional structure of a light-emitting device 1G according to a sixth modification. The light-emitting device 1G of the sixth modification further includes a lens 41 arranged on the side (in a direction intersecting the Z-axis direction) of the optical device 10D in addition to the configuration of the light-emitting device 1F according to the fourth modification. Then, excitation light Lex1 is supplied to the UC layer 11 from the side of the optical device 10D via the lens 41. The excitation light Lex1 is light outputted from an excitation light source (for example, a laser diode or a PCSEL) different from the excitation light source 201. The wavelength of the excitation light Lex1 is equal to the wavelength of the excitation light outputted from the excitation light source 201. As in the sixth modification, the excitation light Lex1 different from the excitation light supplied from the excitation light source 201 may be further supplied to the UC layer 11. In this case, since the density of the excitation light supplied to the UC layer 11 increases and the emission intensity of the light outputted from the UC layer 11 further increases, it is possible to easily exceed the oscillation threshold of the optical device 10D.

(Seventh Modification)

Figure 22:
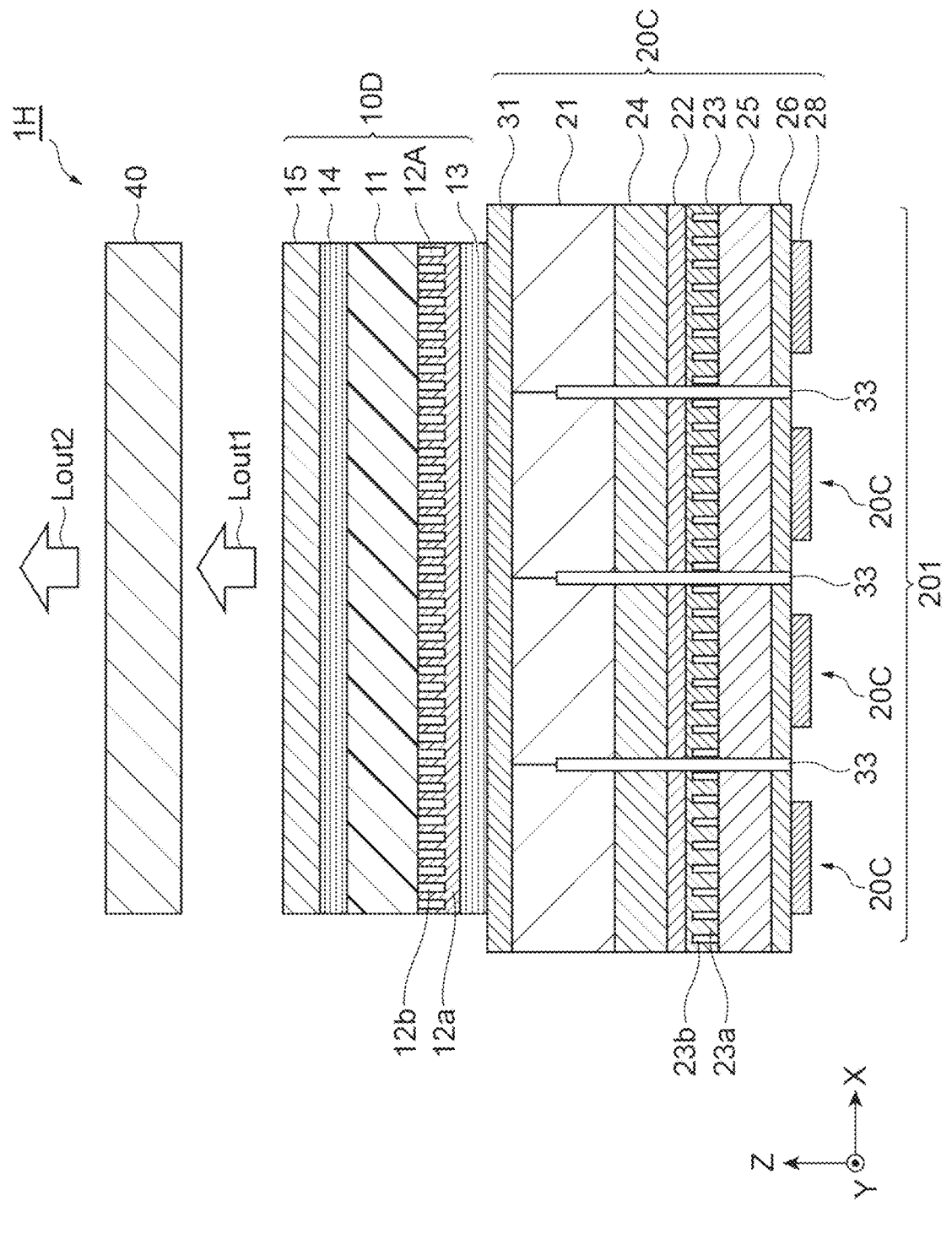
FIG. 22 is a diagram illustrating a cross-sectional structure of a light-emitting device according to a seventh modification.

FIG. 22 is a diagram illustrating a cross-sectional structure of a light-emitting device 1H according to a seventh modification. The light-emitting device 1H of the seventh modification includes an excitation light source 202 instead of the excitation light source 201 of the third modification. The excitation light source 202 is integrated with the optical device 10D and supplies excitation light to the UC layer 11. The excitation light source 202 includes a plurality of excitation light sources 20C. These excitation light sources 20C are PCSELs and are disposed on the opposite side of the UC layer 11 with respect to the first light reflecting layer 13. In addition, these excitation light sources 20C are arranged side by side in a one-dimensional or two-dimensional manner along the surface 13$a$ of the first light reflecting layer 13.

Each of the excitation light sources 20C includes a first electrode 31 instead of the first electrode 27 included in the excitation light source 20A of the first embodiment. Other configurations of the excitation light sources 20C are similar to those of the excitation light sources 20A. The first electrode 31 is formed of a transparent conductive film having optical transparency to at least a wavelength of excitation light, and is provided over the entire back surface 21$b$ of the semiconductor substrate 21. Then, the first light reflecting layer 13 of the optical device 10D faces the first electrode 31, and is in contact with the first electrode 31 in one example. Various materials such as indium tin oxide (ITO), a zinc oxide-based transparent conductive film, and a tin oxide-based transparent conductive film can be applied to the transparent conductive film.

In the seventh modification, a drive current is supplied between the first electrode 31 and the second electrode 28. Then, excitation light generated in each excitation light source 20C passes through the first electrode 31, reaches the first light reflecting layer 13, further passes through the first light reflecting layer 13, and is supplied to the UC layer 11. In the plurality of excitation light sources 20C, the semiconductor substrate 21 may be common. In this case, the excitation light source 202 is a laser element array in which a plurality of PCSELs are formed on the common semiconductor substrate 21.

(Eighth Modification)

Figure 23:
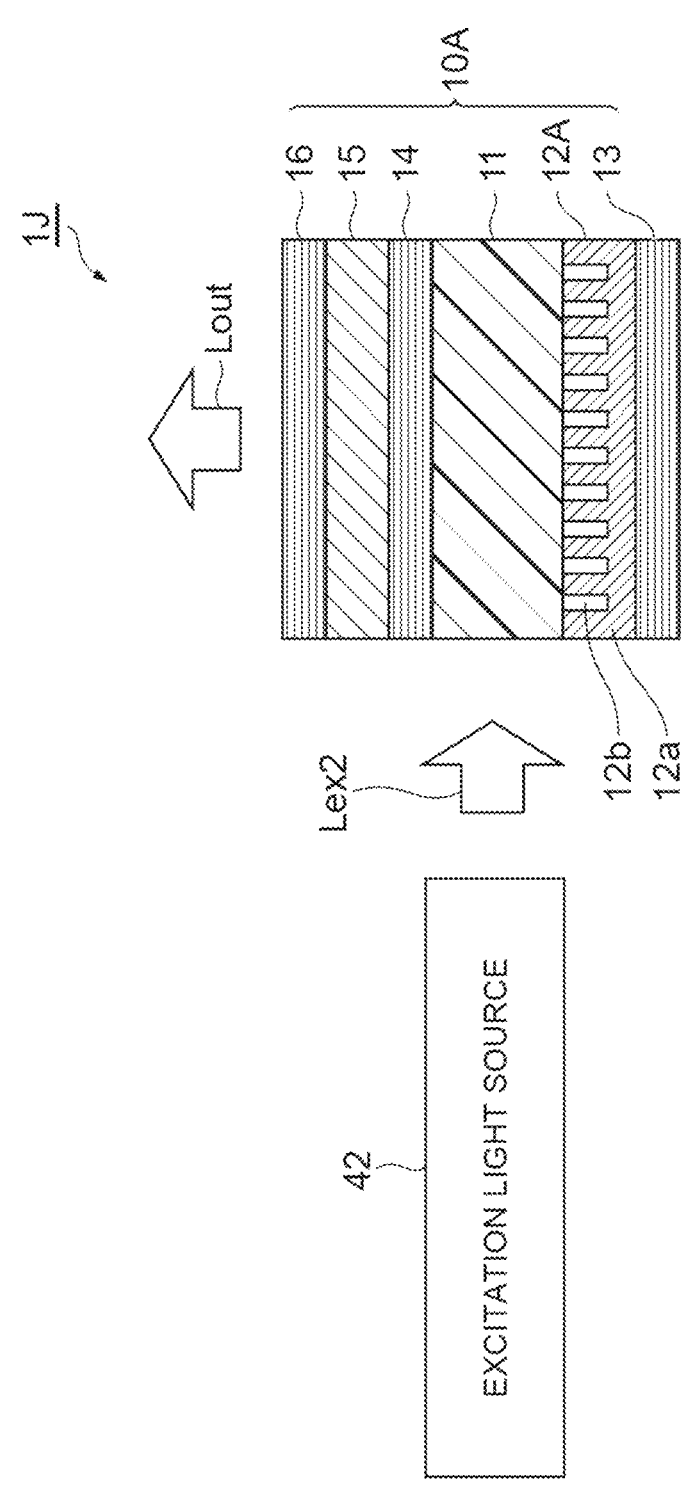
FIG. 23 is a diagram illustrating a cross-sectional structure of a light-emitting device according to an eighth modification.

FIG. 23 is a diagram illustrating a cross-sectional structure of a light-emitting device 1J according to an eighth modification. The light-emitting device 1J of the eighth modification includes an optical device 10A having the same configuration as that of the first embodiment and an excitation light source 42. The excitation light source 42 is disposed away from the optical device 10A and supplies excitation light Lex2 in the first wavelength range to the UC layer 11 of the optical device 10A. Therefore, the excitation light source 42 is spatially optically coupled to the UC layer 11 of the optical device 10A. In addition, the excitation light source 42 is optically coupled to the side surface of the UC layer 11, thereby supplying the excitation light Lex2 to the UC layer 11 without causing the excitation light Lex2 to pass through the first light reflecting layer 13 and the second light reflecting layer 14. Therefore, in both the first light reflecting layer 13 and the second light reflecting layer 14, the light transmission characteristic for the excitation light Lex2 is unnecessary, and thus, for example, another light reflecting film such as a metal film can be applied as the first light reflecting layer 13 instead of the dielectric multilayer film.

(Ninth Modification)

A modification of the phase modulation layer 12B of the second embodiment will be described in detail. In the ninth modification, the lattice spacing a of the virtual square lattice and the emission wavelength λ of the UC layer 11 satisfy the conditions for M-point oscillation. Furthermore, when considering a reciprocal lattice space (wave number space) in the phase modulation layer 12B, in-plane wave vectors in four directions indicating standing waves each including a wave number spread corresponding to an angular spread of light that undergoes phase modulation by a rotation angle distribution φ(x, y) and forms an optical image are formed. At least one of the in-plane wave vectors is smaller than 2π/λ (light line). These points will be described below in detail.

First, for comparison, a photonic crystal laser (PCSEL) that oscillates at a Γ point in a reciprocal lattice space will be described. The PCSEL includes an active layer and a PC layer in which a plurality of modified refractive index regions are periodically arrayed two-dimensionally. The PCSEL outputs laser light along the normal direction of the main surface of the semiconductor substrate while forming a standing wave having an oscillation wavelength corresponding to the arrangement period of the modified refractive index regions in a plane perpendicular to the thickness direction of the PC layer. In addition, for the Γ-point oscillation, the lattice spacing a of the virtual square lattice, the emission wavelength λ of the UC layer 11, and the equivalent refractive index (effective refractive index) n of the mode preferably satisfy the condition: λ=na.

Figure 24:
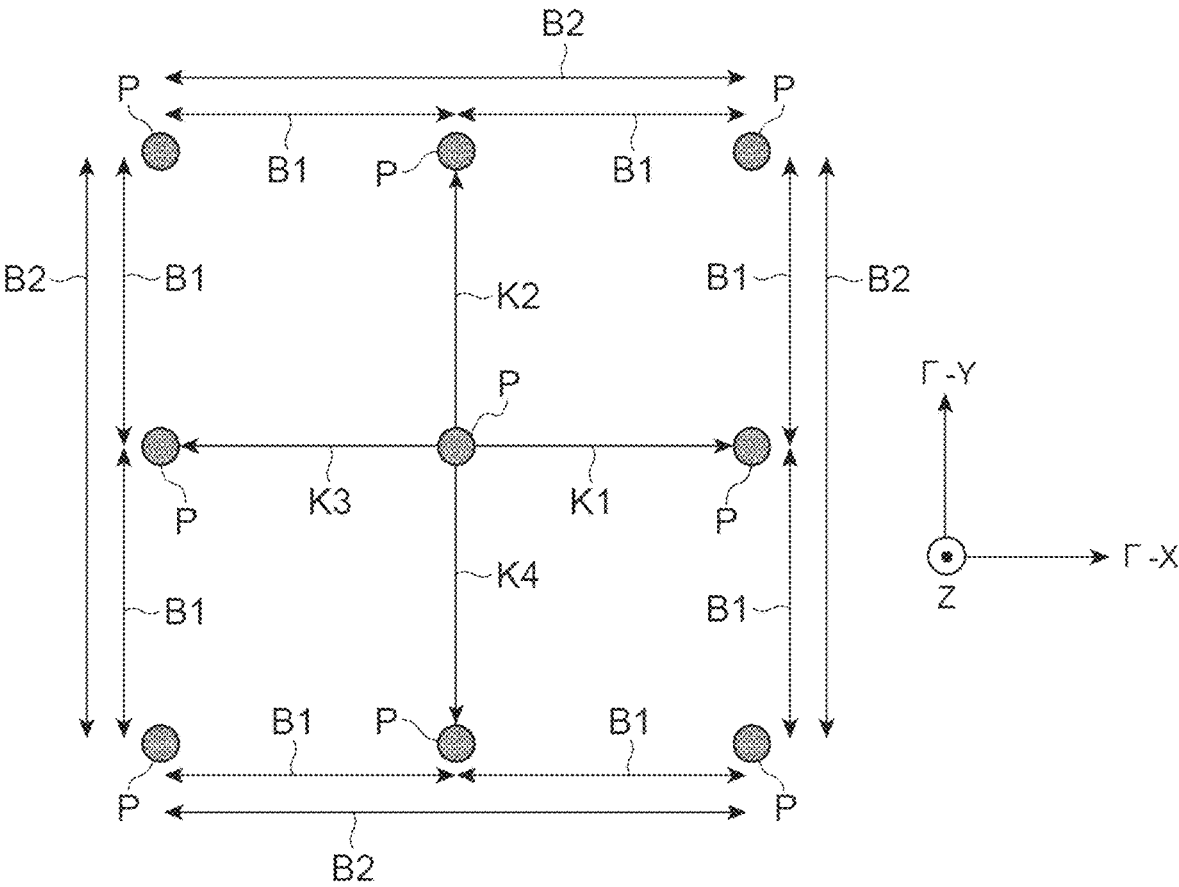
FIG. 24 is a plan view illustrating a reciprocal lattice space related to a PC layer of a PCSEL that oscillates at a Γ point.

FIG. 24 is a plan view illustrating a reciprocal lattice space (wave number space) related to the PC layer of the PCSEL that oscillates at the Γ point. FIG. 24 illustrates a case where the plurality of modified refractive index regions are located on lattice points of the square lattice, and points P in FIG. 24 indicate reciprocal lattice points. Each arrow B1 in FIG. 24 indicates a basic reciprocal lattice vector, and each arrow B2 indicates a reciprocal lattice vector twice as large as the basic reciprocal lattice vector B1. Arrows K1, K2, K3, and K4 indicate four in-plane wave vectors. The four in-plane wave vectors K1, K2, K3, and K4 are combined with each other through diffraction of 90° and 180° to form a standing wave state. Here, a Γ-X axis and a Γ-Y axis orthogonal to each other in the reciprocal space are defined. The Γ-X axis is parallel to one side of the square lattice, and the Γ-Y axis is parallel to the other side of the square lattice. Each in-plane wave vector is a vector obtained by projecting the wave vector in the Γ-X·Γ-Y plane. That is, the in-plane wave vector K1 points toward the Γ-X-axis positive direction, the in-plane wave vector K2 points toward the Γ-Y-axis positive direction, the in-plane wave vector K3 points toward the Γ-X-axis negative direction, and the in-plane number vector K4 points toward the Γ-Y-axis negative direction. As is clear from FIG. 24, in the PCSEL that oscillates at the Γ point, the magnitude of the in-plane wave vectors K1 to K4 (that is, the magnitude of the standing wave in the in-plane direction) is equal to the magnitude of the basic reciprocal lattice vector B1. The magnitude k of the in-plane wave vectors K1 to K4 is expressed by the following Equation (9).

$$k = |B1| = \frac{2\pi}{a} \qquad (9)$$

Figure 25:
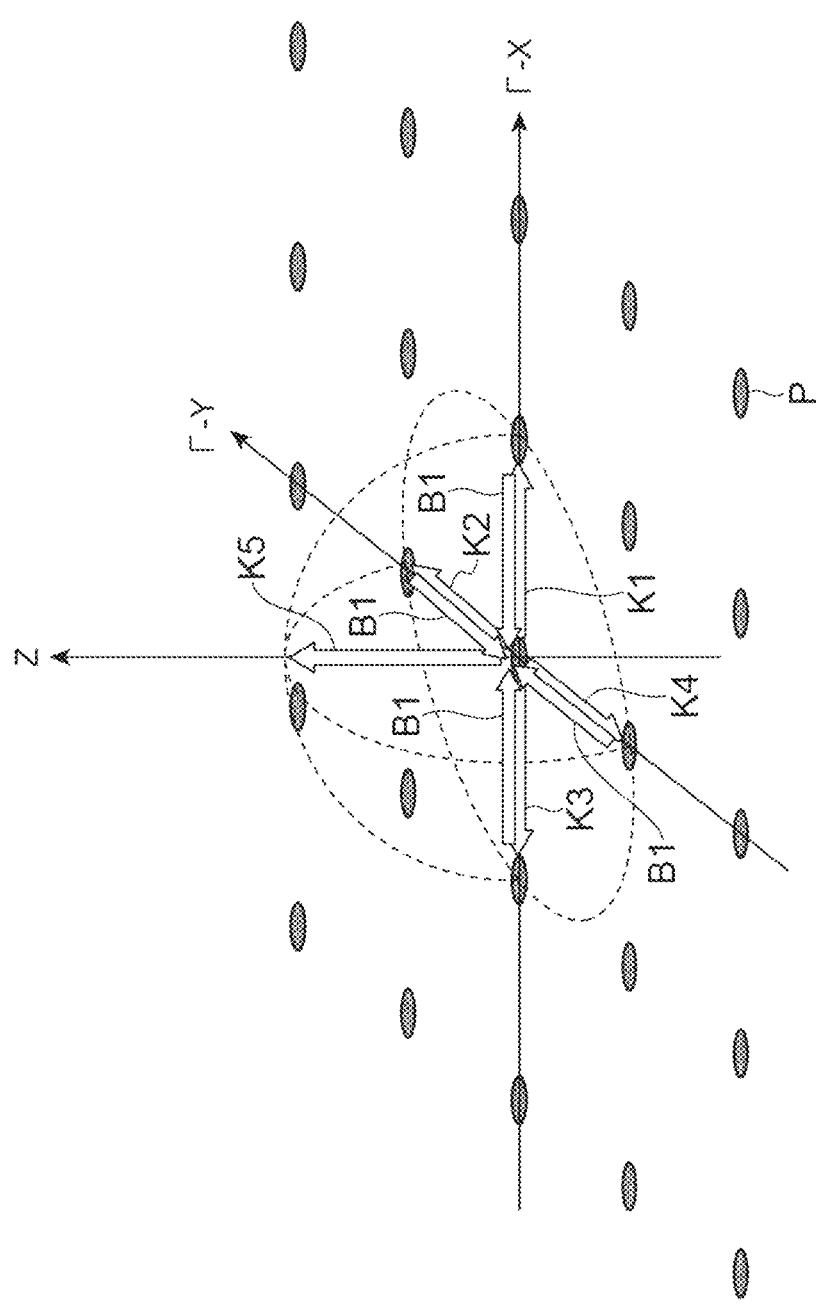
FIG. 25 is a perspective view of the reciprocal lattice space illustrated in FIG. 24 as viewed three-dimensionally.

FIG. 25 is a perspective view of the reciprocal lattice space illustrated in FIG. 24 as viewed three-dimensionally. FIG. 25 illustrates a Z-axis orthogonal to the directions of the Γ-X axis and the Γ-Y axis. The Z-axis is the same as the Z-axis illustrated in FIG. 1. As illustrated in FIG. 25, in the PCSEL that oscillates at the Γ point, the wave number in the in-plane direction becomes 0 by diffraction, and diffraction in the direction perpendicular to the plane (Z-axis direction) occurs (arrow K5 in the drawing). Therefore, the laser light is basically outputted in the Z-axis direction.

Figure 26:
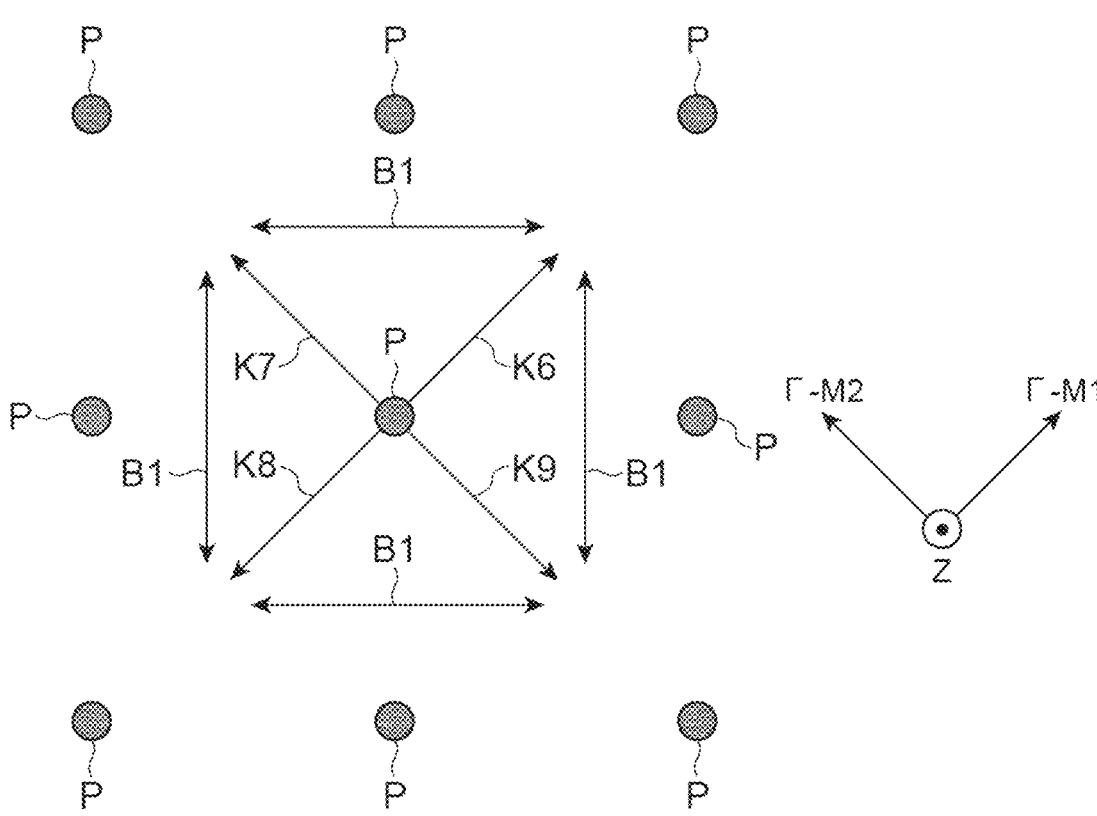
FIG. 26 is a plan view illustrating a reciprocal lattice space related to a PC layer of a PCSEL that oscillates at an M point.

Next, a PCSEL that oscillates at the M point will be described. For the M-point oscillation, the lattice spacing a of the virtual square lattice, the emission wavelength λ of the UC layer 11, and the equivalent refractive index n of the mode may satisfy the condition: λ=(2^{1/2})n×a. FIG. 26 is a plan view illustrating a reciprocal lattice space (wave number space) related to the PC layer of the PCSEL that oscillates at the M point. FIG. 26 also illustrates a case where the plurality of modified refractive index regions are located on lattice points of the square lattice, and points P in FIG. 26 indicate reciprocal lattice points. Each arrow B1 in FIG. 26 indicates a basic reciprocal lattice vector similar to that in FIG. 24, and arrows K6, K7, K8, and K9 indicate four in-plane wave vectors. Here, a Γ-M1 axis and a Γ-M2 axis orthogonal to each other in the reciprocal space are defined. The Γ-M1 axis is parallel to one diagonal direction of the square lattice, and the Γ-M2 axis is parallel to the other diagonal direction of the square lattice. Each in-plane wave vector is a vector obtained by projecting the wave vector in the Γ-M1·Γ-M2 plane. That is, the in-plane wave vector K6 points toward the Γ-M1 axis positive direction. The in-plane wave vector K7 points toward the Γ-M2 axis positive direction. The in-plane wave vector K8 points toward the Γ-M1 axis negative direction. The in-plane wave vector K9 points toward the Γ-M2 axis negative direction. As is clear from FIG. 26, in the PCSEL that oscillates at the M point, the magnitude of the in-plane wave vectors K6 to K9 (that is, the magnitude of the standing wave in the in-plane direction) is smaller than the magnitude of the basic reciprocal lattice vector B1. The magnitude k of the in-plane wave vectors K6 to K9 is expressed by the following Equation (10).

$$k = \frac{1}{\sqrt{2}} \frac{2\pi}{a} \tag{10}$$

Diffraction occurs in the direction of the vector sum of the reciprocal lattice vectors (the magnitude is $2m\pi/a$, and in is an integer) in the wave vectors K6 to K9. However, in the PCSEL that oscillates at the M point, the wave number in the in-plane direction cannot be 0 by diffraction, and diffraction in the direction (Z-axis direction) perpendicular to the plane does not occur. Therefore, since laser light is not outputted in the direction perpendicular to the plane, the M-point oscillation is not usually used in the PCSEL.

Figure 27:
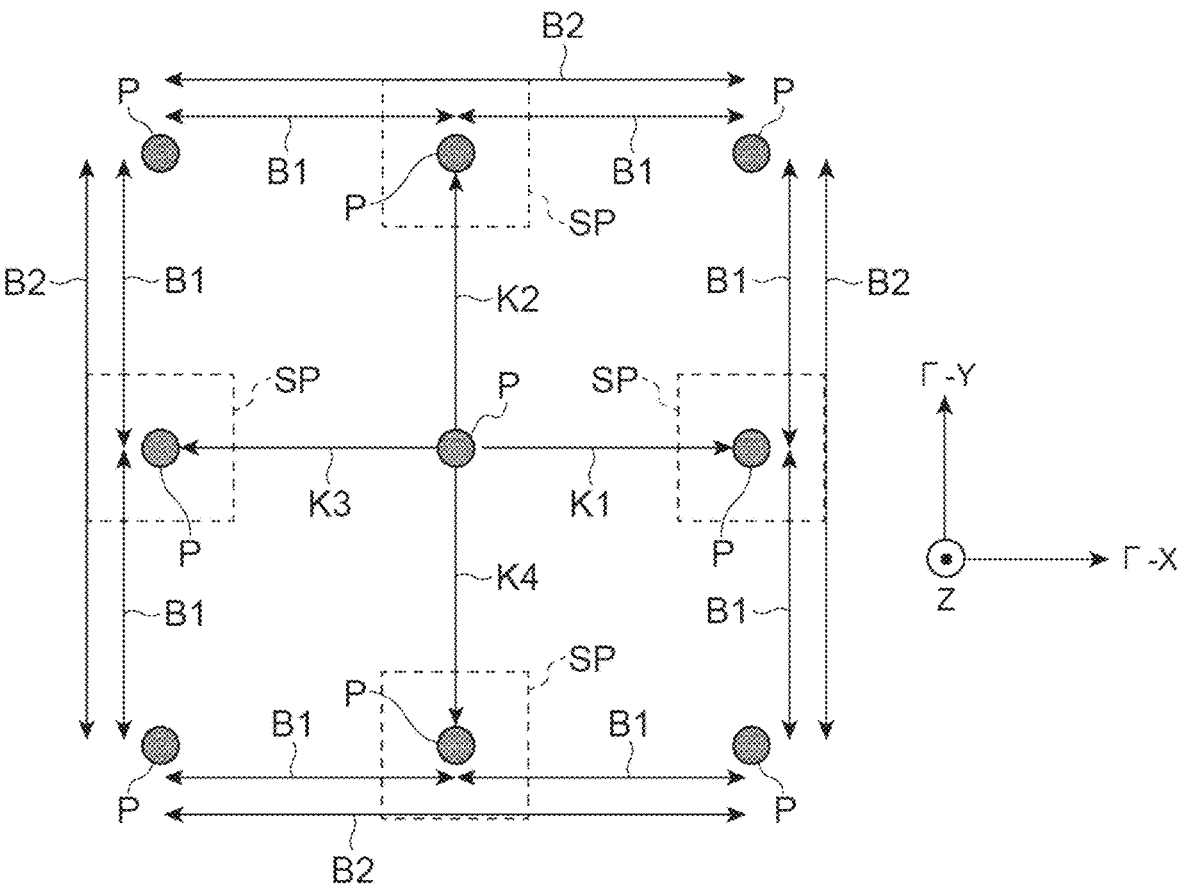
FIG. 27 is a plan view illustrating a reciprocal lattice space related to a phase modulation layer of an S-iPM laser that oscillates at the Γ point.

Next, an S-iPM laser that oscillates at the Γ point will be described. Note that conditions for the Γ-point oscillation are similar to those in the above-described PCSEL. FIG. 27 is a plan view illustrating a reciprocal lattice space related to a phase modulation layer of the S-iPM laser that oscillates at the Γ point. The basic reciprocal lattice vector B1 is similar to the PCSEL of the Γ-point oscillation (see FIG. 24), but the in-plane wave vectors K1 to K4 are subjected to phase modulation by the rotation angle distribution φ(x, y), and each have a wavenumber spread SP corresponding to the spread angle of the optical image. The wavenumber spread SP can be expressed as a rectangular region that is centered on the tip of each of the in-plane wave vectors K1 to K4 in the PCSEL of the Γ-point oscillation, and in which the lengths of the sides in the x-axis direction and the y-axis direction are $2\Delta kx_{max}$ and $2\Delta ky_{max}$, respectively. By such a wavenumber spread SP, each of the in-plane wave vectors K1 to K4 spreads in a rectangular range of (Kix+Δkx, Kiy+Δky) (i=1 to 4, Kix is an x-direction component of the vector Ki, and Kiy is a y-direction component of the vector Ki). Here, $-\Delta kx_{max} \leq \Delta kx \leq \Delta kx_{max}$, and $-\Delta ky_{max} \leq \Delta ky \leq \Delta ky_{max}$ are satisfied. The sizes of $\Delta kx_{max}$ and $\Delta ky_{max}$ are determined according to the spread angle of the optical image. In other words, the sizes of $\Delta kx_{max}$ and $\Delta ky_{max}$ depend on the optical image to be displayed.

Figure 28:
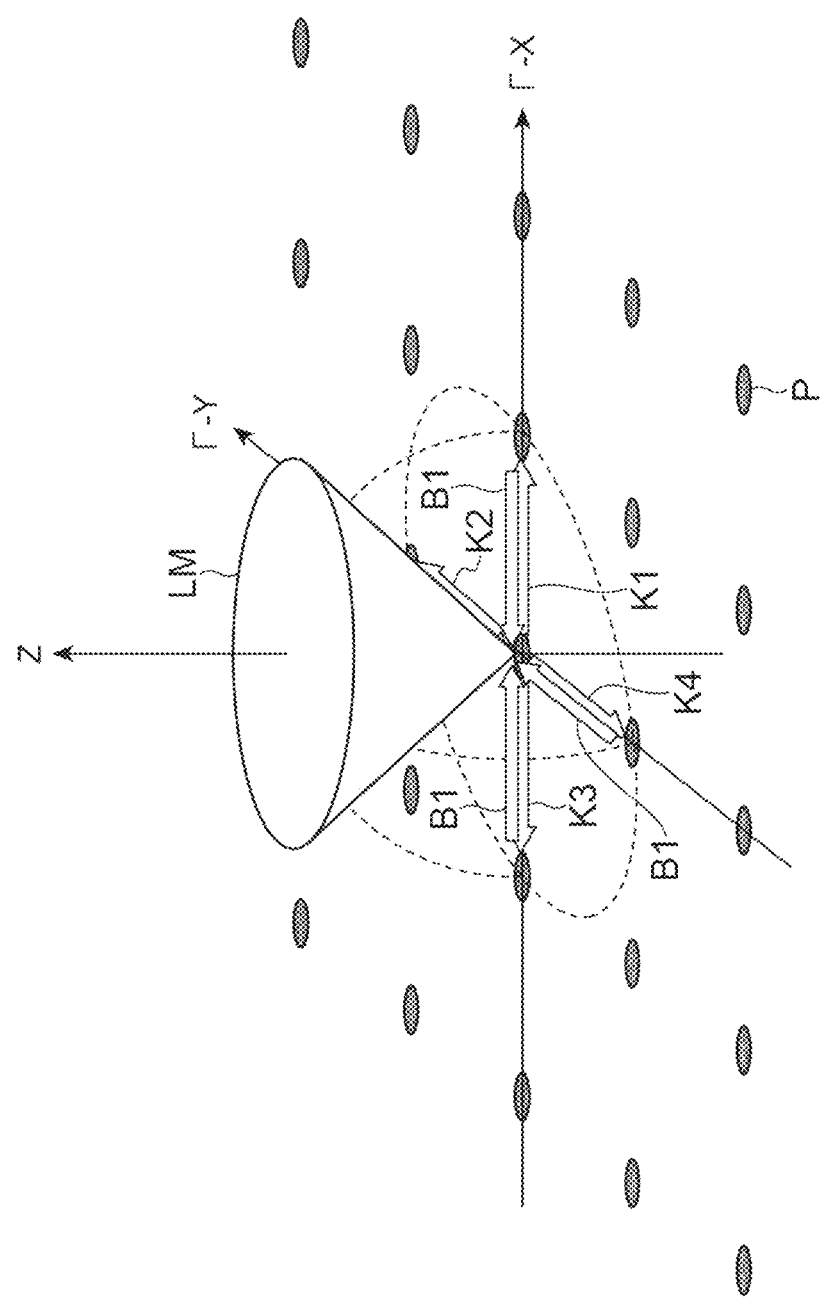
FIG. 28 is a perspective view of a reciprocal lattice space illustrated in FIG. 27 as viewed three-dimensionally.

FIG. 28 is a perspective view of the reciprocal lattice space illustrated in FIG. 27 as viewed three-dimensionally. FIG. 28 illustrates a Z-axis orthogonal to the direction along the Γ-X axis and the direction along the Γ-Y axis. The Z-axis is the same as the Z-axis illustrated in FIG. 1. As illustrated in FIG. 28, in the case of the S-iPM laser that oscillates at the Γ point, not only the 0th-order light in the direction (Z-axis direction) perpendicular to the plane but also an optical image (beam pattern) LM having a two-dimensional spread including the +1st-order light and the −1st-order light in a direction inclined with respect to the Z-axis direction are outputted.

Figure 29:
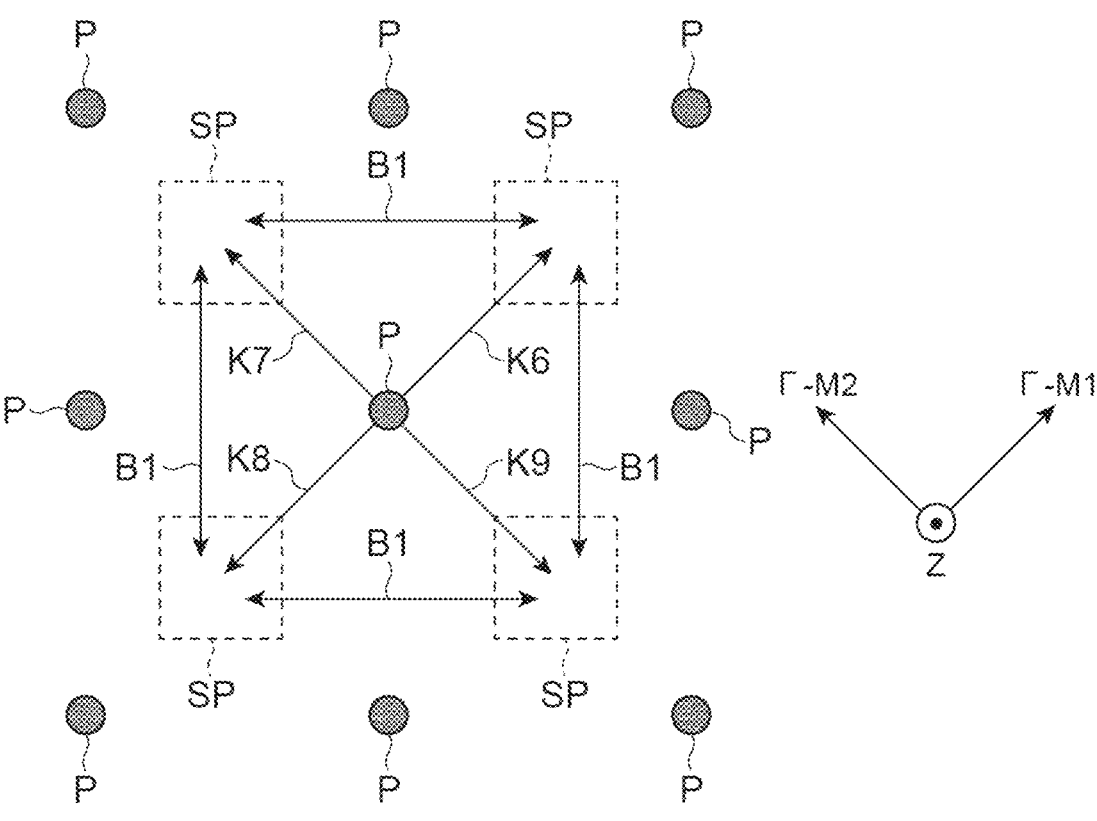
FIG. 29 is a plan view illustrating a reciprocal lattice space related to a phase modulation layer of an S-iPM laser that oscillates at the M point.

Next, an S-iPM laser that oscillates at the M point will be described. Note that conditions for the M-point oscillation are similar to those in the above-described PCSEL. FIG. 29 is a plan view illustrating a reciprocal lattice space related to a phase modulation layer of the S-iPM laser that oscillates at the M point. Each basic reciprocal lattice vector B1 is similar to the PCSEL of the M-point oscillation (see FIG. 26), but in-plane wave vectors K6 to K9 each have a wavenumber spread SP by the rotation angle distribution φ(x, y). Note that the shape and size of the wavenumber spread SP are similar to those in the case of the Γ-point oscillation described above. Also in the S-iPM laser, in the case of the M-point oscillation, the magnitude of the in-plane wave vectors K6 to K9 (that is, the magnitude of the standing wave in the in-plane direction) is smaller than the magnitude of the basic reciprocal lattice vector B1 (the wave number in the in-plane direction cannot be 0 by diffraction, and diffraction in the direction (Z-axis direction) perpendicular to the plane does not occur). Therefore, the 0th-order light in the direction (Z-axis direction) perpendicular to the plane and both the +1st-order light and the −1st-order light in the direction inclined with respect to the Z-axis direction are not outputted.

Figure 30:
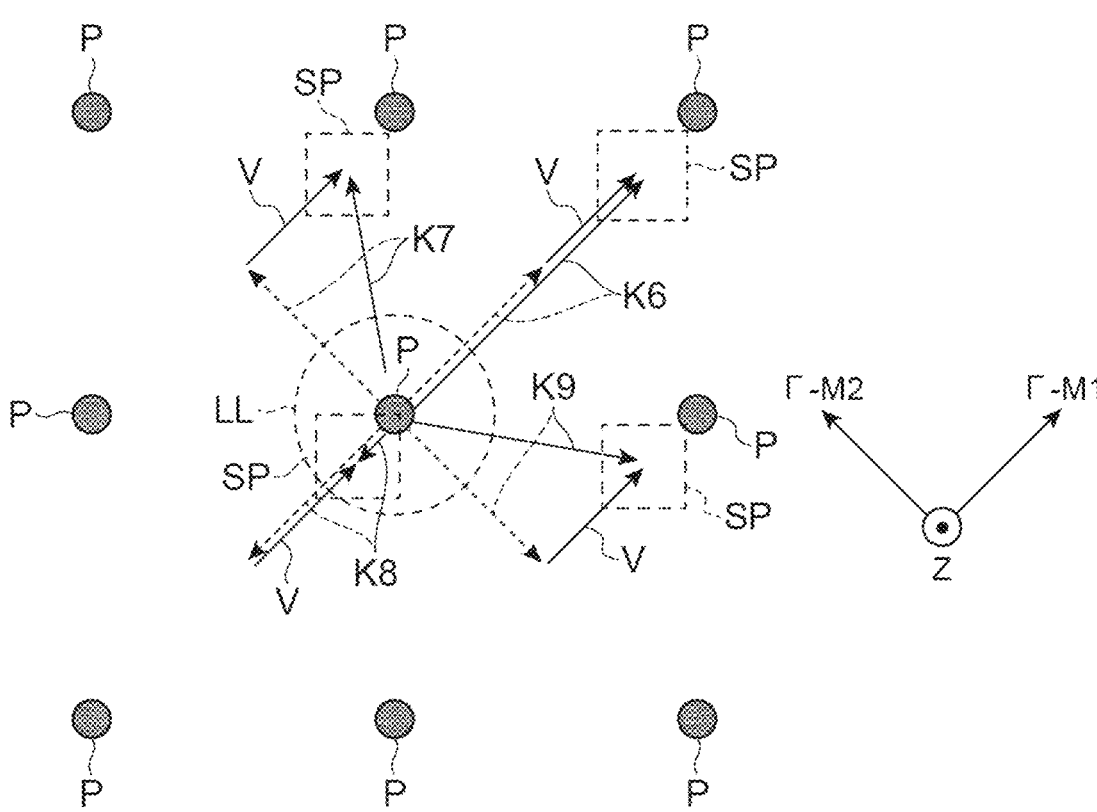
FIG. 30 is a conceptual diagram for explaining an operation of adding a diffraction vector having a certain magnitude and a certain direction with respect to an in-plane wave vector.

Here, in the ninth modification, the phase modulation layer 12B is devised as follows in the S-iPM laser that oscillates at the M point, whereby the S-iPM laser outputs a part of the +1st-order light and the −1st-order light without outputting the 0th-order light. Specifically, as illustrated in FIG. 30, the magnitude of at least one of the in-plane wave vectors K6 to K9 (the in-plane wave vector K8 in FIG. 30) is set to be smaller than $2\pi/\lambda$ by adding a diffraction vector V having a certain constant magnitude and a certain direction to the in-plane wave vectors K6 to K9. In other words, at least one (in-plane wave vector K8) of the in-plane wave vectors K6 to K9 after the diffraction vector V is added falls within a circular region (light line) LL having the radius of $2\pi/\lambda$. In FIG. 30, the in-plane wave vectors K6 to K9 indicated by broken lines are before the addition of the diffraction vector V, and the in-plane wave vectors K6 to K9 indicated by solid lines are after the addition of the diffraction vector V. The light line LL corresponds to a total reflection condition, and a wave vector having a magnitude that fits inside the light line LL has a component in the direction (Z-axis direction) perpendicular to the plane. In one example, the direction of the diffraction vector V extends along the Γ-M1 axis or the Γ-M2 axis, and its magnitude is in the range of $2\pi/(2^{1/2})a - \pi/\lambda$ to $2\pi/(2^{1/2})a + \pi/\lambda$ (as an example, $2\pi/(2^{1/2})a$).

The magnitude and direction of the diffraction vector V for keeping at least one of the in-plane wave vectors K6 to K9 inside the light line LL will be examined. The following Formulas (11) to (14) indicate the in-plane wave vectors K6 to K9 before the addition of the diffraction vector V, respectively.

$$K6 = \left(\frac{\pi}{a} + \Delta kx, \ \frac{\pi}{a} + \Delta ky\right) \tag{11}$$

$$K7 = \left(-\frac{\pi}{a} + \Delta kx, \ \frac{\pi}{a} + \Delta ky\right) \tag{12}$$

$$K8 = \left(-\frac{\pi}{a} + \Delta kx, \ -\frac{\pi}{a} + \Delta ky\right) \tag{13}$$

$$K9 = \left(\frac{\pi}{a} + \Delta kx, \ -\frac{\pi}{a} + \Delta ky\right) \tag{14}$$

Note that the spreads Δkx and Δky of each of the wave vectors satisfy the following Formulas (15) and (16), respectively, and the maximum value $\Delta kx_{max}$ of the spread of the in-plane wave vector in the x-axis direction and the maximum value $\Delta ky_{max}$ of the spread of the in-plane wave vector in the y-axis direction are defined by an angular spread of light forming a designed optical image.

$$-\Delta kx_{max} \leq \Delta kx \leq \Delta kx_{max} \tag{15}$$

$$-\Delta ky_{max} \leq \Delta ky \leq \Delta ky_{max} \tag{16}$$

Here, when the diffraction vector V is expressed by the following Formula (17), the in-plane wave vectors K6 to K9 to which the diffraction vector V is added are expressed by the following Formulas (18) to (21).

$$V = (Vx, Vy) \tag{17}$$

$$K6 = \left(\frac{\pi}{a} + \Delta kx + Vx, \ \frac{\pi}{a} + \Delta ky + Vy\right) \tag{18}$$

$$K7 = \left(-\frac{\pi}{a} + \Delta kx + Vx, \ \frac{\pi}{a} + \Delta ky + Vy\right) \tag{19}$$

$$K8 = \left(-\frac{\pi}{a} + \Delta kx + Vx, \ -\frac{\pi}{a} + \Delta ky + Vy\right) \tag{20}$$

$$K9 = \left(\frac{\pi}{a} + \Delta kx + Vx, \ -\frac{\pi}{a} + \Delta ky + Vy\right) \tag{21}$$

Considering that any one of the wave vectors K6 to K9 fits inside the light line LL according to the above-described Formulas (18) to (21), the relationship of the following Formula (22) is established.

$$\left(\pm\frac{\pi}{a} + \Delta kx + Vx\right)^2 + \left(\pm\frac{\pi}{a} + \Delta ky + Vy\right)^2 < \left(\frac{2\pi}{\lambda}\right)^2 \tag{22}$$

That is, by adding the diffraction vector V satisfying the above-described formula (22), one of the wave vectors K6 to K9 fits inside the light line LL, and a part of the +1st-order light and the −1st-order light is outputted.

Figure 31:
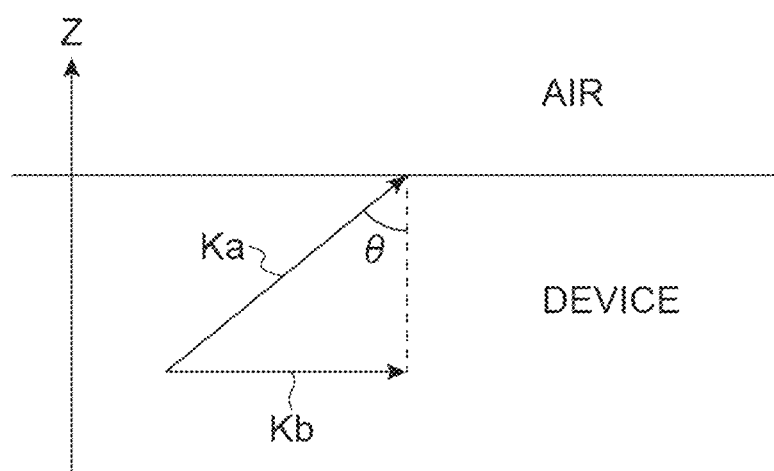
FIG. 31 is a diagram schematically illustrating a peripheral structure of a light line.

The size (radius) of the light line LL is set to $2\pi/\lambda$ for the following reason. FIG. 31 is a diagram for schematically explaining a peripheral structure of the light line LL, and illustrates a boundary between a device and air as viewed from a direction perpendicular to the Z-axis direction. The magnitude of the wave vector of light in vacuum is $2\pi/\lambda$, but when the light propagates through the device medium as illustrated in FIG. 31, the magnitude of a wave vector Ka in the medium having the refractive index n is $2\pi n/\lambda$. In this case, in order for light to propagate through the boundary between the device and air, a wavenumber component parallel to the boundary needs to be continuous (wavenumber conservation law). When the wave vector Ka and the Z-axis form an angle $\theta$ in FIG. 31, the length of a wave vector (that is, the in-plane wave vector) Kb projected in the plane is $(2\pi n/\lambda)\sin\theta$. On the other hand, in general, from the relationship of the refractive index $n>1$ of the medium, the wavenumber conservation law does not hold at an angle at which the in-plane wave vector Kb in the medium is larger than $2\pi/\lambda$. In this case, the light is totally reflected and cannot be extracted to the air side. The magnitude of the wave vector corresponding to the total reflection condition is the size of the light line LL, which is $2\pi/\lambda$.

As an example of a specific method of adding the diffraction vector V to the in-plane wave vectors K6 to K9, a method of superimposing a rotation angle distribution $\varphi_2(x, y)$ (second phase distribution) not related to the optical image on a rotation angle distribution $\varphi_1(x, y)$ (first phase distribution) that is a phase distribution for forming a desired optical image is considered. In this case, the rotation angle distribution $\varphi(x, y)$ of the phase modulation layer 12B is expressed as $$\varphi(x,y) = \varphi_1(x,y) + \varphi_2(x,y).$$

Figure 32:
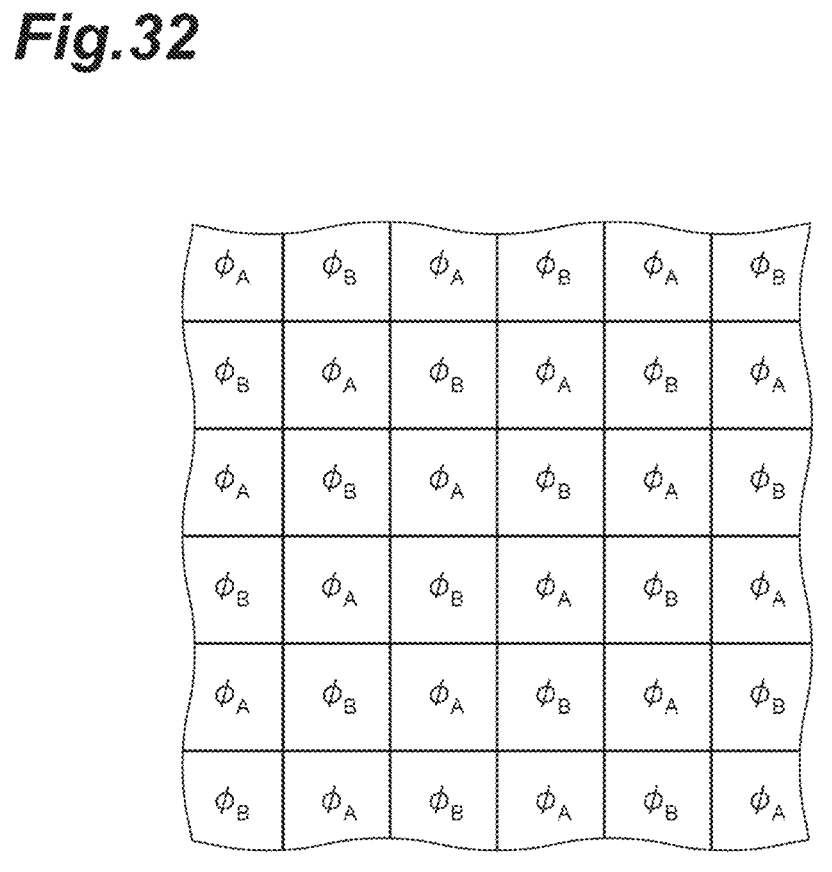

$\varphi_1(x, y)$ corresponds to the phase of the complex amplitude when the optical image is subjected to the inverse Fourier transform as described above. Further, $\varphi_2(x, y)$ is a rotation angle distribution for adding the diffraction vector V that satisfies the above-described Formula (22). FIG. 32 is a diagram conceptually illustrating an example of the rotation angle distribution $\varphi_2(x, y)$. As illustrated in FIG. 32, in this example, the first phase value $\varphi_A$ and the second phase value $\varphi_B$ different from the first phase value $\varphi_A$ are arranged in a checkered pattern. That is, the first phase value $\varphi_A$ and the second phase value $\varphi_B$ different from the first phase value $\varphi_A$ are alternately arranged along each of two orthogonal directions. In one example, the first phase value $\varphi_A$ is 0 (rad), and the second phase value $\varphi_B$ is $\pi$ (rad). That is, the first phase value $\varphi_A$ and the second phase value $\varphi_B$ change by $\pi$. By such an array of phase values, the diffraction vector V along the Γ-M1 axis or the Γ-M2 axis can be suitably implemented. In a case where the first phase value $\varphi_A$ and the second phase value $\varphi_B$ are arranged in a checkered pattern as described above, the diffraction vector V is exactly offset by the wave vectors K6 to K9 illustrated in FIG. 29 as V=(±π/a, ±π/a). In addition, by changing the arrangement direction of the first and second phase values $\varphi_A$ and $\varphi_B$ from 45°, the direction of the diffraction vector V can be adjusted to an arbitrary direction.

Note that, in the structure of the ninth modification, the material system, the film thickness, and the layer configuration can be variously changed as long as the structure includes the UC layer 11 and the phase modulation layer 12B. Here, the scaling rule holds for a so-called square lattice photonic crystal laser in which perturbation from the virtual square lattice is 0. That is, when the wavelength becomes $\alpha$ times and $\alpha$ is a constant value, the same standing wave state can be obtained by multiplying the entire square lattice structure by $\alpha$. Similarly, also in the present modification, the structure of the phase modulation layer 12B can be determined by the scaling law according to the wavelength.

Effects obtained by the phase modulation layer 12B according to the ninth modification described above will be described. In the ninth modification, the lattice spacing a of the virtual square lattice and the emission wavelength $\lambda$ of the UC layer 11 satisfy the conditions for the M-point oscillation. Normally, in the standing wave state of the M-point oscillation, the light propagating in the phase modulation layer 12B is totally reflected, and the outputs of both the signal light (+1st-order light and −1st-order light) and the 0th-order light are suppressed. However, in the ninth modification, the magnitude of at least one of the in-plane wave vectors K6 to K9 which are the in-plane wave vectors formed in the reciprocal lattice space of the phase modulation layer 12B and extend in the four directions each including the wave number spread $\Delta k$ by the rotation angle distribution $\varphi(x, y)$ is smaller than $2\pi/\lambda$ (light line LL). In the S-iPM laser, for example, the in-plane wave vectors K6 to K9 can be adjusted by devising the rotation angle distribution $\varphi(x, y)$. Then, in a case where the magnitude of at least one in-plane wave vector is smaller than $2\pi/\lambda$, the in-plane wave vector has a component in the Z-axis direction, and as a result, a part of the signal light is outputted from the phase modulation layer 12B. However, the 0th-order light is not outputted from the phase modulation layer 12B inside the light line because the 0th-order light is still confined in the plane in the direction matching any one of the four wave vectors (±π/a, ±π/a) forming the standing wave of the M point. That is, according to the ninth modification, the 0th-order light included in the output of the S-iPM laser can be removed from inside the light line, and only the signal light can be outputted inside the light line.

Further, as in the ninth modification, in the rotation angle distribution $\varphi(x, y)$, the rotation angle distribution $\varphi_1(x, y)$ corresponding to the optical image and the rotation angle distribution $\varphi_2(x, y)$ not related to the optical image may be superimposed. In that case, the rotation angle distribution $\varphi_2(x, y)$ may be a rotation angle distribution for adding the diffraction vector V having a certain magnitude and a certain direction to the in-plane wave vectors K6 to K9 in the four directions by the rotation angle distribution $\varphi_1(x, y)$ on the reciprocal lattice space of the phase modulation layer 12B. As a result of adding the diffraction vector V to the in-plane wave vectors K6 to K9 in the four directions, the magnitude of at least one of the in-plane wave vectors K6 to K9 in the four directions may be smaller than $2\pi/\lambda$. As a result, it is possible to easily implement a configuration in which the magnitude of at least one of the in-plane wave vectors K6 to K9 in the four directions including the wave number spreads $\Delta kx$ and $\Delta ky$ by the rotation angle distribution $\varphi(x, y)$ is smaller than $2\pi/\lambda$ (light line) in the reciprocal lattice space.

Further, as in the ninth modification, the rotation angle distribution $\varphi_2(x, y)$ may be a pattern in which phase values $\varphi_A$ and $\varphi_B$ having different values are arranged in a checkered pattern. With the rotation angle distribution $\varphi_2(x, y)$, the above-described diffraction vector V can be easily implemented.

Figure 33:
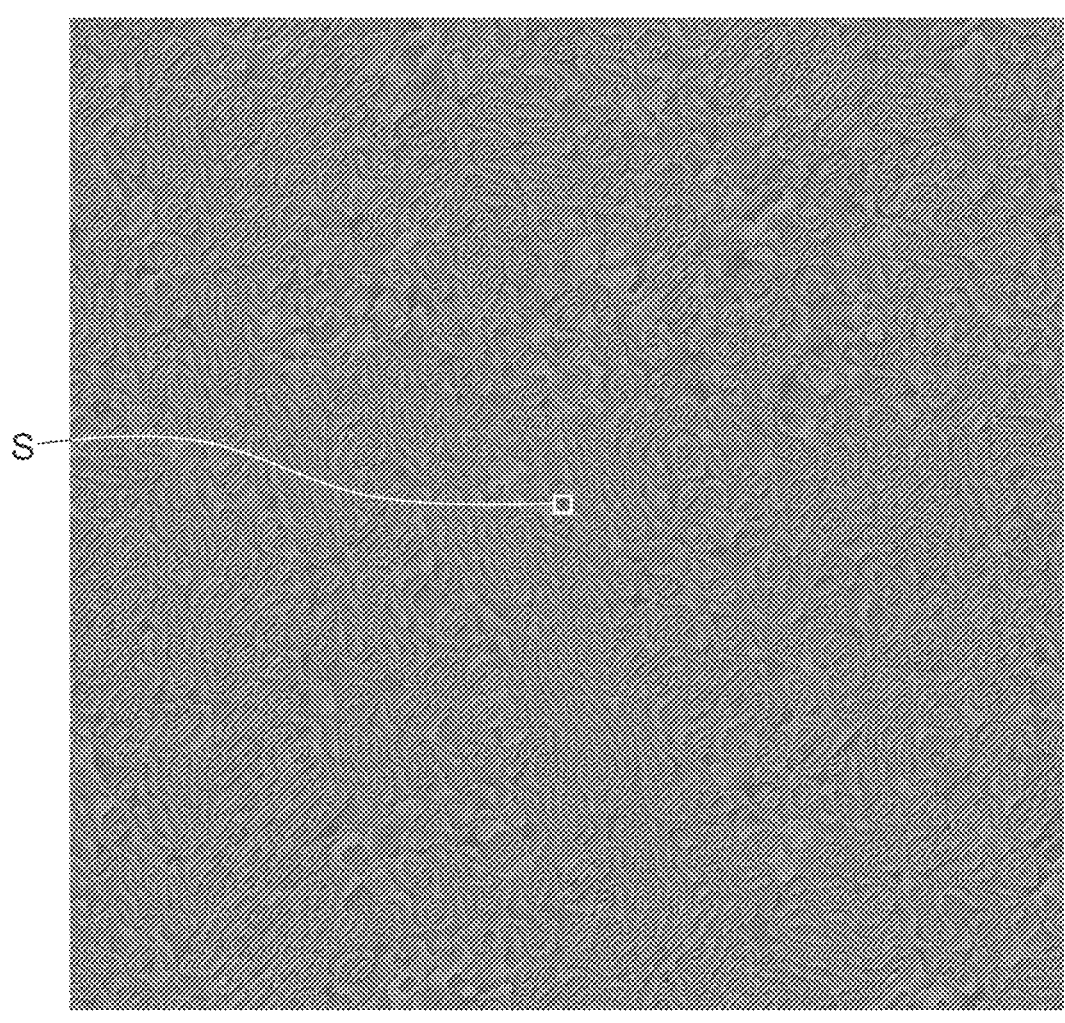
FIG. 33 is a diagram illustrating an example of a rotation angle distribution of the phase modulation layer.
Figure 34:
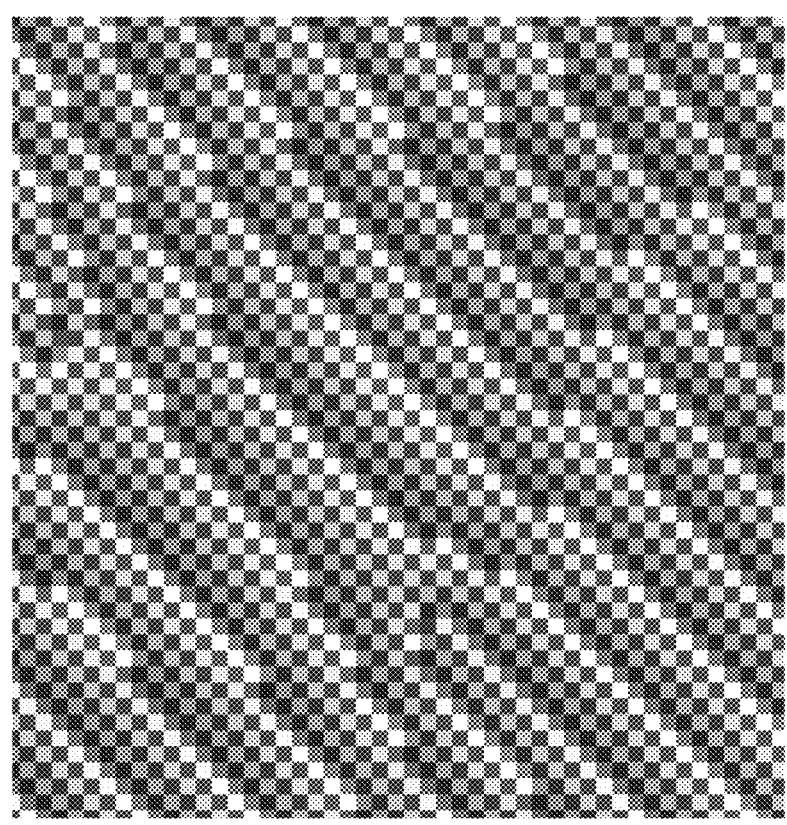
FIG. 34 is an enlarged view of a part S illustrated in FIG. 33.
Figure 35:
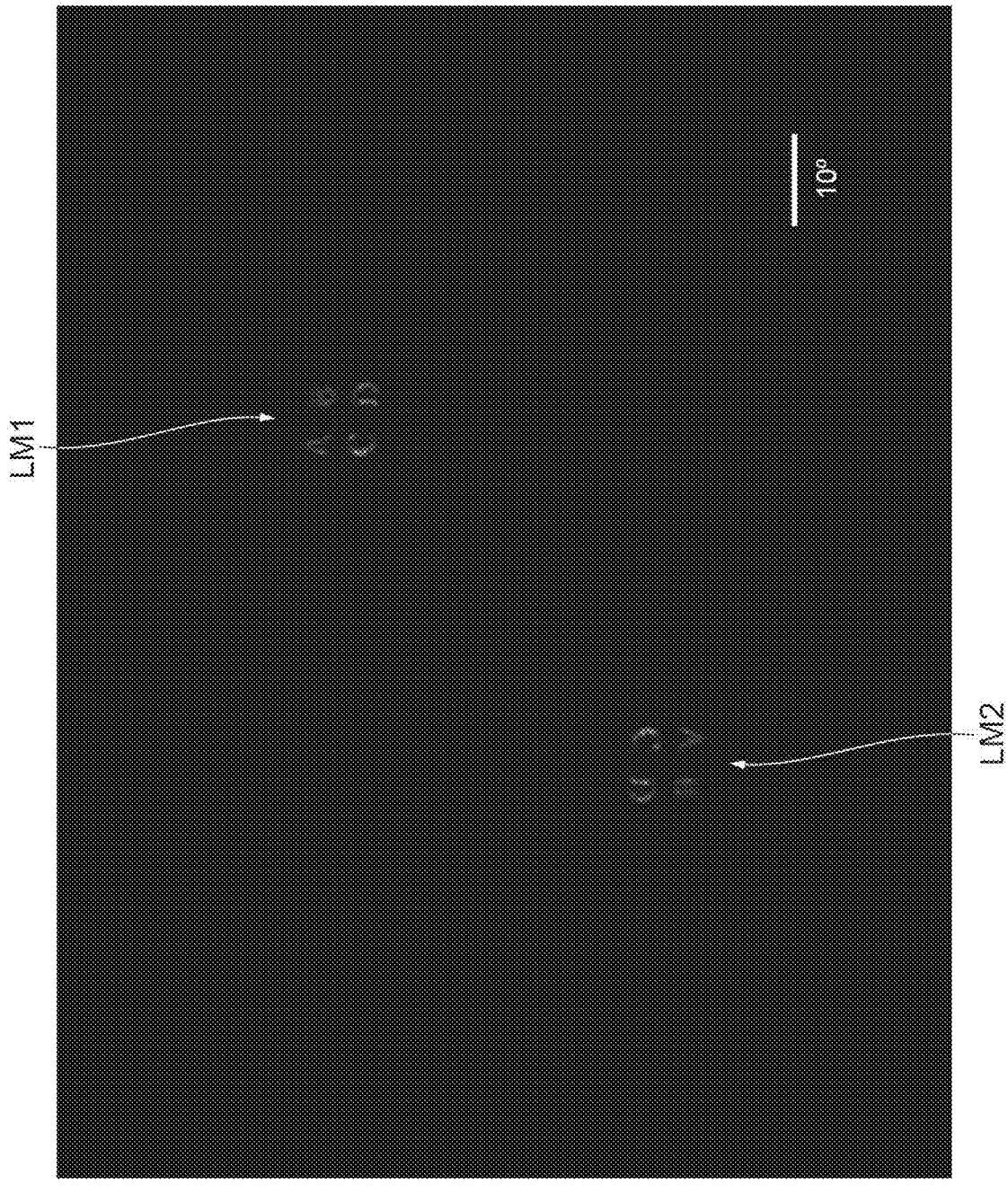
FIG. 35 illustrates a beam pattern (optical image) outputted from a semiconductor light-emitting element having the rotation angle distribution illustrated in FIG. 33.
Figure 36:
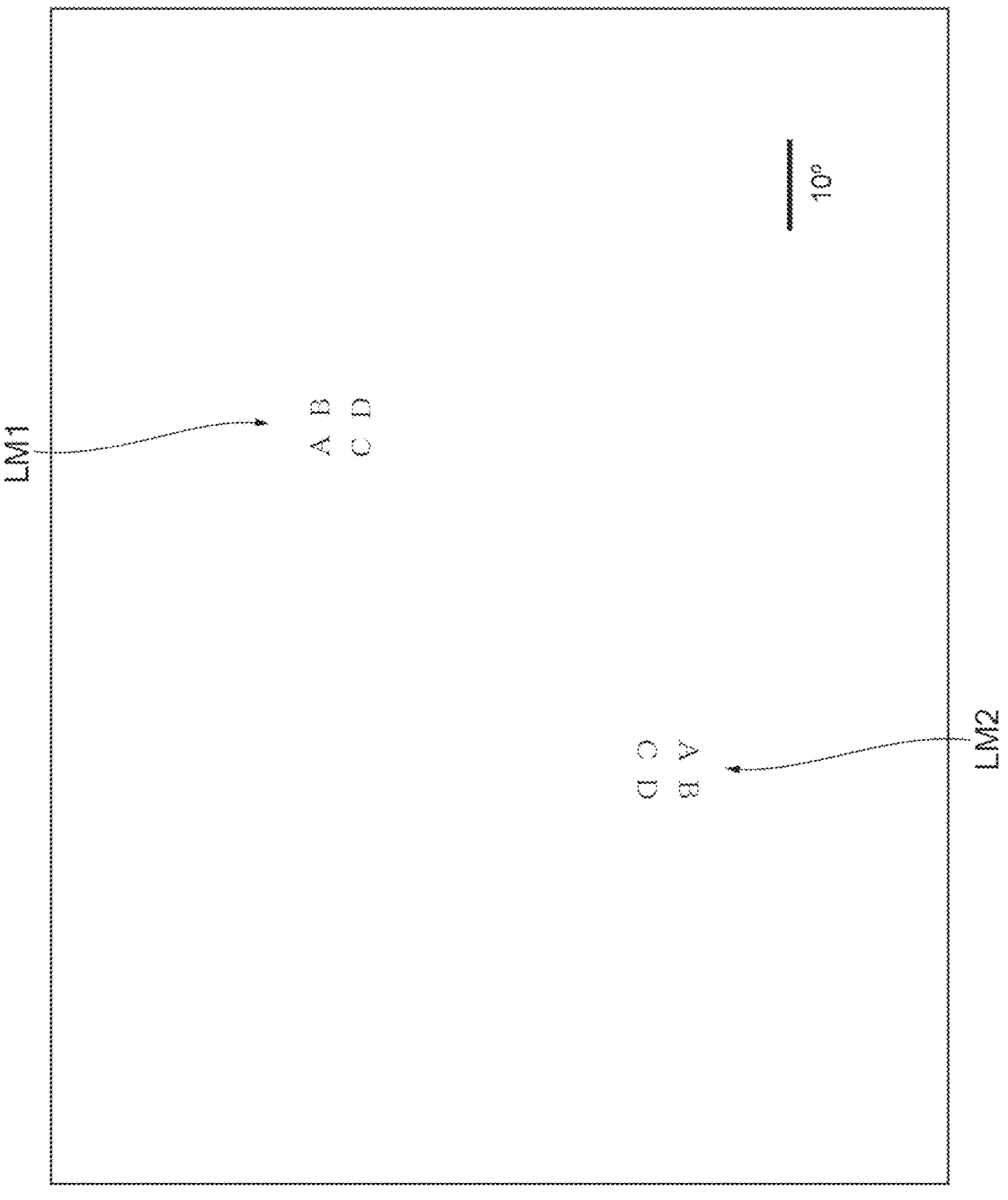
FIG. 36 is a schematic diagram of the beam pattern illustrated in FIG. 35.

FIG. 33 is a diagram illustrating an example of the rotation angle distribution $\varphi(x, y)$ of the phase modulation layer 12B. In addition, FIG. 34 is an enlarged view of a part S illustrated in FIG. 33. In FIGS. 33 and 34, the magnitude of the rotation angle is represented by color shading, and a darker region indicates a larger rotation angle (that is, a larger phase angle). Referring to FIG. 34, it can be seen that patterns in which phase values having different values are arranged in a checkered pattern are superimposed. FIG. 35 illustrates a beam pattern (optical image) outputted from the optical element having the rotation angle distribution $\varphi(x, y)$ illustrated in FIG. 33. FIG. 36 is a schematic diagram of the beam pattern illustrated in FIG. 21. The centers of FIGS. 35 and 36 correspond to the Z-axis. As is clear from FIGS. 35 and 36, the optical element outputs +1st-order light including a first optical image portion LM1 outputted in a first direction inclined with respect to the Z-axis and −1st-order light including a second optical image portion LM2 outputted in a second direction symmetric with the first direction with respect to the Z-axis and rotationally symmetric with the first optical image portion LM1 with respect to the Z-axis, but does not output the 0th-order light that travels on the Z-axis.

Figure 37A:
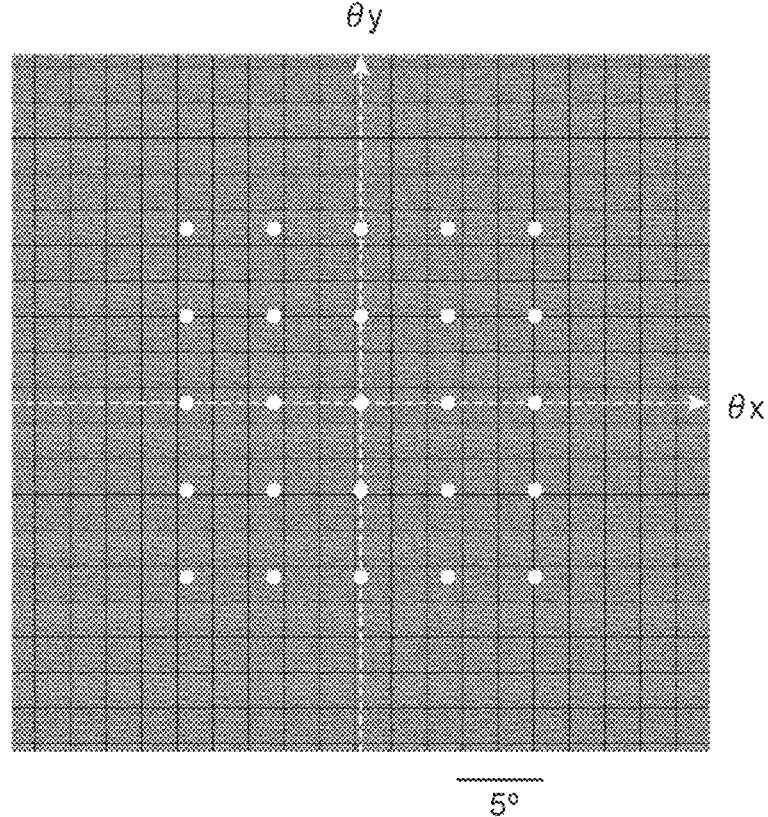
FIG. 37A is a schematic diagram of a beam pattern.
Figure 37B:
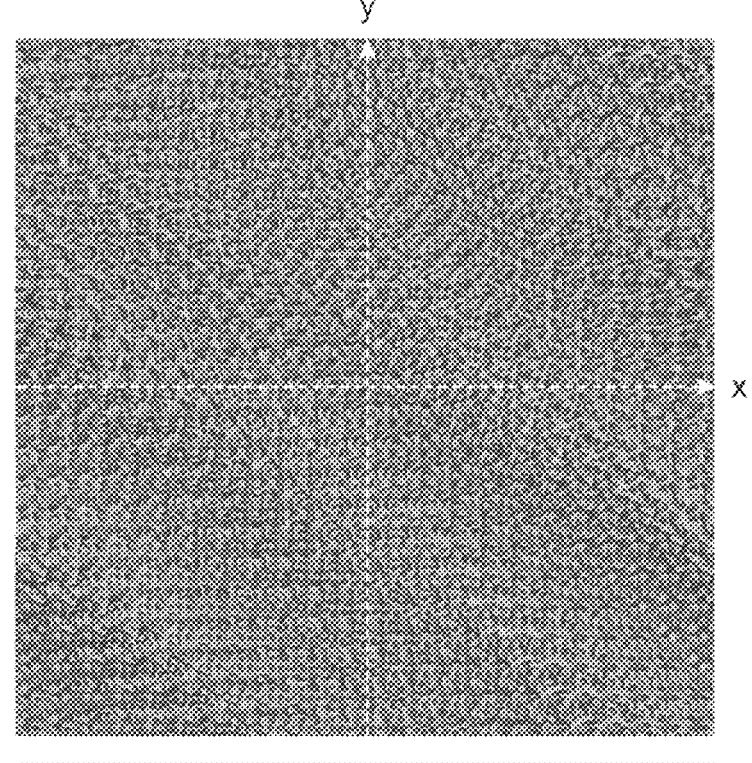
FIG. 37B is a diagram illustrating a phase distribution of the beam pattern.
Figure 38A:
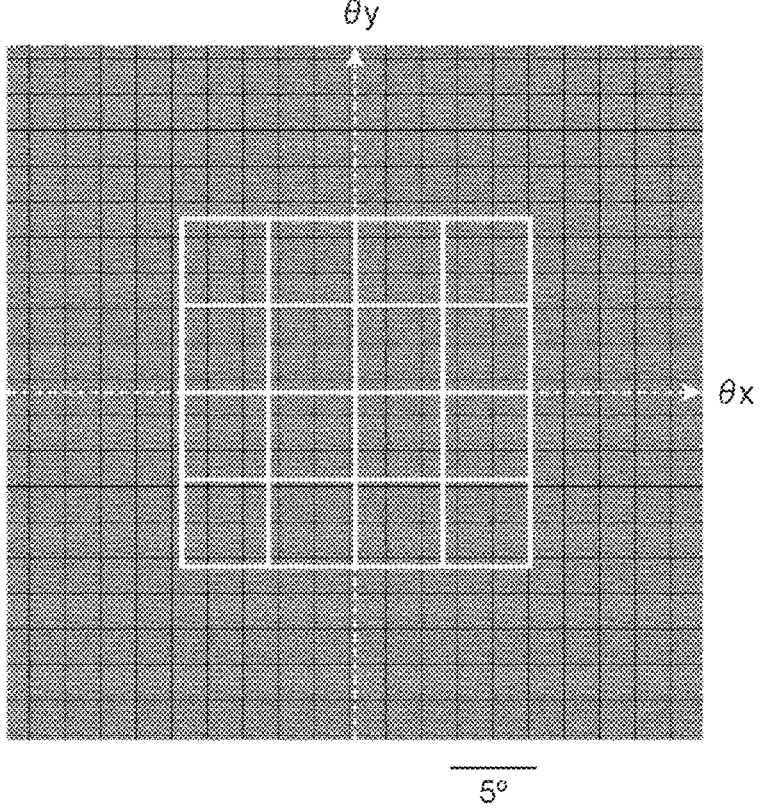
FIG. 38A is a schematic diagram of a beam pattern.
Figure 38B:
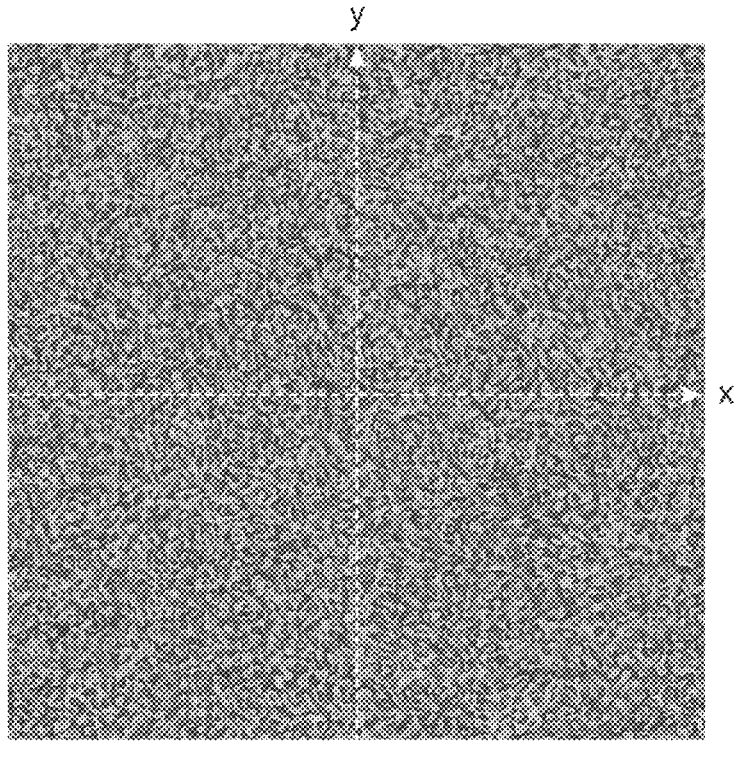
FIG. 38B is a diagram illustrating a phase distribution of the beam pattern.
Figure 39A:
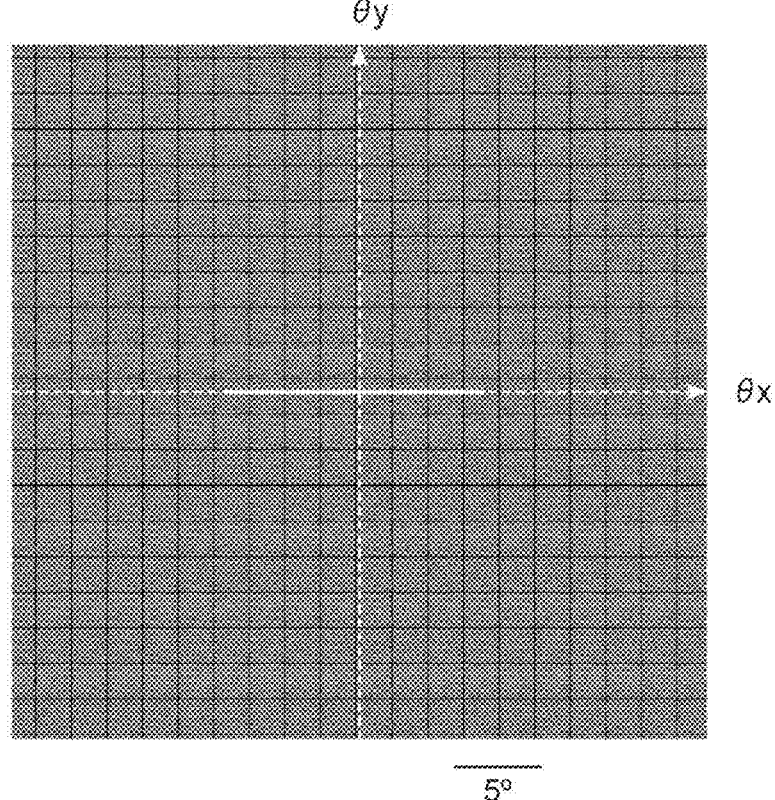
FIG. 39A is a schematic diagram of a beam pattern.
Figure 39B:
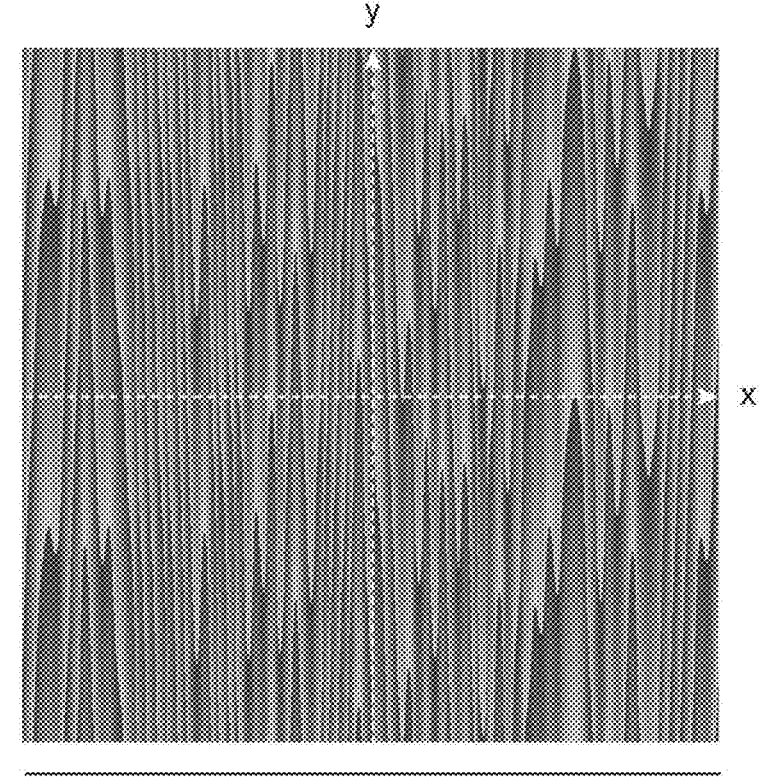
FIG. 39B is a diagram illustrating a phase distribution of the beam pattern.

In the ninth modification, it is also possible to output a pattern that includes the Z-axis and is symmetric with respect to the Z-axis. In this case, since there is no 0th-order light, intensity unevenness of the pattern does not occur even on the Z-axis. Design examples of such a beam pattern include 5×5 multiple points, a mesh, and a one-dimensional pattern. Schematic diagrams of these beam patterns are illustrated in FIGS. 37A, 38A, and 39A, and phase distributions of the beam patterns are illustrated in FIGS. 37B, 38B, and 39B. By outputting such a beam pattern in the visible range, it is possible to apply the beam pattern to, for example, display applications.

(Tenth Modification)

In this tenth modification, in the phase modulation layer 12C of the third embodiment, similarly to the ninth modification, the lattice spacing a of the virtual square lattice and the emission wavelength λ of the UC layer 11 satisfy the conditions for the M-point oscillation. Furthermore, when considering a reciprocal lattice space in the phase modulation layer 12C, the magnitude of at least one of the in-plane wave vectors in the four directions each including the wave number spread by the distribution of the distance $r(x, y)$ is smaller than $2\pi/\lambda$ (light line).

More specifically, in the tenth modification, the phase modulation layer 12C is devised as follows in the S-iPM laser that oscillates at the M point, so that a part of the +1st-order light and the −1st-order light is outputted while the 0th-order light is not outputted inside the light line. Specifically, as illustrated in FIG. 30, the magnitude of at least one of the in-plane wave vectors K6 to K9 is set to be smaller than $2\pi/\lambda$ by adding the diffraction vector V having a certain magnitude and a certain direction to the in-plane wave vectors K6 to K9. In other words, at least one of the in-plane wave vectors K6 to K9 after the diffraction vector V is added falls within the circular region (light line) LL having the radius of $2\pi/\lambda$. That is, by adding the diffraction vector V satisfying the above-described Formula (22), any one of the wave vectors K6 to K9 fits inside the light line LL, and a part of the +1st-order light and the −1st-order light is outputted.

Also in the tenth modification, the lattice spacing a of the virtual square lattice and the emission wavelength λ of the UC layer 11 satisfy the conditions for the M-point oscillation, and in the reciprocal lattice space of the phase modulation layer 12C, the plane wave forming the standing wave is phase-modulated by the distribution of the distances $r(x, y)$, and the magnitude of at least one of the in-plane wave vectors K6 to K9 in the four directions each including the wave number spread $\Delta k$ due to the angular spread of the optical image is smaller than $2\pi/\lambda$ (light line). Alternatively, by adding the diffraction vector V to a value obtained by removing the wave number spread $\Delta k$ from the in-plane wave vectors K6 to K9 in the four directions, the magnitude of at least one in-plane wave vector is smaller than a value $\{(2\pi/\lambda)-\Delta k\}$ obtained by subtracting the wave number spread $\Delta k$ from $2\pi/\lambda$. Therefore, the 0th-order light included in the output of the S-iPM laser can be removed from inside the light line, and only the signal light can be outputted.

The optical device and the light-emitting device according to the present disclosure are not limited to the above-described embodiments, and various other modifications are possible. For example, in the above description, the excitation light sources 20A and 20C are PCSELs, but the excitation light sources 20A and 20C may be S-iPMSELs.

Fourth Embodiment

In the first to third embodiments and the first to tenth modifications described above, the light-emitting devices 1A to 1H and 1J are disclosed in which the electrodes are arranged on the back surface side of the excitation light sources 20A to 20C, and the optical devices 10A to 10E and 10A1 having the UC layer (upconversion layer) are provided. However, in the manufacture of these light-emitting devices, in the case of forming the electrodes on the back surface side of the excitation light sources 20A to 20C serving as light source units, a high-precision electrode forming technique is required. That is, in the optical device in which the electrode is provided on the back surface side of the excitation light source, advanced flatness and parallelism are required on the surfaces of the two light confinement layers and the UC layer and the PC layer (or the phase modulation layer) sandwiched therebetween so as not to disturb the in-plane waveguide mode. In particular, in the embodiments and the modifications described above, since the light confinement layer is formed in a state where the opening is provided in the electrode on the back surface side of the excitation light source, it is important to ensure the flatness and parallelism described above. In the fourth embodiment, the device structure in which the optical device is provided on the flat back surface of the excitation light source by changing the electrode arrangement of the excitation light source in order to ease such severe manufacturing conditions.

On the other hand, the first light reflecting layer and the second light reflecting layer, both of which are formed of a dielectric multilayer film, are applied as the light confinement layers to the optical devices 10A to 10E and 10A1, which are to be resonator units. However, in the fourth embodiment, in place of at least the second light reflecting layer of the first light reflecting layer and the second light reflecting layer, a light confinement layer comprised of a single material having a substantially uniform refractive index distribution along the stacking direction of the optical device and having a refractive index lower than the refractive index of the UC layer is applied. In this case, the manufacturing step can be simplified as compared with the dielectric multilayer film, and in particular, the layer thickness can be suppressed to be thin in the light confinement layer having the single layer structure instead of the second light reflecting layer. The thinning of the light confinement layer can be expected to suppress higher-order mode formation along the stacking direction of the optical device. In addition, in a case where a light confinement layer having a single-layer structure is used instead of the second light reflecting layer, it is also possible to embed the PC layer (photonic crystal layer) adjacent to the UC layer in the inside or the surface portion of the light confinement layer (resonator structure that easily oscillates).

Furthermore, in the optical device according to the fourth embodiment, the PC layer (or the phase modulation layer) is arranged on the output side of the UC layer. With this configuration, even when the UC layer contains a scattering material, the effect on the formation of the resonance mode is small, an increase in the oscillation threshold can be prevented, and mixing of noise into the output wavefront (beam pattern) can be reduced.

Figure 40:
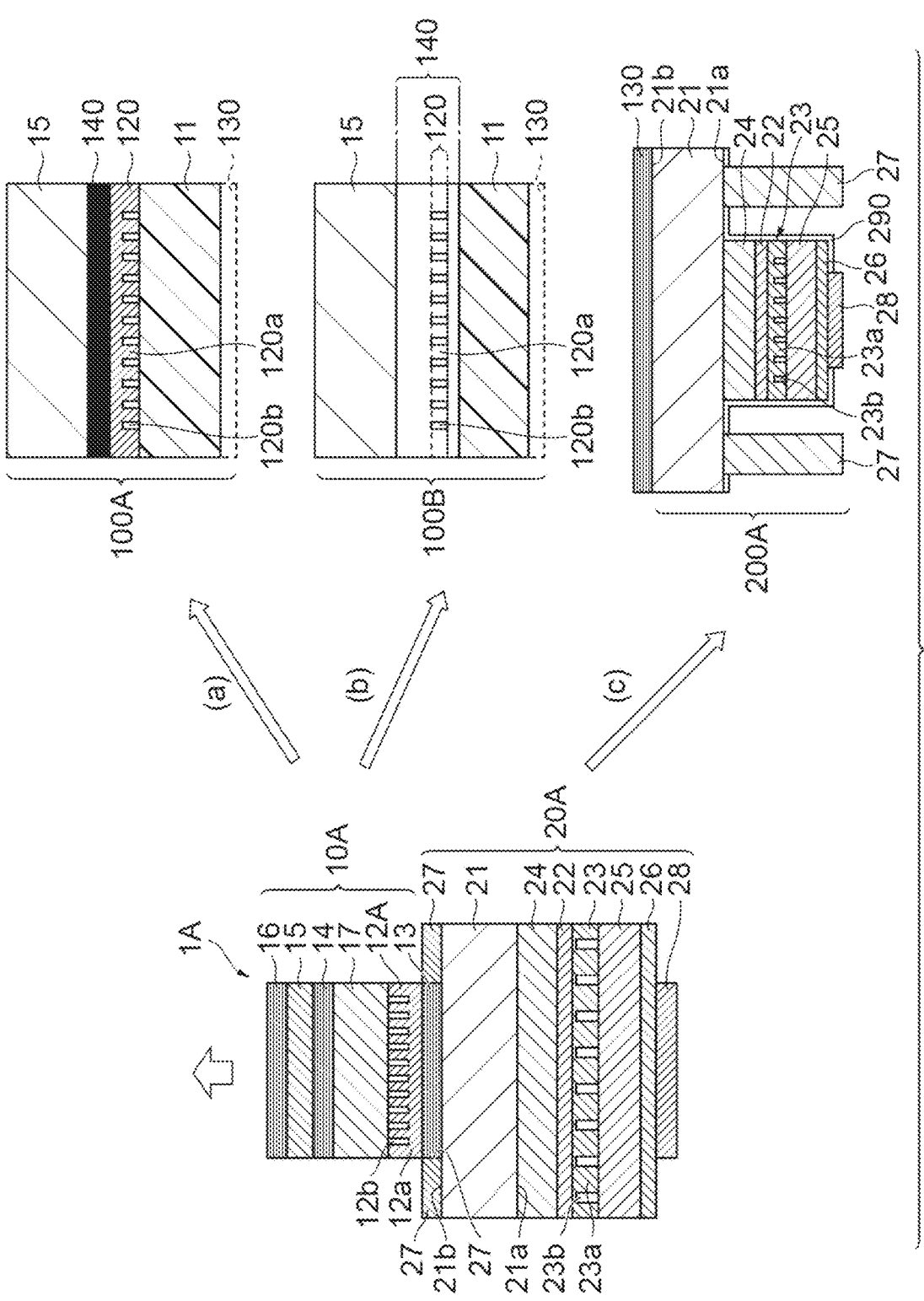
FIG. 40 is a schematic diagram for explaining a cross-sectional structure of a light-emitting device according to a fourth embodiment in comparison with the light-emitting device according to the first embodiment.

FIG. 40 is a schematic diagram for explaining the configuration of the light-emitting device according to the fourth embodiment in comparison with the light-emitting device according to the first embodiment as an example. Note that each of an optical device 100A indicated by an arrow (a) and an optical device 100B indicated by an arrow (b) can be replaced with the above-described optical devices 10A to 10E and 10A1. In addition, an excitation light source 200A indicated by an arrow (c) can also be replaced with the above-described excitation light sources 20A to 20C. A structure in which a plurality of excitation light sources 200A (each excitation light source 200A includes a photonic crystal surface emitting laser) is applied to one of the optical devices 100A to 100F is also applicable similarly to the above-described embodiments and modifications. Furthermore, also in the light-emitting device of the fourth embodiment, as in the above-described embodiments and modifications, any one of the dichroic mirror 16, the diffractive optical element 17, and the spatial light modulator 40 may be disposed on the opposite side of the UC layer 11 with respect to the second light confinement layer 140. Note that the dichroic mirror 16, the diffractive optical element 17, and the spatial light modulator 40 are not illustrated in all the drawings illustrating the structure of the light-emitting device according to the fourth embodiment.

In the example of FIG. 40, the optical device 100A indicated by the arrow (a) includes a substrate 15 (quartz plate having optical transparency), a second light confinement layer 140 provided on one surface of the substrate 15, a PC layer 120 (which may be a phase modulation layer) provided on the second light confinement layer 140, a UC layer 11 provided on the PC layer 120, and a first light confinement layer 130 provided on the UC layer 11. Similarly to the first to third embodiments and the first to tenth modifications described above, any one of the dichroic mirror 16, the diffractive optical element 17, and the spatial light modulator 40 may be disposed on the other surface of the substrate 15. The PC layer 120 includes a base layer 120a and a plurality of modified refractive index regions 120b having a refractive index different from the refractive index of the base layer 120a, and a single-layer structure having a substantially uniform refractive index distribution along the thickness direction is used for the second light confinement layer 140. In the optical device 100A, the first light confinement layer 130 may have a dielectric multilayer film or a single layer structure.

In the example of FIG. 40, the optical device 100B indicated by the arrow (b) includes a substrate 15 having optical transparency, a second light confinement layer 140 provided on one surface of the substrate 15, a PC layer 120 (which may be a phase modulation layer) provided inside or on a surface of the second light confinement layer 140, a UC layer 11 provided on the second light confinement layer 140 including the PC layer 120, and a first light confinement layer 130 provided on the UC layer 11. Similarly to the optical device 100A, any one of the dichroic mirror 16, the diffractive optical element 17, and the spatial light modulator 40 may be disposed on the other surface of the substrate 15. The PC layer 120 embedded in the second light confinement layer 140 includes a base layer 120a and a plurality of modified refractive index regions 120b having a refractive index different from the refractive index of the base layer 120a, and the second light confinement layer 140 is comprised of a single material having a substantially uniform refractive index distribution along the thickness direction (and has a single layer structure). In the optical device 100B, the first light confinement layer 130 may have a dielectric multilayer film or a single layer structure.

In the example of FIG. 40, the excitation light source 200A (including a semiconductor stack functioning as a photonic crystal surface emitting laser) indicated by the arrow (c) includes a semiconductor substrate 21, a first cladding layer 24 (layer functioning as a light confinement layer) provided on a main surface 21a of the semiconductor substrate 21, an active layer 22 provided on the first cladding layer 24, a PC layer 23 provided on the active layer 22, a second cladding layer 25 (layer functioning as a light confinement layer) provided on the PC layer 23, a contact layer 26 provided on the second cladding layer 25, a second electrode 28 (p-electrode) provided on the semiconductor stack including the active layer 22 and the PC layer 23, and a first electrode 27 (n-electrode) provided on the main surface 21a of the semiconductor substrate 21. Note that, in the excitation light source 200A illustrated in FIG. 40, the first light confinement layer 130 constituting a part of the optical device 100A or the optical device 100B is provided on the back surface 21b of the semiconductor substrate 21. This is because there is a manufacturing mode in which the first light confinement layer 130 is provided on the back surface 21b of the semiconductor substrate 21 at the final stage of a step of manufacturing the excitation light source 200A that is described later. In addition, in the excitation light source 200A illustrated in FIG. 40, the first light confinement layer 130 provided on the back surface 21b of the semiconductor substrate 21 is used as a dielectric multilayer film, but a single-layer structure having a substantially uniform refractive index distribution along the thickness direction may be used similarly to the above-described second light confinement layer 140.

In particular, in the excitation light source 200A according to the fourth embodiment, both the first electrode 27 and the second electrode 28 are disposed on the main surface 21a side of the semiconductor substrate 21. Therefore, the area of the PC layer 23 as viewed from the stacking direction of the semiconductor stack (photonic crystal surface emitting laser) is smaller than the area of the UC layer 11 as viewed from the stacking direction of the above-described optical devices 100A and 100B, more specifically, the area of the main surface 21a of the semiconductor substrate 21 (the first electrode 27 is provided on a region of the main surface 21a of the semiconductor substrate 21 that is exposed without being covered with the semiconductor stack). With such an electrode arrangement, since both the first electrode and the second electrode are arranged on the main surface 21a side of the semiconductor substrate 21, the work of mounting the light-emitting device of the present disclosure on the submount is facilitated, and the effective region can be enlarged.

Figure 41:
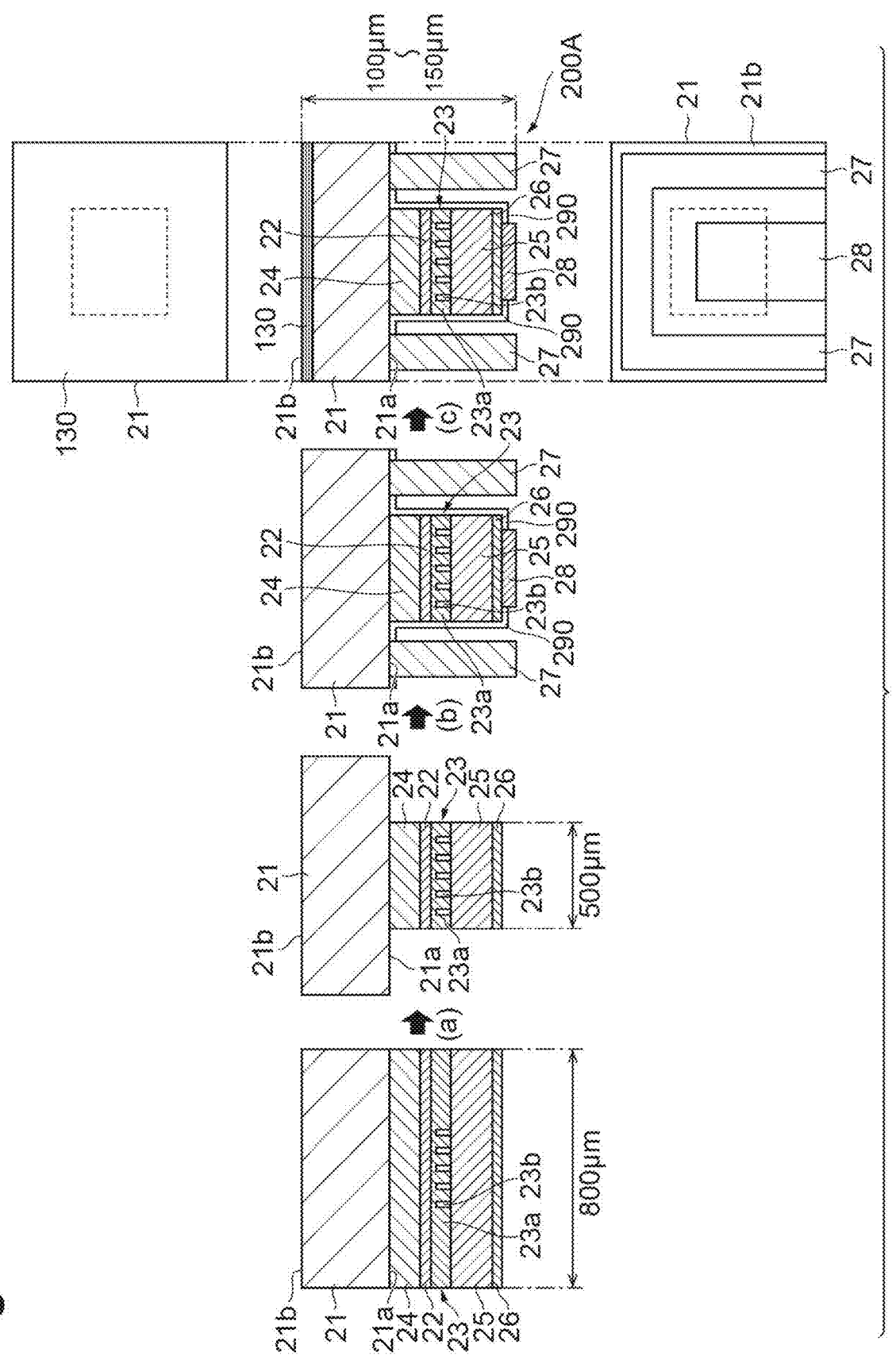
FIG. 41 is a diagram for explaining a step of manufacturing an excitation light source (light source unit) in a first manufacturing method (unit assembly type) of manufacturing the light-emitting device according to the fourth embodiment.
Figure 42A:
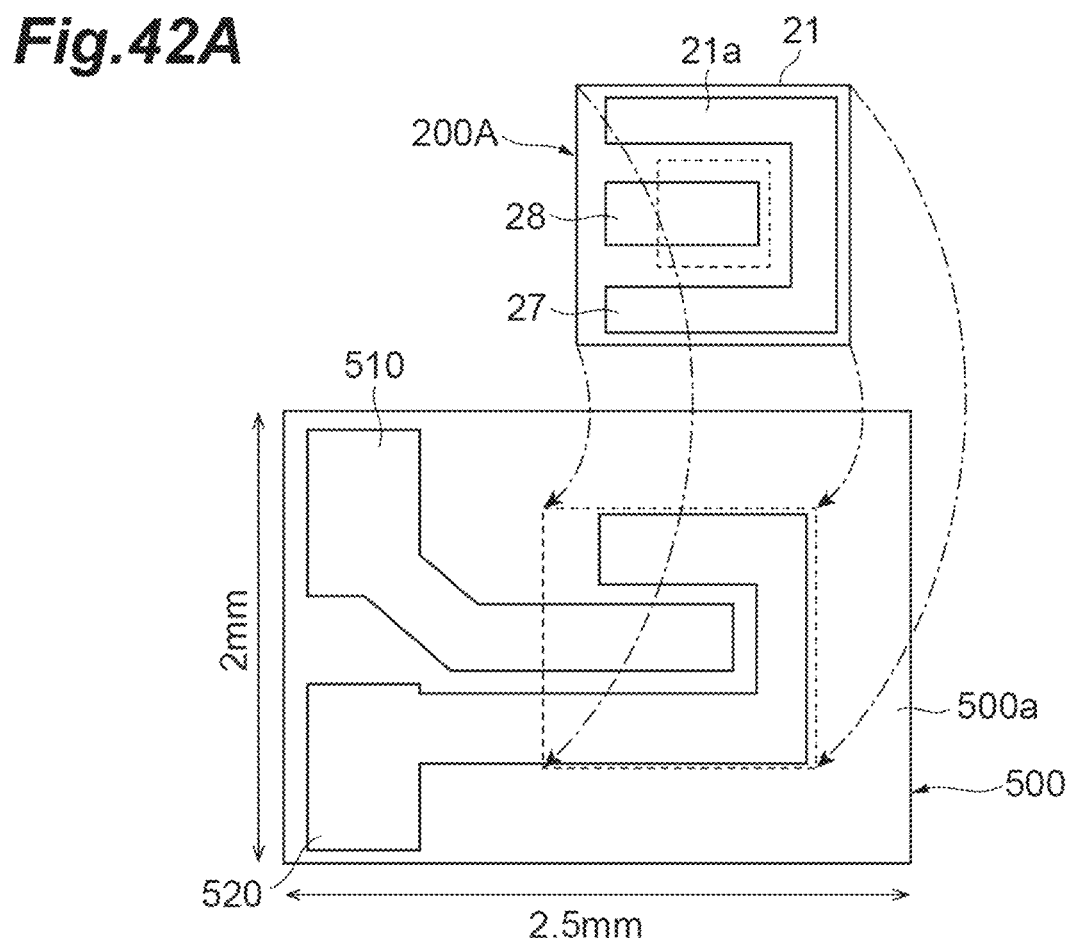
FIGS. 42A and 42B are diagrams for explaining a step of mounting the excitation light source on a submount in the first manufacturing method.
Figure 42B:
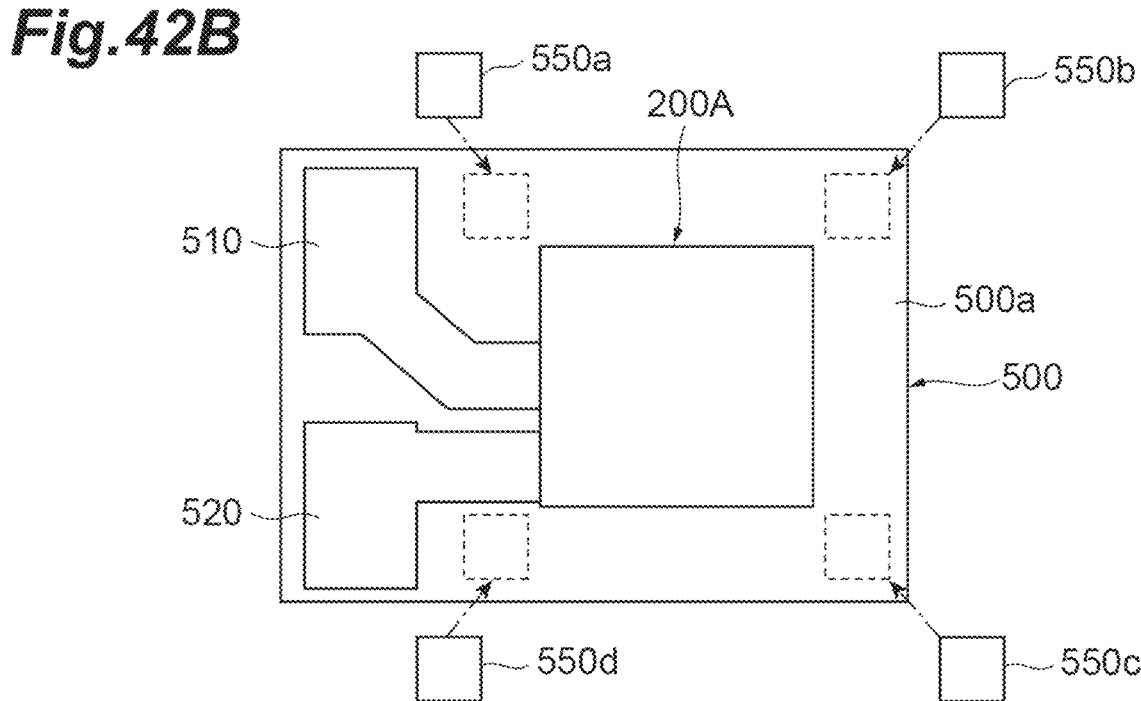
Figure 44A:
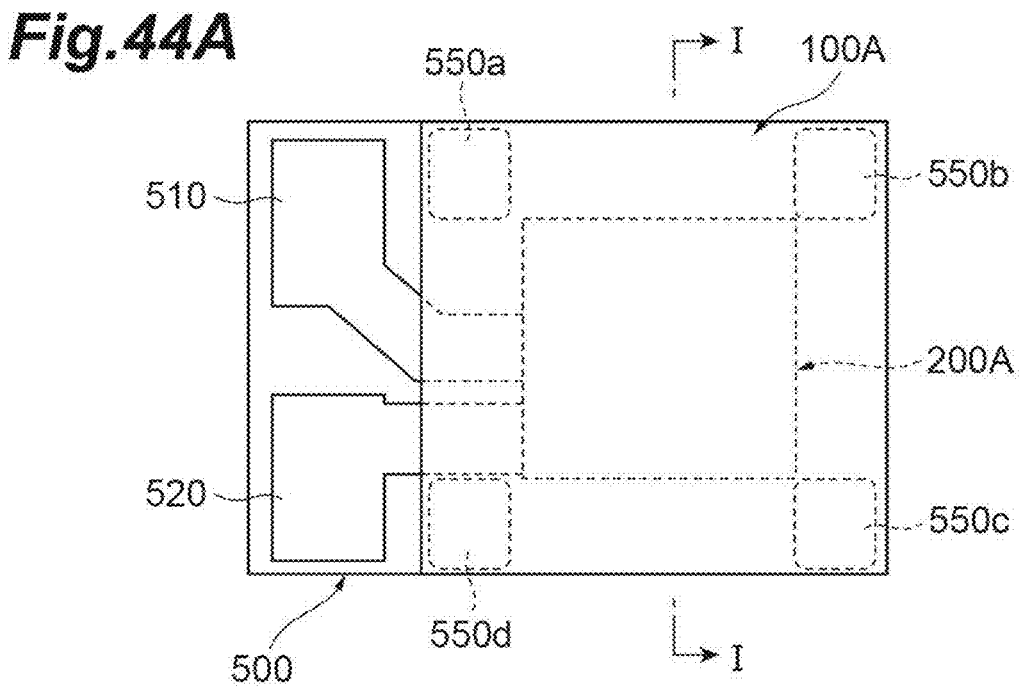
FIG. 44A is a plan view of the light-emitting device manufactured by the first manufacturing method (unit assembly type)
Figure 44B:
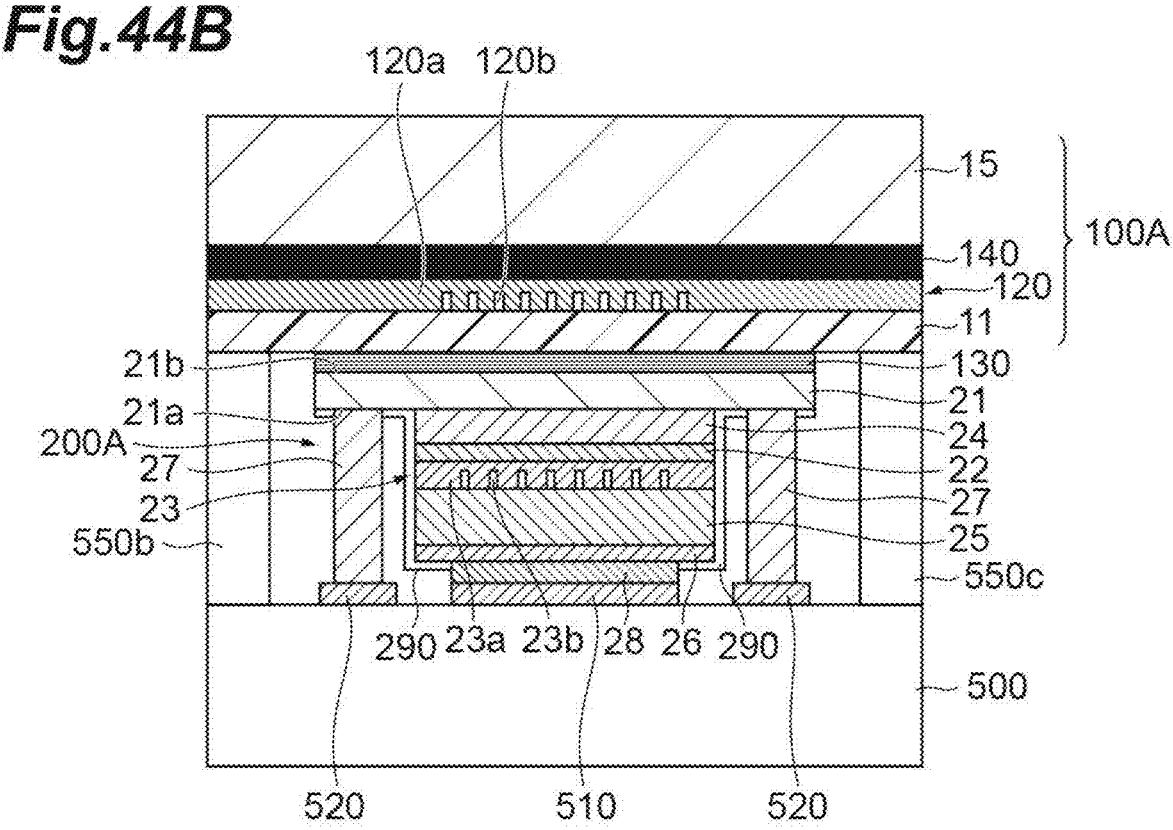
FIG. 44B is a cross-sectional view of the light-emitting device taken along arrow line I-I illustrated in FIG. 44A.

The light-emitting device according to the fourth embodiment having the above-described structure can be manufactured by a unit assembly type (first manufacturing method) or an upconversion material injection type (second manufacturing method). Therefore, first, the manufacturing method of the unit assembly type will be described in detail with reference to FIGS. 41, 42A, 42B, 43A to 43C, 44A, and 44B. Note that a description will be given below. FIG. 41 is a diagram for explaining a step of manufacturing the excitation light source 200A as the light-emitting unit in the unit assembly type manufacturing step (first manufacturing method) of manufacturing the light-emitting device according to the fourth embodiment. FIGS. 42A and 42B are diagrams for explaining a step of mounting the excitation light source on the submount in the first manufacturing method. FIGS. 43A and 43B are diagrams for explaining a step of manufacturing an optical device (resonator unit) in the first manufacturing method, and FIG. 43C is a diagram for explaining a step of mounting the optical device on the submount on which the excitation light source is already mounted in the first manufacturing method. FIGS. 44A and 44B are a plan view and a cross-sectional view illustrating the light-emitting device after the manufacturing.

As illustrated in FIG. 41, the step of manufacturing the excitation light source 200A is performed in the order of arrows (a), (b), and (c). First, the first cladding layer 24, the active layer 22, the PC layer 23 including the base layer 23a and the plurality of modified refractive index regions 23b, the second cladding layer 25, and the contact layer 26 are sequentially provided on the main surface 21a of the semiconductor substrate 21 having a width of 800 μm or more. The diffraction grating region of the PC layer 23 may have a width of about 400 μm. The production of the semiconductor stack provided on the main surface 21a of the semiconductor substrate 21 as described above is similar to the production of the excitation light sources 20A to 20C of the first to third embodiments and the first to tenth modifications described above.

Subsequently, a part of the semiconductor stack provided on the main surface 21a of the semiconductor substrate 21 is etched to expose a part of the main surface 21a of the semiconductor substrate 21, thereby obtaining a cross-sectional structure indicated by the arrow (a) in FIG. 41. At this time, the width of the remaining semiconductor stack is about 500 μm, and the exposed region becomes an installation region of the first electrode 27. When the installation region of the first electrode 27 is secured by etching, the semiconductor stack and the exposed region remaining on the main surface 21a of the semiconductor substrate 21 are coated with an insulating layer 290 such as SiN. Subsequently, after a part of the insulating layer 290 located in the installation region of the first electrode 27 and an installation region of the second electrode 28 is removed, Au plating is performed, and the first electrode 27 and the second electrode 28 are patterned. After the Au plating, if necessary, the main surface 21a may be planarized by chemical mechanical planarization (CMP). Therefore, the first electrode 27 provided on the main surface 21a and the second electrode 28 provided on the contact layer 26 side of the semiconductor stack are insulated via the insulating layer 290. Through this step, a cross-sectional structure indicated by the arrow (b) in FIG. 41 is obtained.

As described above, since the first electrode 27 and the second electrode 28 are disposed on the main surface 21a side of the semiconductor substrate 21, the SiN single layer or the dielectric multilayer film is directly formed as the first light confinement layer 130 on the back surface 21b of the semiconductor substrate 21, whereby a cross-sectional structure indicated by the arrow (c) in FIG. 41 is obtained. A thickness ratio of each part of the excitation light source 200A (excitation light source 200A illustrated) indicated by the arrow (c) is different from a thickness ratio of each part in the actually manufactured device, but as a whole, the thickness of the excitation light source 200A is about 100 μm to 150 μm at most. On the main surface 21a of the semiconductor substrate 21, the first electrode 27 has a shape surrounding the second electrode 28.

When the excitation light source 200A is obtained through the manufacturing step illustrated in FIG. 41, as illustrated in FIG. 42A, the excitation light source 200A is epitaxially mounted on a main surface 500a of a submount 500 having a size of 2 mm×2.5 mm. On the main surface 500a of the prepared submount 500, an n-electrode pad 520 to be electrically connected to the first electrode 27 and a p-electrode pad 510 to be electrically connected to the second electrode 28 are printed in advance. When the excitation light source 200A is fixed to the submount 500, spacers 550a to 550d comprised of an insulating material are also fixed to the main surface 500a of the submount 500 so as to surround the excitation light source 200A.

On the other hand, in the case of manufacturing the optical device 100A, first, as illustrated in FIG. 43A, a substrate 15 having optical transparency is prepared. For the prepared substrate 15, a sufficiently large quartz plate is used because only a flat central portion of a stacked portion is used. First, a second light confinement layer 140 having a single-layer structure comprised of SiN, TiO$_2$, or the like is provided on one surface of the substrate 15. Furthermore, a PC layer 120 including a base layer and a plurality of modified refractive index regions is provided on the second light confinement layer 140. After an ultraviolet curable resin (UC layer 11) containing an upconversion material as a main raw material is applied onto the PC layer 120 by spin coating, the UC layer 11 is UV-cured. Note that flatness and parallelism are very important in manufacturing the UC layer 11. In particular, when the ultraviolet curable resin (containing the upconversion material as the main raw material) is applied by the spin coating, flatness at the end portion cannot be obtained. Therefore, as illustrated in FIG.

43B, since the central portion (region where the stacked portion is flat) on the substrate 15 is used, the optical device 100A (the first light confinement layer 130 is formed on the excitation light source 200A side) of about 2 mm×2 mm is obtained by cutting the stack including the substrate 15 with a width of 2 mm.

As illustrated in FIG. 43C, the optical device 100A obtained as described above is mounted on the submount 500 via the spacers 550a to 550d in a state where the UC layer 11 is in direct contact with the first light confinement layer 130 on the excitation light source 200A side epitaxially mounted on the submount 500.

Note that FIG. 44A is a plan view of the light-emitting device manufactured by the first manufacturing method (unit assembly type) in which the units (excitation light source 200A and optical device 100A) constituting the light-emitting device according to the fourth embodiment are individually manufactured and then assembled as described above, and FIG. 44B is a cross-sectional view of the light-emitting device taken along arrow line I-I illustrated in FIG. 44A. FIG. 44B does not illustrate components such as the dichroic mirror.

Figure 45A:
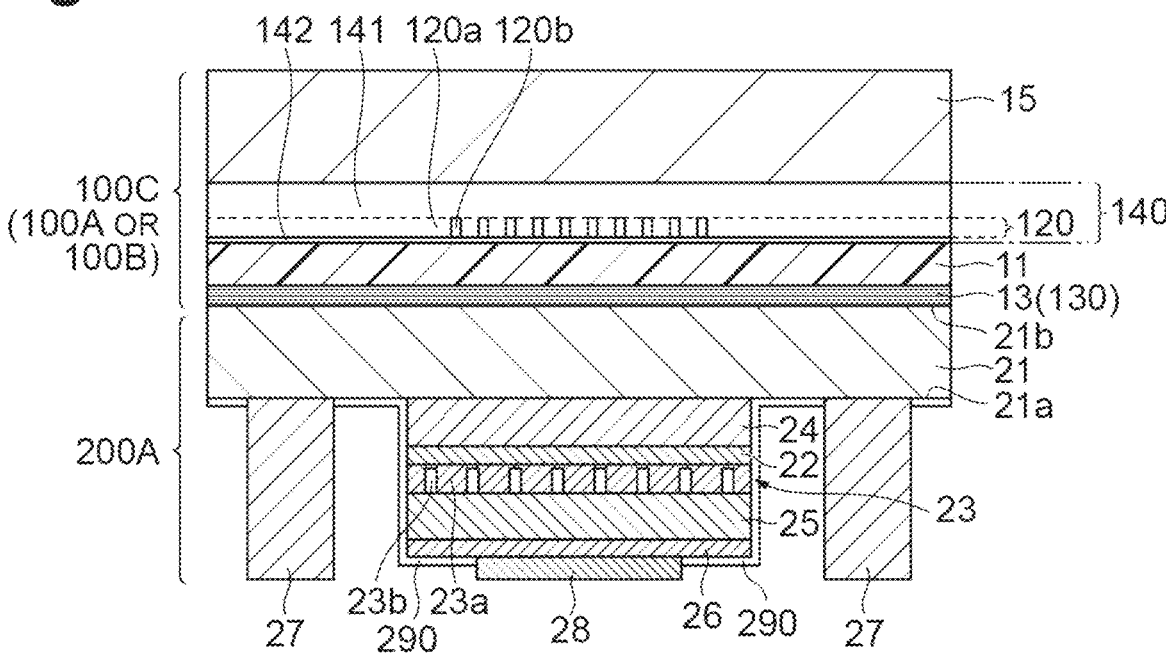
FIG. 45A is a cross-sectional view of a light-emitting device manufactured by the first manufacturing method and having a light confinement layer of a first structure.

FIG. 45A is a cross-sectional view of a light-emitting device manufactured by the above-described unit assembly type manufacturing method (first manufacturing method) and having a light confinement layer of a first structure. The light-emitting device illustrated in FIG. 45A according to the fourth embodiment includes an excitation light source 200A and an optical device 100C abutting on the excitation light source 200A via a first light confinement layer 130.

In the example illustrated in FIG. 45A, the excitation light source 200A can be replaced with the excitation light sources 20A to 20C of the above-described first to third embodiments and first to tenth modifications, and the basic configuration has the cross-sectional structure indicated by the arrow (c) in FIG. 40. That is, the excitation light source 200A includes a semiconductor substrate 21 comprised of GaAs, a first cladding layer 24 provided on the main surface 21a of the semiconductor substrate 21, an active layer 22 provided on the first cladding layer 24, a PC layer 23 (which may be a phase modulation layer) provided on the active layer 22, a second cladding layer 25 provided on the PC layer 23, a contact layer 26 provided on the second cladding layer 25, a second electrode 28 provided on the contact layer 26, a first electrode 27 provided in a region included in the main surface 21a of the semiconductor substrate 21 and exposed without being covered with a semiconductor stack including the above-described active layer 22 and PC layer 23, and an insulating layer 290 comprised of SiN or the like, which covers the main surface 21a and the surface of the semiconductor stack except the first electrode 27 and the second electrode 28. The PC layer 23 includes a base layer 23a comprised of GaAs and a plurality of modified refractive index regions 23b defined by holes provided in the base layer 23a.

On the other hand, the optical device 100C is mounted on the above-described excitation light source 200A (on the back surface 21b of the semiconductor substrate 21) via the first light confinement layer 130 (which may have a single-layer structure comprised of SiN, TiO$_2$, or the like) comprised of a dielectric multilayer film. The optical device 100C includes a substrate 15 having optical transparency, a second light confinement layer 140 having the first structure provided on one surface of the substrate 15, a PC layer 120 (which may be a phase modulation layer) embedded in the second light confinement layer 140 or in a surface region of the second light confinement layer 140, a UC layer 11 sandwiched between the PC layer 120 and the first light confinement layer 130, and the first light confinement layer 130.

In this optical device 100C, the second light confinement layer 140 has a base 141 and a cover layer 142 each having a single-layer structure comprised of SiN or TiO$_2$. The PC layer 120 is located between the base 141 and the cover layer 142, and includes a base layer 120a and a plurality of modified refractive index regions 120b. The base layer 120a also has a single-layer structure comprised of SiN or TiO$_2$. The plurality of modified refractive index regions of the PC layer 120 are voids. The cover layer 142 also has a single-layer structure comprised of SiN or TiO$_2$. Here, when the base 141 and the base layer 120a of the PC layer 120 are comprised of different materials (for example, when the base 141 is comprised of SiN and the base layer 12a is comprised of TiO$_2$), the configuration of the optical device 100C substantially matches the configuration of the optical device 100A indicated by the arrow (a) in FIG. 40. On the other hand, when the base 141, the base layer 120a of the PC layer 120, and the cover layer 142 are comprised of the same material (for example, when each is comprised of SiN), the configuration of the optical device 100C substantially matches the configuration of the optical device 100B indicated by the arrow (b) in FIG. 40. That is, a structure in which the PC layer 120 is embedded inside the second light confinement layer 140 having a single layer structure can be fabricated.

According to the light-emitting device (the fourth embodiment in which the second light confinement layer 140 has the first structure) obtained by the above-described unit assembly type manufacturing method (first manufacturing method), unnecessary heat is not applied to the UC layer 11 provided on the substrate 15. In addition, the plurality of modified refractive index regions 120b (voids) provided in the PC layer 120 are not filled with the upconversion material. Furthermore, it is also possible to measure the initial optical characteristics of only the photonic crystal surface emitting laser before mounting the optical device 100C on the excitation light source 200A.

Figure 45B:
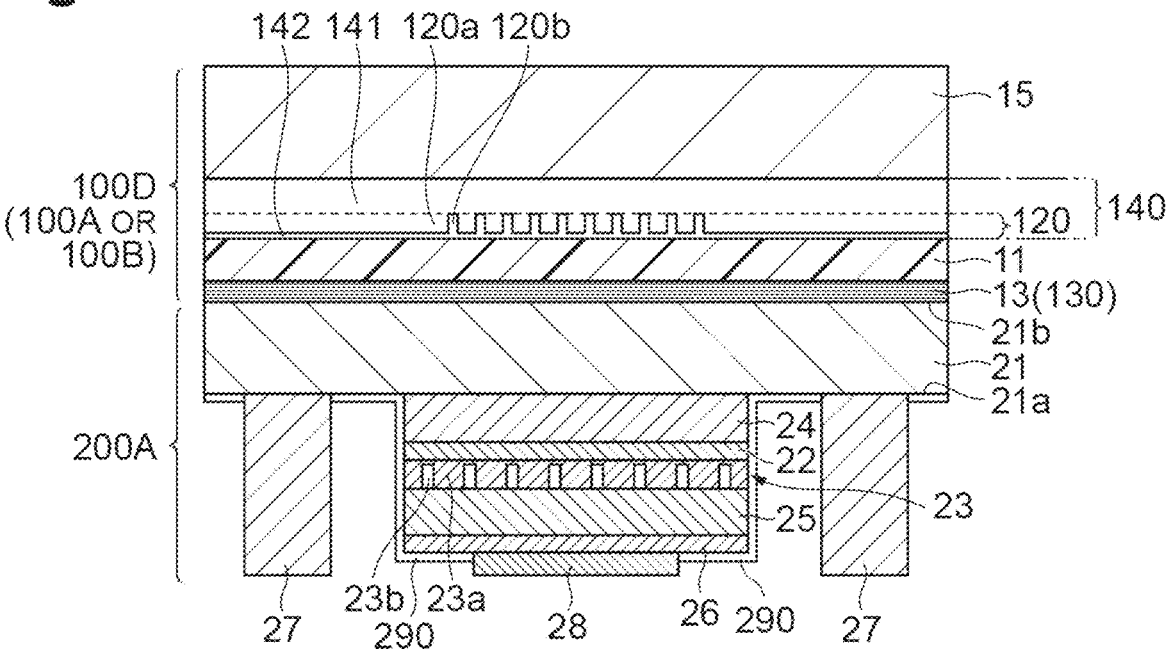
FIG. 45B is a cross-sectional view of a light-emitting device manufactured by the first manufacturing method and having a light confinement layer of a second structure.

FIG. 45B is a cross-sectional view of a light-emitting device manufactured by the above-described unit assembly type manufacturing method (first manufacturing method) and having a light confinement layer of a second structure. The light-emitting device illustrated in FIG. 45B according to the fourth embodiment includes an excitation light source 200A and an optical device 100D abutting on the excitation light source 200A via a first light confinement layer 130. In addition, the light-emitting device illustrated in FIG. 45B has the same structure as that of the light-emitting device illustrated in FIG. 45A except that the optical device 100D has a PC layer 120 of the second structure.

On the other hand, the optical device 100D is mounted on the above-described excitation light source 200A (on the back surface 21b of the semiconductor substrate 21) via the first light confinement layer 130 (which may have a single-layer structure comprised of SiN, TiO$_2$, or the like) comprised of a dielectric multilayer film. The optical device 100D includes a substrate 15 having optical transparency, a second light confinement layer 140 having the second structure provided on one surface of the substrate 15, the PC layer 120 (which may be a phase modulation layer) embedded in a surface region of the second light confinement layer 140, a UC layer 11 sandwiched between the PC layer 120 and the first light confinement layer 130, and the first light confinement layer 130.

In the optical device 100D, the second light confinement layer 140 includes a base 141 having a single-layer structure comprised of SiN and a cover layer 142 having a single-layer structure comprised of TiO2. The PC layer 120 is located between the base 141 and the cover layer 142, and includes a base layer 120a and a plurality of modified refractive index regions 120b. The base layer 120a also has a single-layer structure comprised of SiN and substantially constitutes a part of the second light confinement layer 140. The plurality of modified refractive index regions 120b of the PC layer 120 are defined by a plurality of recesses provided in the base layer 120a constituting a part of the second light confinement layer 140, and the plurality of recesses are filled with the same TiO$_2$ material as the material of the cover layer 142. Here, when the base 141 and the base layer 120a of the PC layer 120 are comprised of different materials (for example, when the base 141 is comprised of SiN and the base layer 12a is comprised of TiO$_2$), the configuration of the optical device 100D substantially matches the configuration of the optical device 100A indicated by the arrow (a) in FIG. 40. In this case, the base layer 120a and the plurality of modified refractive index regions 120b are comprised of the same material, but the refractive index of the base layer 120a is different from the refractive index of the plurality of modified refractive index regions 120b. On the other hand, when the base 141 and the base layer 120a of the PC layer 120 are comprised of the same material (for example, when both are comprised of SiN), the configuration of optical device 100D substantially matches the configuration of the optical device 100B indicated by arrow (b) in FIG. 40. That is, a structure in which the PC layer 120 is embedded inside the surface region of the second light confinement layer 140 having a single layer structure can be fabricated.

Also by the light-emitting device illustrated in FIG. 45B (the fourth embodiment in which the second light confinement layer 140 has the second structure), the same effects as those of the light-emitting device illustrated in FIG. 45A can be obtained.

Figure 46A:
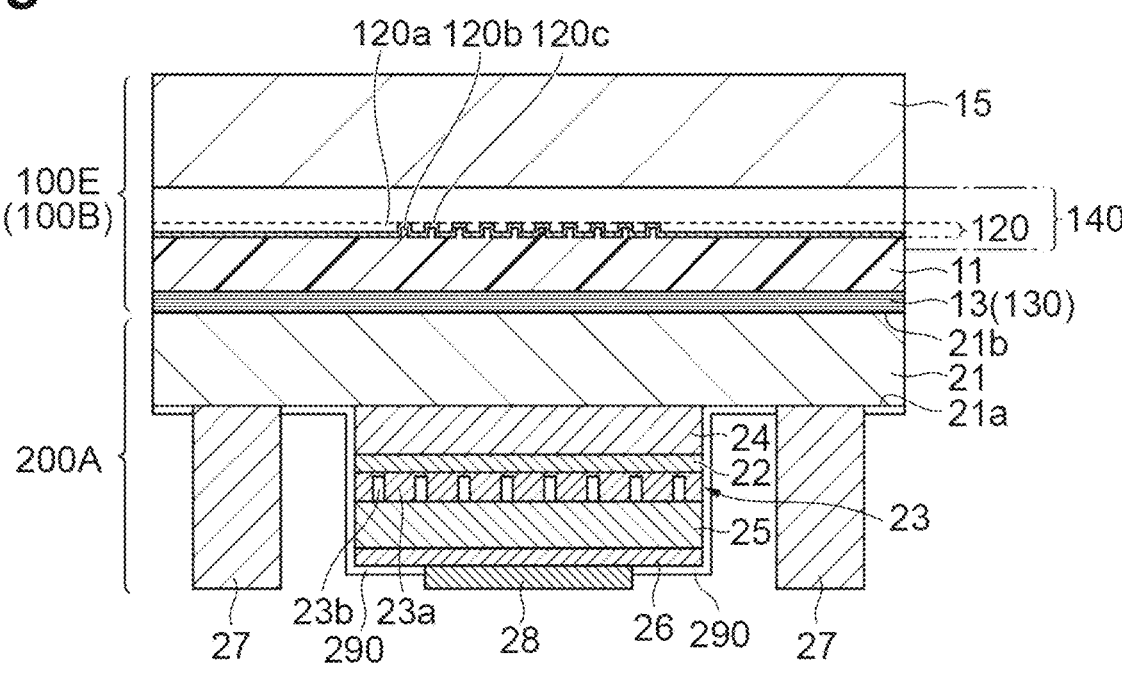
FIG. 46A is a cross-sectional view of a light-emitting device manufactured by the first manufacturing method and having a light confinement layer of a third structure.

FIG. 46A is a cross-sectional view of a light-emitting device manufactured by the above-described unit assembly type manufacturing method (first manufacturing method) and having a light confinement layer of a third structure. The light-emitting device illustrated in FIG. 46A according to the fourth embodiment includes an excitation light source 200A and an optical device 100E abutting on the excitation light source 200A via a first light confinement layer 130. In addition, the light-emitting device illustrated in FIG. 46A has the same structure as that of the light-emitting device illustrated in FIG. 45A except that the optical device 100E has a PC layer 120 having the third structure.

That is, the optical device 100E is mounted on the excitation light source 200A (on the back surface 21b of the semiconductor substrate 21) via the first light confinement layer 130 (which may have a single-layer structure comprised of SiN, TiO$_2$, or the like.) comprised of a dielectric multilayer film. The optical device 100E includes a substrate 15 having optical transparency, a second light confinement layer 140 having the third structure provided on one surface of the substrate 15, the PC layer 120 (which may be a phase modulation layer) embedded in a surface region of the second light confinement layer 140, a UC layer 11 sandwiched between the PC layer 120 and the first light confinement layer 130, and the first light confinement layer 130.

In the optical device 100E, the second light confinement layer 140 has a single-layer structure comprised of SiN, and a plurality of recesses for defining a plurality of modified refractive index regions 120b of the PC layer 120 are formed on the surface thereof. Therefore, the surface region of the second light confinement layer 140 in which the plurality of recesses are formed becomes the base layer 120a of the PC layer 120. In the PC layer 120 of the third structure, the surface of the second light confinement layer 140 and inner walls (including the bottoms) of the plurality of recesses are covered with a cover layer 120c comprised of TiO$_2$. The optical device 100E having the PC layer 120 of the third structure substantially matches the configuration of the optical device 100B indicated by the arrow (b) in FIG. 40. That is, a structure in which the PC layer 120 is embedded inside the surface region of the second light confinement layer 140 having a single layer structure can be fabricated.

Also by the light-emitting device illustrated in FIG. 46A (the fourth embodiment in which the second light confinement layer 140 has the second structure), the same effects as those of the light-emitting device illustrated in FIG. 45A can be obtained.

Figure 46B:
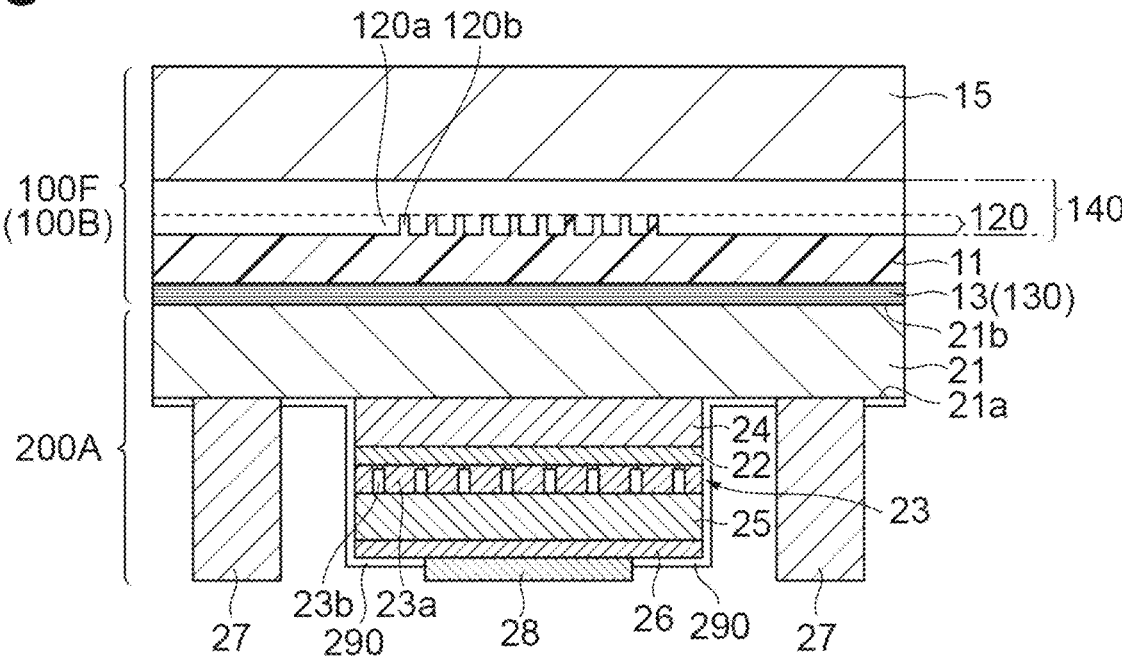
FIG. 46B is a cross-sectional view of a light-emitting device manufactured by the first manufacturing method and having a light confinement layer of a fourth structure.

FIG. 46B is a cross-sectional view of a light-emitting device manufactured by the above-described unit assembly type manufacturing method (first manufacturing method) and having a light confinement layer of a fourth structure. The light-emitting device illustrated in FIG. 46B according to the fourth embodiment includes an excitation light source 200A and an optical device 100F abutting on the excitation light source 200A via a first light confinement layer 130. In addition, the light-emitting device illustrated in FIG. 46B has the same structure as that of the light-emitting device illustrated in FIG. 45A except that the optical device 100F has a PC layer 120 having the fourth structure.

That is, the optical device 100F is mounted on the excitation light source 200A (on the back surface 21b of the semiconductor substrate 21) via the first light confinement layer 130 (which may have a single-layer structure comprised of SiN, TiO$_2$, or the like.) comprised of a dielectric multilayer film. The optical device 100F includes a substrate 15 having optical transparency, a second light confinement layer 140 having the fourth structure provided on one surface of the substrate 15, the PC layer 120 (which may be a phase modulation layer) embedded in a surface region of the second light confinement layer 140, a UC layer 11 sandwiched between the PC layer 120 and the first light confinement layer 130, and the first light confinement layer 130.

In the optical device 100F, the second light confinement layer 140 has a single-layer structure comprised of SiN, and a plurality of recesses for defining a plurality of modified refractive index regions 120b of the PC layer 120 are formed on the surface thereof. Therefore, the surface region of the second light confinement layer 140 in which the plurality of recesses are formed becomes the base layer 120a of the PC layer 120. Note that, in the PC layer 120 of the fourth structure, the surface of the second light confinement layer 140 and the inner walls (including the bottom portions) of the plurality of recesses are directly covered with the UC layer 11, and each of the plurality of recesses is in a state of being filled with a part of the UC layer 11. The optical device 100F having the PC layer 120 of the fourth structure substantially matches the configuration of the optical device 100B indicated by the arrow (b) in FIG. 40. That is, a structure in which the PC layer 120 is embedded inside the surface region of the second light confinement layer 140 having a single layer structure can be fabricated.

Also by the light-emitting device illustrated in FIG. 46B (the fourth embodiment in which the second light confinement layer 140 has the second structure), the same effects as those of the light-emitting device illustrated in FIG. 45A can be obtained.

Figure 47:
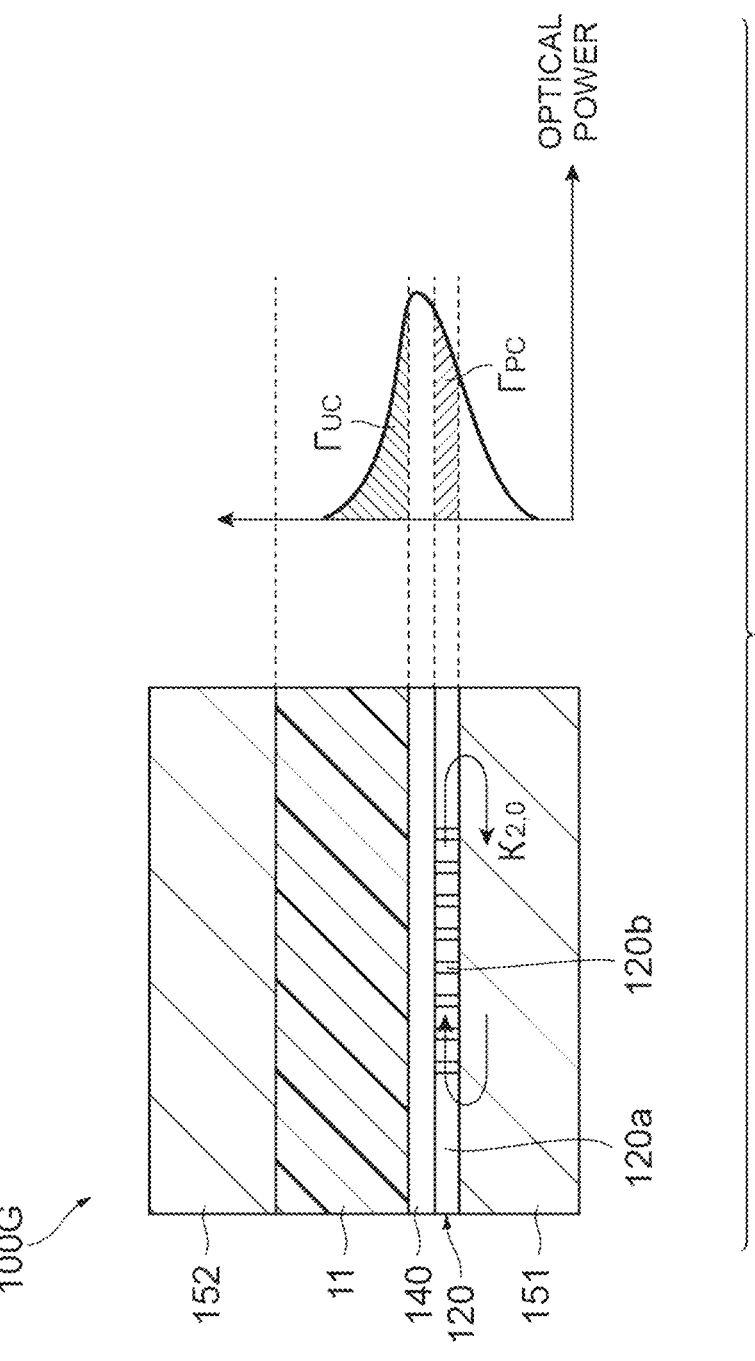
FIG. 47 is a diagram for explaining a design guideline for the optical device (resonator unit model).

Next, a resonator structure that easily oscillates will be examined. FIG. 47 is a diagram for explaining a design guideline for an optical device (a resonator unit model including the second light confinement layer 140 and the PC layer 120). A model 100G illustrated in FIG. 47 has a structure in which a stack of a PC layer 120 (which may be a phase modulation layer), a second light confinement layer 140, and a UC layer 11 is sandwiched between a pair of quartz plates 151 and 152. Both of the quartz plates 151 and 152 have a refractive index of 1.46 for light having a wavelength of 550 nm. The UC layer 11 has a refractive index of 1.5 for light having a wavelength of 550 nm. The second light confinement layer 140 is comprised of SiN and has a refractive index of 2.0 for light having a wavelength of 550 nm. A base layer 120a of the PC layer 120 is comprised of $TiO_2$, and a plurality of modified refractive index regions 120b are holes provided in the base layer 120a. In addition, the actual occupancy (hereinafter referred to as "filling factor (FF)") of each modified refractive index region 120b with respect to the installable area of one modified refractive index region 120b on the surface of the base layer 120a is 30%.

The first condition for designing the resonator structure that easily oscillates is to increase the distribution ratio $\Gamma_{UC}$ of light distributed in the UC layer 11 (increase the gain). In order to satisfy this first condition, it is necessary to design an appropriate layer structure while noting that light is localized in a layer having a high refractive index and moves away from a layer having a low refractive index. In addition, the second condition is to increase the light confinement intensity in the resonator unit, that is, to increase the diffraction intensity $\kappa_{2,0}$ in the PC layer 120. Note that the diffraction intensity $\kappa_{m,n}(\text{cm}^{-1})$ is expressed by the following Formula (23).

$$\left.\begin{array}{l} \kappa_{m,n} = -\dfrac{k_0^2}{2\beta}\Gamma_{PC}(\varepsilon_{in}-\varepsilon_{out})\cdot F_{m,n} \\[2mm] k_0 = \dfrac{2\pi}{\lambda} \\[2mm] \beta = n_{eff}\dfrac{2\pi}{\lambda} \end{array}\right\} \quad (23)$$

In the above-described Formula (23), $\kappa_{m,n}$ is the intensity (corresponding to the coupling coefficient) of diffraction by the PC layer 120. The subscripts in and n indicate the number of reciprocal lattice vectors to be diffracted. For example, in the case of in-plane 180° diffraction, two reciprocal lattice vectors are diffracted, and thus (m, n)=(2,0) or (0,2). In addition, in the case of 90° diffraction from the in-plane direction to the vertical direction, one reciprocal lattice vector is diffracted, and thus (m, n)=(1, 0) or (0, 1). $k_0$ is a propagation constant of a plane wave in vacuum, and $\lambda$ is a wavelength of light. $\beta$ is a propagation constant. $n_{eff}$ is an effective refractive index. $\Gamma_{PC}$ is a distribution ratio of light distributed in the PC layer 120 among light (electric field distribution) in the stacking direction. $\varepsilon_{in}$ is a dielectric constant in the hole (each modified refractive index region 120b) in the PC layer 120. $\varepsilon_{out}$ is a dielectric constant outside the hole in the PC layer 120. In addition, $F_{m,n}$ is a Fourier coefficient ((m, n)=(2,0) or (0,2) for 180° diffraction, (m, n)=(1,0) or (0,1) for 90° diffraction) depending on the planar shape of the modified refractive index region 120b provided in the PC layer 120.

From the above-described Formula (23), in order to increase the light confinement intensity of the resonator (increase the diffraction intensity $\kappa_{2,0}$ so that the electric field distribution of light is not broken), it is necessary to design an appropriate layer structure while paying attention to increasing $\Gamma_{PC}$, increasing the refractive index difference between the inside of the PC layer 120 and the peripheral region of the PC layer 120, and increasing the Fourier coefficient $F_{2,0}$ of the planar shape of the modified refractive index region 120b (hole) provided in the PC layer 120. In this case, when it is noted that light moves away from a layer having a low refractive index, there is a possibility that it is better to embed another material than to fill the inside of each of the modified refractive index regions 120b with air having a low refractive index.

As a result of the examination described above, specifically, the refractive index of the PC layer 120 is preferably set higher than the refractive index of the peripheral region. Furthermore, it has been found that an embedded-type PC layer structure is preferable, such as the modified refractive index regions 120b obtained by embedding $TiO_2$ the holes formed in the base layer 120a comprised of SiN so as to make a dielectric constant difference ($\varepsilon_{in}-\varepsilon_{out}$) between the inside of the PC layer 120 and the peripheral region. Therefore, detailed conditions will be examined using FIGS. 48, 49A to 49E, 50A to 50F, 51, and 52A to 52E.

Figure 48:
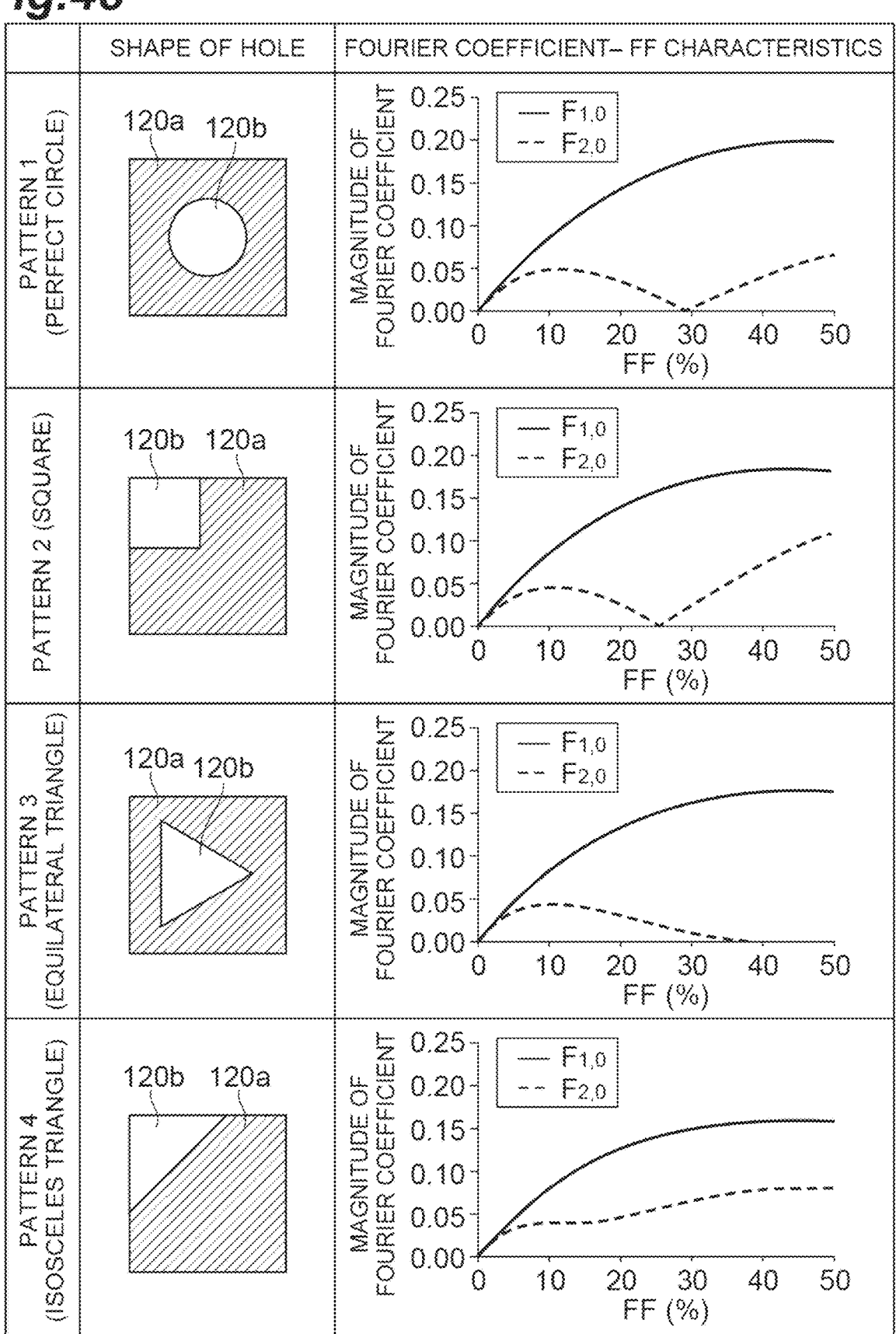
FIG. 48 is a graph illustrating a relationship between a Fourier coefficient and an FF value for each of various hole shapes in a PC layer of the optical device having a cross-sectional structure illustrated in FIG. 47.

FIG. 48 is a graph illustrating a relationship between a Fourier coefficient and an FF value for each of various hole shapes in a PC layer of an optical device having the cross-sectional structure illustrated in FIG. 47. The prepared hole shapes (planar shapes of the modified refractive index regions 120b provided in the base layer 120a) are a perfect circle (pattern 1), a square (pattern 2), an equilateral triangle (pattern 3), and a right-angled isosceles triangle (pattern 4).

FIG. 48 illustrates a relationship between the magnitude of the Fourier coefficients $F_{2,0}$ (180° diffraction) and $F_{1,0}$ (90° diffraction) and the FF value for each of the patterns 1 to 4. From these graphs, it can be seen that the planar shape of the modified refractive index region 120b is preferably a right-angled isosceles triangle with an FF of 30% since the Fourier coefficient $F_{2,0}$ does not approach 0 even if the hole shape is slightly reduced in size due to manufacturing tolerance. The following calculation is mainly performed for a case where the planar shape of the modified refractive index region 120b is a right-angled isosceles triangle with an FF of 30%.

Figure 49A:
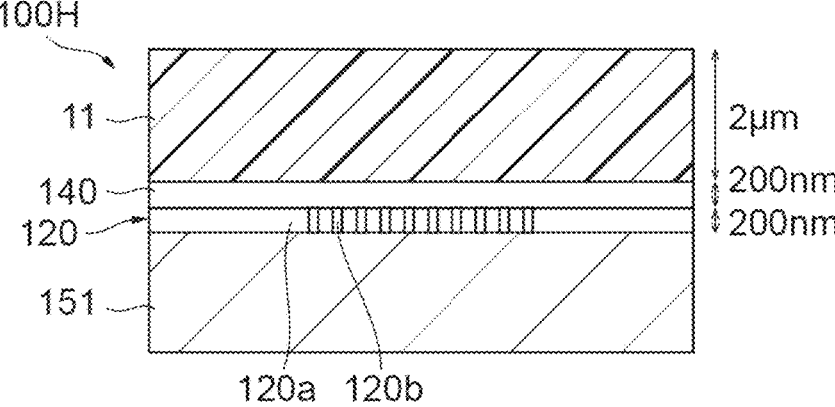
FIGS. 49A and 49B illustrate an example of a cross-sectional structure in which a diffraction intensity $\kappa_{2,0}$ can be increased and an example of a cross-sectional structure in which a distribution ratio $\Gamma_{UC}$ can be increased, respectively.
Figure 49B:
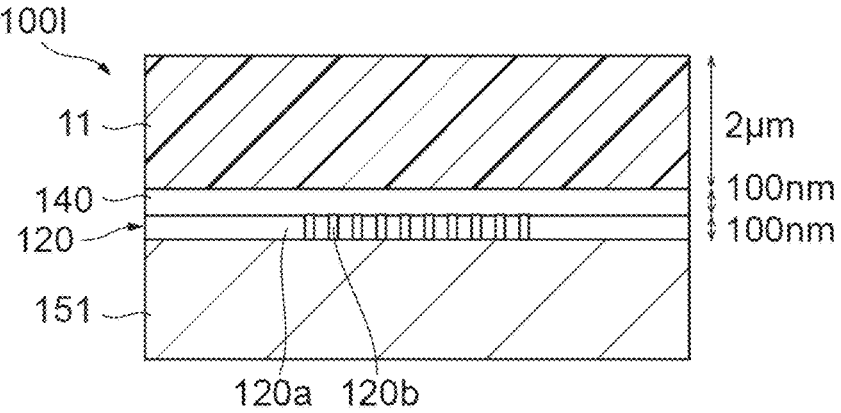
Figure 49C:
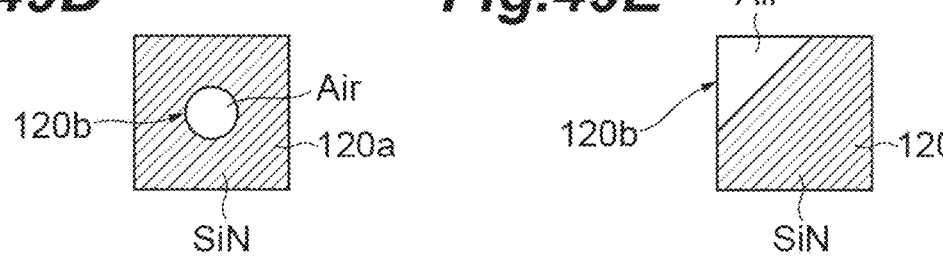
FIG. 49C is a table illustrating results of calculating the diffraction intensity $\kappa_{2,0}$ and the distribution ratio $\Gamma_{UC}$ for optical devices having the cross-sectional structures illustrated in FIGS. 49A and 49B, and FIGS. 49D and 49E are diagrams for explaining hole shapes applied for the calculation.

FIGS. 49A to 49E are diagrams illustrating specific structural conditions for the resonator unit structure that easily oscillates based on the above-described examination results. That is, FIG. 49A illustrates an example of a cross-sectional structure of the optical device (resonator unit model including the second light confinement layer 140 and the PC layer 120) in which the diffraction intensity $\kappa_{2,0}$ can be increased, and FIG. 49B illustrates an example of a cross-sectional structure of the optical device (resonator unit model including the second light confinement layer 140 and the PC layer 120) in which the distribution ratio $\Gamma_{UC}$ (distribution ratio of light present in the UC layer 11) can be increased. FIG. 49C is a table illustrating results of calculating the diffraction intensity $\kappa_{2,0}$ and the distribution ratio $\Gamma_{UC}$ for each of the optical devices having the cross-sectional structures illustrated in FIGS. 49A and 49B. FIGS. 49D and 49E are diagrams for explaining hole shapes applied to the calculation.

FIG. 49A illustrates a cross-sectional structure of a model 100H having a structure (structure I) for increasing the diffraction intensity. The model 100H includes a quartz plate

151, a PC layer 120 (which may be a phase modulation layer) having a thickness of 200 nm provided on the quartz plate 151, a second light confinement layer 140 having a thickness of 200 nm provided on the PC layer 120, and a UC layer 11 having a thickness of 2 μm provided on the second light confinement layer 140. The quartz plate 151 has a refractive index of 1.46 for light having a wavelength of 550 nm. The UC layer 11 has a refractive index of 1.5 for light having a wavelength of 550 nm. The second light confinement layer 140 is comprised of SiN and has a refractive index of 2.0 for light having a wavelength of 550 nm. A base layer 120a of the PC layer 120 is comprised of $TiO_2$, and a plurality of modified refractive index regions 120b are holes provided in the base layer 120a. In addition, the planar shapes of the prepared modified refractive index regions 120b are a pattern 1 (perfect circle) with an FF=10% illustrated in FIG. 49D and a pattern 4 (right-angled isosceles triangle) of an FF=30% illustrated in FIG. 49E.

On the other hand, FIG. 49B illustrates a cross-sectional structure of a model 100I having a structure (structure II) that can increase a distribution ratio ($\Gamma_{UC}$) of light present in the UC layer 11. The model 100I includes a quartz plate 151, a PC layer 120 (which may be a phase modulation layer) having a thickness of 100 nm provided on the quartz plate 151, a second light confinement layer 140 having a thickness of 100 nm provided on the PC layer 120, and a UC layer 11 having a thickness of 2 μm provided on the second light confinement layer 140. The quartz plate 151 has a refractive index of 1.46 for light having a wavelength of 550 nm. The UC layer 11 has a refractive index of 1.5 for light having a wavelength of 550 nm. The second light confinement layer 140 is comprised of SiN and has a refractive index of 2.0 for light having a wavelength of 550 nm. A base layer 120a of the PC layer 120 is comprised of SiN (the refractive index for light having a wavelength of 550 nm is 2.0), and a plurality of modified refractive index regions 120b are holes provided in the base layer 120a. In addition, the planar shapes of the prepared modified refractive index regions 120b are a pattern 1 with an FF=10% (see FIG. 49D) and a pattern 4 with an FF=30% (see FIG. 49E), similarly to FIG. 49A.

As can be seen from the table of FIG. 49C, the distribution ratio $\Gamma_{UC}$ of light present in the UC layer 11 is higher in the model 100I having the structure II. The diffraction intensity $\kappa_{2,0}$ is larger in both the pattern 1 and the pattern 2 in the model 100H having the structure I. In both the model 100H of the structure I and the model 100I of the structure II, the diffraction intensity $\kappa_{2,0}$ is larger in the pattern 4 than in the pattern 1.

FIGS. 50A to 50F are diagrams illustrating results of calculating the thickness dependency of the UC layer 11. FIG. 50A illustrates an example of a cross-sectional structure of the prepared optical device (resonator part model including the second light confinement layer 140 and the PC layer 120), and FIG. 50B illustrates a hole shape applied for calculation. FIGS. 50C to 50F are tables illustrating results of calculating the diffraction intensity $\kappa_{2,0}$, the distribution ratio $\Gamma_{PC}$ (the ratio of light present in the PC layer), the distribution ratio $\Gamma_{UC}$, and the effective refractive index $n_{eff}$.

A model 100J illustrated in FIG. 50A has a structure in which a stack of a PC layer 120, a second light confinement layer 140, and a UC layer 11 is sandwiched between a pair of quartz plates 151 and 152. Both of the quartz plates 151 and 152 have a refractive index of 1.46 for light having a wavelength of 550 nm. The UC layer 11 has a refractive index of 1.5 for light having a wavelength of 550 nm and a thickness of 20 nm to 2 μm. The second light confinement layer 140 is comprised of $TiO_2$ and has a refractive index of 2.5 for light having a wavelength of 550 nm. In addition, the second light confinement layer 140 has a thickness of 10 nm. A base layer 120a of the PC layer 120 is comprised of SiN, and has a refractive index of 2.0 for light having a wavelength of 550 nm. A plurality of modified refractive index regions 120b are obtained by filling holes provided in the base layer 120a with $TiO_2$. In addition, the planar shape of each modified refractive index region 120b in the PC layer 120 is a right-angled isosceles triangle as illustrated in FIG. 50B, and the FF is 30%.

FIG. 50C illustrates results of calculating the diffraction intensity $\kappa_{2,0}$ for each of combinations of PC layers 120 having thicknesses of 30 nm, 50 nm, and 100 nm and UC layers 11 having thicknesses of 50 nm, 100 nm, 200 nm, 500 nm, 1000 nm, and 2000 nm. FIG. 50D illustrates results of calculating the distribution ratio $\Gamma_{PC}$ for each of the combinations of the PC layers 120 having the thicknesses of 30 nm, 50 nm, and 100 nm and the UC layers 11 having the thicknesses of 50 nm, 100 nm, 200 nm, 500 nm, 1000 nm, and 2000 nm. FIG. 50E illustrates results of calculating the distribution ratio $\Gamma_{UC}$ for each of the combinations of the PC layers 120 having the thicknesses of 30 nm, 50 nm, and 100 nm and the UC layers 11 having the thicknesses of 50 nm, 100 nm, 200 nm, 500 nm, 1000 nm, and 2000 nm. FIG. 50F illustrates results of calculating the effective refractive index (equivalent refractive index) $n_{eff}$ for each of the combinations of the PC layers 120 having the thicknesses of 30 nm, 50 nm, and 100 nm and the UC layers 11 having the thicknesses of 50 nm, 100 nm, 200 nm, 500 nm, 1000 nm, and 2000 nm.

From the results illustrated in FIGS. 50C to 50F, it can be seen that the UC layer 11 is not particularly affected by a variation in the thickness as long as it has a thickness of 200 nm or more.

FIG. 51 is a table summarizing the dependence of the thickness of the light confinement layer (second light confinement layer 140) on the thickness of the PC layer 120 for the optical device having the cross-sectional structure illustrated in FIG. 50A. In particular, the upper part of FIG. 51 illustrates results of calculating the diffraction intensity $\kappa_{2,0}$ ($cm^{-1}$) for each of combinations of $TiO_2$ layers (second light confinement layers 140) having thicknesses of 0 nm, 5 nm, 10 nm, 20 nm, 30 nm, 50 nm, and 100 nm and PC layers 120 having thicknesses of 10 nm, 20 nm, 30 nm, 50 nm, and 100 nm. In addition, the lower part of FIG. 51 illustrates results of calculating the distribution ratio $\Gamma_{UC}$ for each of the combinations of the $TiO_2$ layers (second light confinement layers 140) having the thicknesses of 0 nm, 5 nm, 10 nm, 20 nm, 30 nm, 50 nm, and 100 nm and the PC layers 120 having the thicknesses of 10 nm, 20 nm, 30 nm, 50 nm, and 100 nm.

From the calculation results illustrated in FIG. 51, the optimum range in which both the diffraction intensity $\kappa_{2,0}$ and the distribution ratio $\Gamma_{UC}$ can be set large, that is, the range in which the diffraction intensity $\kappa_{2,0}$ is 1000 ($cm^{-1}$) or more and the distribution ratio $\Gamma_{UC}$ is 40% is a range in which the thickness of the PC layer 120 is in the range of 30 nm to 50 nm and the thickness of the $TiO_2$ layer (second light confinement layer 140) directly provided on the PC layer 120 is in the range of 0 nm to 10 nm. In FIG. 51, this optimum range is surrounded by a solid line.

Furthermore, for the optical device having the light confinement layer 140 of the fourth structure, the optimal ranges of the thickness of the light confinement layer 140 and the thickness of the PC layer 120 (phase modulation layer) will be examined. FIG. 52A illustrates an example of a cross-sectional structure of an optical device (a resonator unit model including the second light confinement layer 140 and the PC layer 120) prepared for examination, and FIGS. 52B to 52E are tables indicating results of calculating the diffraction intensity $\kappa_{2,0}$, the distribution ratio $\Gamma_{PC}$ (the ratio of light present in the PC layer), the distribution ratio $\Gamma_{UC}$, and the effective refractive index $n_{eff}$. Note that FIGS. 52B to 52E illustrate various calculation results as the relationship between the "thickness of the light confinement layer" and the "thickness of the phase modulation layer", but substantially mean the "thickness of the light confinement layer" and the "thickness of the PC layer".

A model 100K illustrated in FIG. 52A includes a quartz plate 151, a second light confinement layer 140 (a PC layer 120 is embedded in a surface region) having a thickness of 50 nm to 200 nm provided on the quartz plate 151, and a UC layer 11 having a thickness of 2 μm provided on the second light confinement layer 140. A base layer 120a of the PC layer 120 is a surface region of the second light confinement layer 140, and a plurality of recesses are provided on the surface of the second light confinement layer 140 as a plurality of modified refractive index regions 120b. The quartz plate 151 has a refractive index of 1.46 for light having a wavelength of 550 nm. The UC layer 11 has a refractive index of 1.5 for light having a wavelength of 550 nm. The second light confinement layer 140 is comprised of TiO$_2$ and has a refractive index of 2.5 for light having a wavelength of 550 nm. The base layer 120a of the PC layer 120 is a surface region of the second light confinement layer 140, and a part of the ultraviolet curable resin constituting the UC layer 11 enters each recess defining each of the plurality of modified refractive index regions 120b. The planar shape of each modified refractive index region 120b in the PC layer 120 is a right triangle, and the FF is 30%.

FIG. 52B illustrates results of calculating the diffraction intensity $\kappa_{2,0}$ for each of combinations of second light confinement layers 140 having thicknesses of 50 nm, 100 nm, and 200 nm and PC layers 120 (phase modulation layers) having thicknesses of 10 nm, 20 nm, 50 nm, 100 nm, 150 nm, and 200 nm. FIG. 52C illustrates results of calculating the distribution ratio $\Gamma_{PC}$ for each of the combinations of the second light confinement layers 140 having the thicknesses of 50 nm, 100 nm, and 200 nm and the PC layers 120 (phase modulation layers) having the thicknesses of 10 nm, 20 nm, 50 nm, 100 nm, 150 nm, and 200 nm. FIG. 52D illustrates results of calculating the distribution ratio $\Gamma_{UC}$ for each of the combinations of the second light confinement layers 140 having the thicknesses of 50 nm, 100 nm, and 200 nm and the PC layers 120 (phase modulation layers) having the thicknesses of 10 nm, 20 nm, 50 nm, 100 nm, 150 nm, and 200 nm. FIG. 52E illustrates results of calculating the effective refractive index (equivalent refractive index) $n_{eff}$ for each of the combinations of the second light confinement layers 140 having the thicknesses of 50 nm, 100 nm, and 200 nm and the PC layers 120 having the thicknesses of 10 nm, 20 nm, 50 nm, 100 nm, 150 nm, and 200 nm.

Note that a region surrounded by a solid line in each of FIGS. 52B to 52E is the optimum range. That is, the thickness of the second light confinement layer 140 is preferably in a range of 50 nm to 100 nm, and the thickness of the PC layer 120 (phase modulation layer) is preferably 50 nm.

Figure 53A:
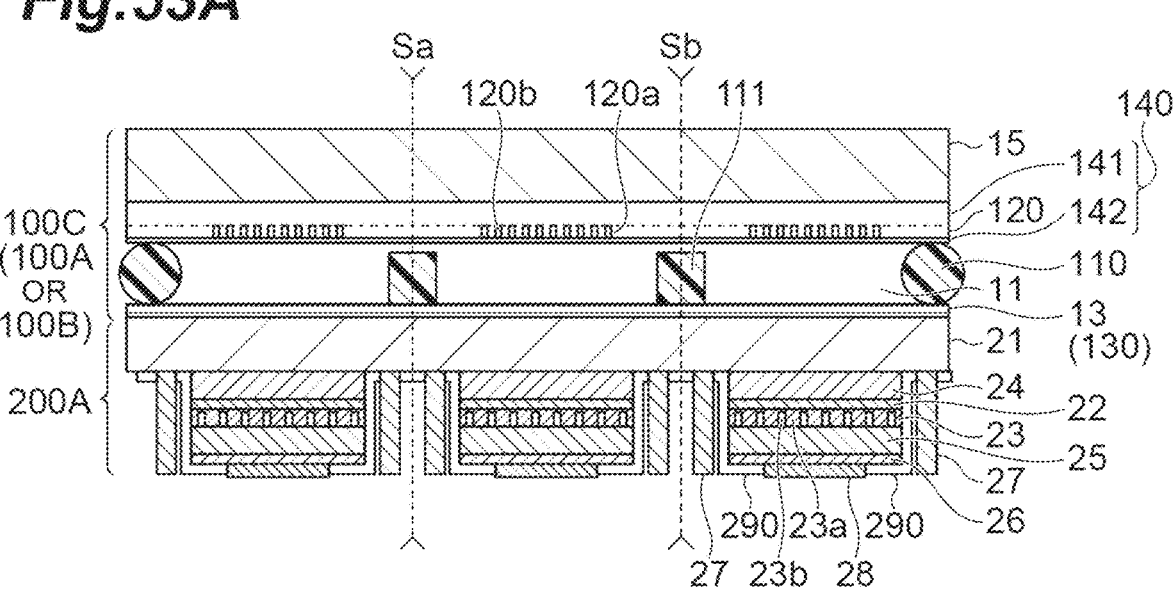
FIG. 53A is a cross-sectional view of a light-emitting device manufactured by a second manufacturing method (upconversion material injection type) of manufacturing the light-emitting device according to the fourth embodiment, and having a light confinement layer of a first structure.

FIG. 53A is a cross-sectional view of a light-emitting device having a light confinement layer of the first structure manufactured by the upconversion material injection type manufacturing method (second manufacturing method) of manufacturing the light-emitting device according to the fourth embodiment. Note that FIG. 53A illustrates a state before each part is separated by cutting lines Sa and Sb.

The second manufacturing method includes a step of injecting an ultraviolet curable resin (containing an upconversion material as a main material) constituting the UC layer 11 as a step of manufacturing the UC layer 11. This is different from the above-described first manufacturing method in which the excitation light source 200A and the optical devices 100C to 100F are manufactured as separate units, and these units are finally assembled. That is, in the second manufacturing method, the common optical devices 100C to 100F are prepared for the plurality of excitation light sources 200A, and finally, the completed product is separated by the cutting lines Sa and Sb illustrated in FIG. 53A, whereby the light-emitting device illustrated in FIG. 45A is obtained.

Specifically, in the example (before cutting) illustrated in FIG. 53A, a plurality of excitation light sources 200A are provided for the common optical device 100C. Each excitation light source 200A can be replaced with the excitation light sources 20A to 20C of the above-described first to third embodiments and first to tenth modifications, and the basic configuration has the cross-sectional structure indicated by the arrow (c) in FIG. 40. That is, each excitation light source 200A includes a semiconductor substrate 21 comprised of GaAs, a first cladding layer 24 provided on the main surface 21a of the semiconductor substrate 21, an active layer 22 provided on the first cladding layer 24, a PC layer 23 provided on the active layer 22, a second cladding layer 25 provided on the PC layer 23, a contact layer 26 provided on the second cladding layer 25, a second electrode 28 provided on the contact layer 26, a first electrode 27 provided in a region included in the main surface 21a of the semiconductor substrate 21 and exposed without being covered with a semiconductor stack including the above-described active layer 22 and PC layer 23, and an insulating layer 290 comprised of SiN or the like, which covers the main surface 21a and the surface of the semiconductor stack except the first electrode 27 and the second electrode 28. The PC layer 23 includes a base layer 23a comprised of GaAs and a plurality of modified refractive index regions 23b defined by holes provided in the base layer 23a.

On the other hand, the common optical device 100C is mounted on the above-described excitation light source 200A (on the back surface 21b of the semiconductor substrate 21) via the first light confinement layer 130 (which may have a single-layer structure comprised of SiN, TiO$_2$, or the like) comprised of a dielectric multilayer film. The optical device 100C includes a substrate 15 having optical transparency, a second light confinement layer 140 having a first structure provided on one surface of the substrate 15, a PC layer 120 (which may be a phase modulation layer) embedded in the second light confinement layer 140 or in a surface region of the second light confinement layer 140, a UC layer 11 sandwiched between the PC layer 120 and the first light confinement layer 130, and the first light confinement layer 130. In particular, since an ultraviolet curing resin constituting the UC layer 11 is injected between the PC layer 120 and the first light confinement layer 130, a spacer 110 (ultraviolet curing resin in which a plurality of beads are dispersed) for preventing leakage of the ultraviolet curing resin and defining the thickness of the UC layer 11 is disposed. In addition, in this space, a partition member 111 comprised of an ultraviolet curable resin is arranged in order to suppress shrinkage in the vicinity of the center of the UC layer 11 after UV curing (suppression of a fluctuation in the thickness of the UC layer 11 based on the first light confinement layer 130).

In this optical device 100C, the second light confinement layer 140 has a base 141 and a cover layer 142 each having a single-layer structure comprised of SiN or TiO$_2$. The PC layer 120 is located between the base 141 and the cover layer 142, and includes a base layer 120a and a plurality of modified refractive index regions 120b. The base layer 120a also has a single-layer structure comprised of SiN or TiO$_2$. The plurality of modified refractive index regions of the PC layer 120 are voids. The cover layer 142 also has a single-layer structure comprised of SiN or TiO$_2$. Here, when the base 141 and the base layer 120a of the PC layer 120 are comprised of different materials (for example, when the base 141 is comprised of SiN and the base layer 12a is comprised of TiO$_2$), the configuration of the optical device 100C substantially matches the configuration of the optical device 100A indicated by the arrow (a) in FIG. 40. On the other hand, when the base 141, the base layer 120a of the PC layer 120, and the cover layer 142 are comprised of the same material (for example, when each is comprised of SiN), the configuration of the optical device 100C substantially matches the configuration of the optical device 100B indicated by the arrow (b) in FIG. 40. That is, a structure in which the PC layer 120 is embedded inside the second light confinement layer 140 having a single layer structure can be fabricated.

According to the light-emitting device obtained by the above-described upconversion material injection type manufacturing method (second manufacturing method), particularly, the individual light-emitting devices separated by the cutting lines Sa and Sb (the fourth embodiment in which the second light confinement layer 140 has the first structure), unnecessary heat is not applied to the UC layer 11 provided on the substrate 15. In addition, the plurality of modified refractive index regions 120b (voids) provided in the PC layer 120 are not filled with the upconversion material. Furthermore, it is also possible to measure the initial optical characteristics of only the photonic crystal surface emitting laser before mounting the optical device 100C on the excitation light source 200A.

Furthermore, according to the second manufacturing method, a large number of light-emitting devices having the same structure can be obtained by manufacturing a device once, and the size of each device can also be reduced. In addition, since the thickness of the UC layer 11 is defined by the spacer 110, the thickness can be controlled with high accuracy. Since the thickness of the UC layer 11 can be controlled with high accuracy, the thickness of the UC layer 11 becomes an optimum value, and the occurrence of an unnecessary longitudinal mode can be effectively suppressed. Furthermore, the UC layer 11 can be manufactured to be parallel to other layers such as, for example, the substrate 15, and a waveguide loss in the visible in-plane direction resonance mode can also be suppressed.

Figure 53B:
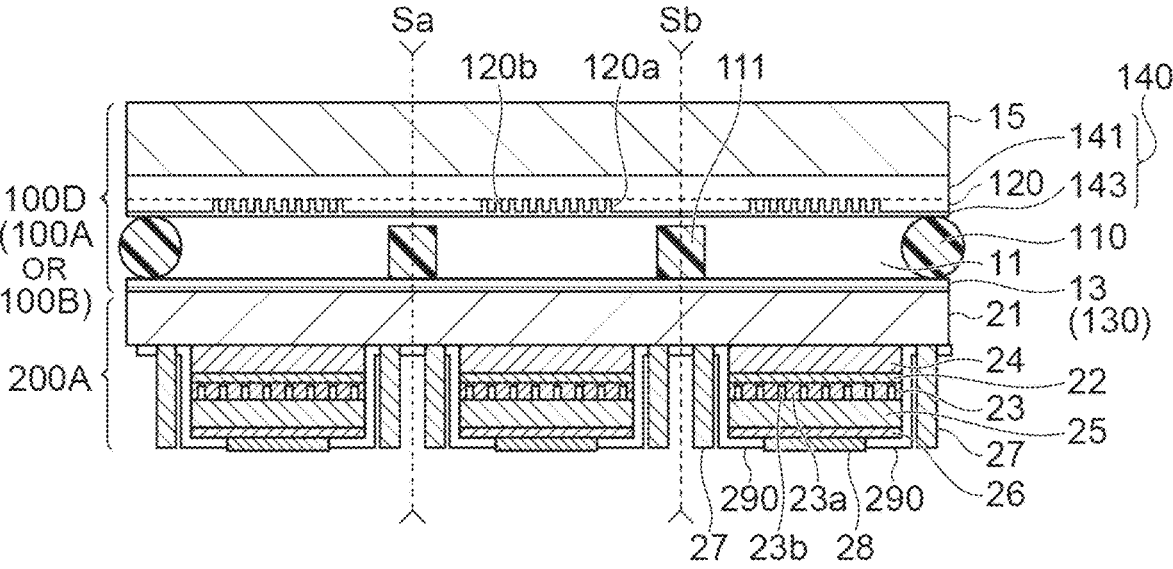
FIG. 53B is a cross-sectional view of a light-emitting device manufactured by the second manufacturing method and having a light confinement layer of a second structure.

FIG. 53B is a cross-sectional view of a light-emitting device manufactured by the second manufacturing method and having a light confinement layer of the second structure. Note that FIG. 53B also illustrates a state before each part is separated by cutting lines Sa and Sb.

The light-emitting device (before cutting) illustrated in FIG. 53B includes a plurality of excitation light sources 200A and a common optical device 100D abutting on these excitation light sources 200A via a first light confinement layer 130. In addition, the light-emitting device illustrated in FIG. 53B has the same structure as that of the light-emitting device illustrated in FIG. 53A except that the optical device 100D has a PC layer 120 having the second structure.

On the other hand, the common optical device 100D is mounted on the plurality of excitation light sources 200A (on the back surface 21b of the semiconductor substrate 21) via the first light confinement layer 130 (which may have a single-layer structure comprised of SiN, TiO$_2$, or the like) comprised of a dielectric multilayer film. The common optical device 100D includes a substrate 15 having optical transparency, a second light confinement layer 140 having the second structure provided on one surface of the substrate 15, the PC layer 120 (which may be a phase modulation layer) embedded in a surface region of the second light confinement layer 140, a UC layer 11 sandwiched between the PC layer 120 and the first light confinement layer 130, and the first light confinement layer 130.

In the common optical device 100D, the second light confinement layer 140 includes a base 141 having a single-layer structure comprised of SiN and a cover layer 142 having a single-layer structure comprised of TiO$_2$. The PC layer 120 is located between the base 141 and the cover layer 142, and includes a base layer 120a and a plurality of modified refractive index regions 120b. The base layer 120a also has a single-layer structure comprised of SiN and substantially constitutes a part of the second light confinement layer 140. The plurality of modified refractive index regions of the PC layer 120 are defined by a plurality of recesses provided in the base layer 120a constituting a part of the second light confinement layer 140, and the plurality of recesses are filled with the same TiO$_2$ material as the material of the cover layer 142. In particular, since an ultraviolet curing resin constituting the UC layer 11 is injected between the PC layer 120 and the first light confinement layer 130, a spacer 110 for preventing leakage of the ultraviolet curing resin and defining the thickness of the UC layer 11 is disposed. In addition, in this space, a partition member 111 comprised of an ultraviolet curable resin is arranged in order to suppress shrinkage in the vicinity of the center of the UC layer 11 after UV curing (suppression of a fluctuation in the thickness of the UC layer 11 based on the first light confinement layer 130).

Here, when the base 141 and the base layer 120a of the PC layer 120 are comprised of different materials (for example, when the base 141 is comprised of SiN and the base layer 12a is comprised of TiO$_2$), the configuration of the common optical device 100D substantially matches the configuration of the optical device 100A indicated by the arrow (a) in FIG. 40. In this case, the base layer 120a and the plurality of modified refractive index regions 120b are comprised of the same material, but the refractive index of the base layer 120a is different from the refractive index of the plurality of modified refractive index regions 120b. On the other hand, when base 141 and the base layer 120a of the PC layer 120 are comprised of the same material (for example, when both are comprised of SiN), the configuration of optical device 100D substantially matches the configuration of the optical device 100B indicated by arrow (b) in FIG. 40. That is, a structure in which the PC layer 120 is embedded inside the surface region of the second light confinement layer 140 having a single layer structure can be fabricated.

Also by the light-emitting device illustrated in FIG. 53B, particularly, each light-emitting device after cutting (the fourth embodiment in which the second light confinement layer 140 has the second structure), the same effects as those of the light-emitting device illustrated in FIG. 45A can be obtained. In addition, the manufacturing method for obtaining the light-emitting device illustrated in FIG. 53B can also obtain the same effects as the above-described manufacturing method for obtaining the light-emitting device illustrated in FIG. 53A.

Figure 54A:
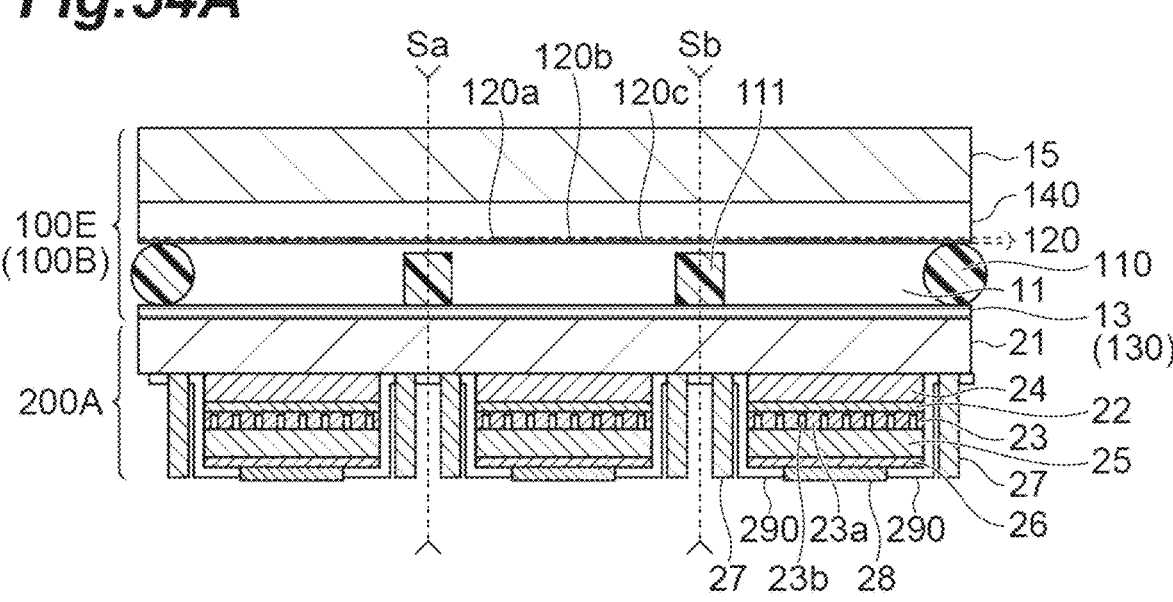
FIG. 54A is a cross-sectional view of a light-emitting device manufactured by the second manufacturing method and having a light confinement layer of a third structure.

FIG. 54A is a cross-sectional view of a light-emitting device manufactured by the second manufacturing method and having a light confinement layer of the third structure. Note that FIG. 54A also illustrates a state before each part is separated by cutting lines Sa and Sb.

The light-emitting device (before cutting) illustrated in FIG. 54A includes a plurality of excitation light sources 200A and a common optical device 100E abutting on these excitation light sources 200A via a first light confinement layer 130. In addition, the light-emitting device illustrated in FIG. 54A has the same structure as that of the light-emitting device illustrated in FIG. 53A except that the optical device 100E has a PC layer 120 having the third structure.

That is, the common optical device 100E is mounted on the plurality of excitation light sources 200A (on the back surface 21b of the semiconductor substrate 21) via the first light confinement layer 130 (which may have a single-layer structure comprised of SiN, $TiO_2$, or the like) comprised of a dielectric multilayer film. The common optical device 100E includes a substrate 15 having optical transparency, a second light confinement layer 140 having the third structure provided on one surface of the substrate 15, the PC layer 120 (which may be a phase modulation layer) embedded in a surface region of the second light confinement layer 140, a UC layer 11 sandwiched between the PC layer 120 and the first light confinement layer 130, and the first light confinement layer 130.

In the common optical device 100E, the second light confinement layer 140 has a single-layer structure comprised of SiN, and a plurality of recesses for defining a plurality of modified refractive index regions 120b of the PC layer 120 are formed on the surface thereof. Therefore, the surface region of the second light confinement layer 140 in which the plurality of recesses are formed becomes the base layer 120a of the PC layer 120. In the PC layer 120 of the third structure, the surface of the second light confinement layer 140 and inner walls (including the bottoms) of the plurality of recesses are covered with a cover layer 120c comprised of $TiO_2$. In addition, since an ultraviolet curing resin constituting the UC layer 11 is injected between the PC layer 120 and the first light confinement layer 130, a spacer 110 for preventing leakage of the ultraviolet curing resin and defining the thickness of the UC layer 11 is disposed. In addition, in this space, a partition member 111 comprised of an ultraviolet curable resin is arranged in order to suppress shrinkage in the vicinity of the center of the UC layer 11 after UV curing (suppression of a fluctuation in the thickness of the UC layer 11 based on the first light confinement layer 130).

The common optical device 100E having the PC layer 120 of the third structure substantially matches the configuration of the optical device 100B indicated by the arrow (b) in FIG. 40. That is, a structure in which the PC layer 120 is embedded inside the surface region of the second light confinement layer 140 having a single layer structure can be fabricated.

Also by the light-emitting device illustrated in FIG. 54A, particularly, each light-emitting device after cutting (the fourth embodiment in which the second light confinement layer 140 has the second structure), the same effects as those of the light-emitting device illustrated in FIG. 45A can be obtained. In addition, the manufacturing method for obtaining the light-emitting device illustrated in FIG. 53B can also obtain the same effects as the above-described manufacturing method for obtaining the light-emitting device illustrated in FIG. 53A.

Figure 54B:
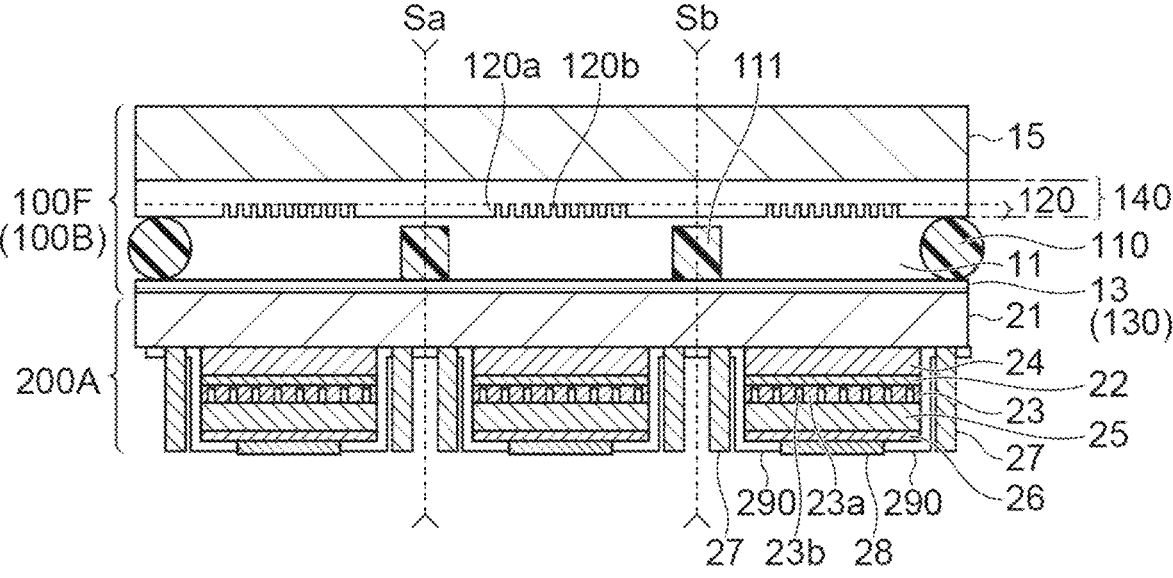
FIG. 54B is a cross-sectional view of a light-emitting device manufactured by the second manufacturing method and having a light confinement layer of a fourth structure.

FIG. 54B is a cross-sectional view of a light-emitting device manufactured by the second manufacturing method and having a light confinement layer of the fourth structure. Note that FIG. 54B also illustrates a state before each part is separated by cutting lines Sa and Sb.

The light-emitting device (before cutting) illustrated in FIG. 54B includes a plurality of excitation light sources 200A and a common optical device 100F abutting on these excitation light sources 200A via a first light confinement layer 130. The light-emitting device illustrated in FIG. 54B has the same structure as that of the light-emitting device illustrated in FIG. 53A except that the common optical device 100F has a PC layer 120 having the fourth structure.

That is, the common optical device 100F is mounted on the plurality of excitation light sources 200A (on the back surface 21b of the semiconductor substrate 21) via the first light confinement layer 130 (which may have a single-layer structure comprised of SiN, $TiO_2$, or the like) comprised of a dielectric multilayer film. The common optical device 100F includes a substrate 15 having optical transparency, a second light confinement layer 140 having the fourth structure provided on one surface of the substrate 15, the PC layer 120 (which may be a phase modulation layer) embedded in a surface region of the second light confinement layer 140, a UC layer 11 sandwiched between the PC layer 120 and the first light confinement layer 130, and the first light confinement layer 130.

In the common optical device 100F, the second light confinement layer 140 has a single-layer structure comprised of SiN, and a plurality of recesses for defining a plurality of modified refractive index regions 120b of the PC layer 120 are formed on the surface thereof. Therefore, the surface region of the second light confinement layer 140 in which the plurality of recesses are formed becomes the base layer 120a of the PC layer 120. Note that, in the PC layer 120 of the fourth structure, the surface of the second light confinement layer 140 and the inner walls (including the bottom portions) of the plurality of recesses are directly covered with the UC layer 11, and each of the plurality of recesses is in a state of being filled with a part of the UC layer 11. In addition, since an ultraviolet curing resin constituting the UC layer 11 is injected between the PC layer 120 and the first light confinement layer 130, a spacer 110 for preventing leakage of the ultraviolet curing resin and defining the thickness of the UC layer 11 is disposed. In addition, in this space, a partition member 111 comprised of an ultraviolet curable resin is arranged in order to suppress shrinkage in the vicinity of the center of the UC layer 11 after UV curing (suppression of a fluctuation in the thickness of the UC layer 11 based on the first light confinement layer 130).

The common optical device 100F having the PC layer 120 of the fourth structure substantially matches the configuration of the optical device 100B indicated by the arrow (b) in FIG. 40. That is, a structure in which the PC layer 120 is embedded inside the surface region of the second light confinement layer 140 having a single layer structure can be fabricated.

Also by the light-emitting device illustrated in FIG. 54B, particularly, each light-emitting device after cutting (the fourth embodiment in which the second light confinement layer 140 has the second structure), the same effects as those of the light-emitting device illustrated in FIG. 45A can be obtained. In addition, the manufacturing method for obtaining the light-emitting device illustrated in FIG. 53B can also obtain the same effects as the above-described manufacturing method for obtaining the light-emitting device illustrated in FIG. 53A.

Next, the above-described upconversion material injection type manufacturing method (second manufacturing method) will be described. FIGS. 55A to 58D are diagrams for explaining a step of manufacturing a light-emitting device having a light confinement layer of the third structure illustrated in FIG. 54A as an example.

Figure 55A:
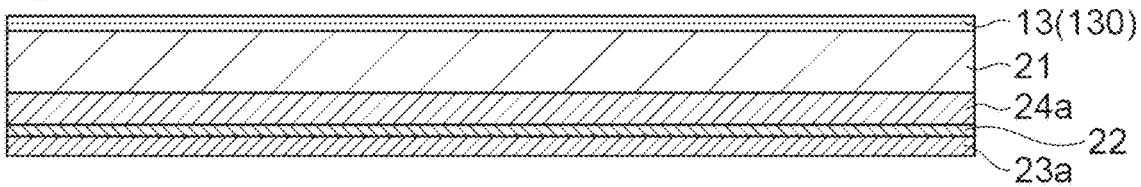
FIGS. 55A to 55D are diagrams for explaining a step of manufacturing the light-emitting device having the light confinement layer of the third structure illustrated in FIG. 54A as an example (part 1).

First, as illustrated in FIG. 55A, the first cladding layer 24 (n-type cladding layer), the active layer 22, and the base layer 23a, which is to be the PC layer 23, are sequentially stacked on one surface (main surface 21a) of the prepared GaAs substrate 21 by the MO-CVD method. On the other hand, a dielectric multilayer film (infrared transmission visible reflection mirror) is formed on the other surface (back surface 21b) of the GaAs substrate 21 by a vapor deposition method or a sputtering method.

Figure 55B:
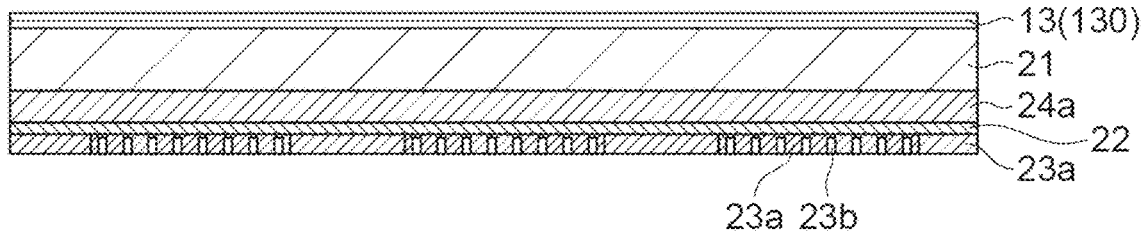
Figure 55C:
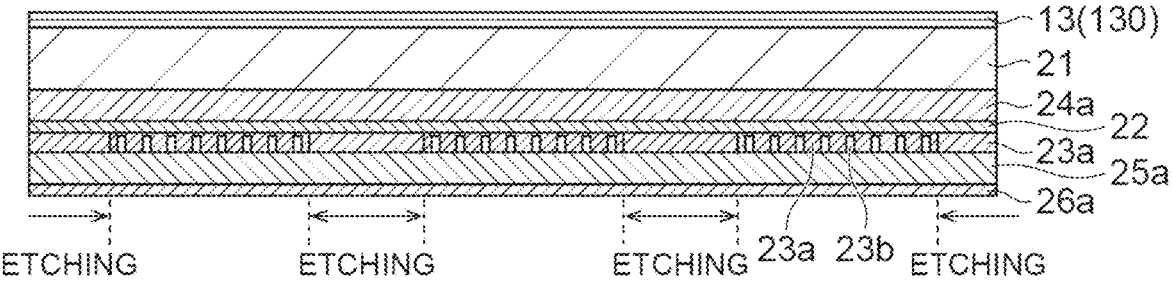

When the layer formation on both surfaces of the GaAs substrate 21 is completed, as illustrated in FIG. 55B, a plurality of recesses defining the plurality of modified refractive index regions 23b are formed in the base layer 23a of the PC layer 23 by an electron beam lithography method and a dry etching method. Subsequently, in FIG. 55C, the second cladding layer 25 (p-cladding layer) and the contact layer 26 are sequentially stacked on the PC layer 23 constituted by the base layer 23a and the plurality of modified refractive index regions 23b by the MO-CVD method.

Figure 55D:
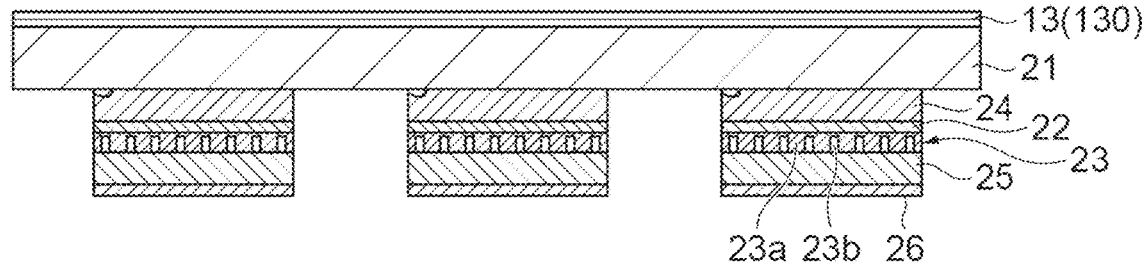
Figure 56A:
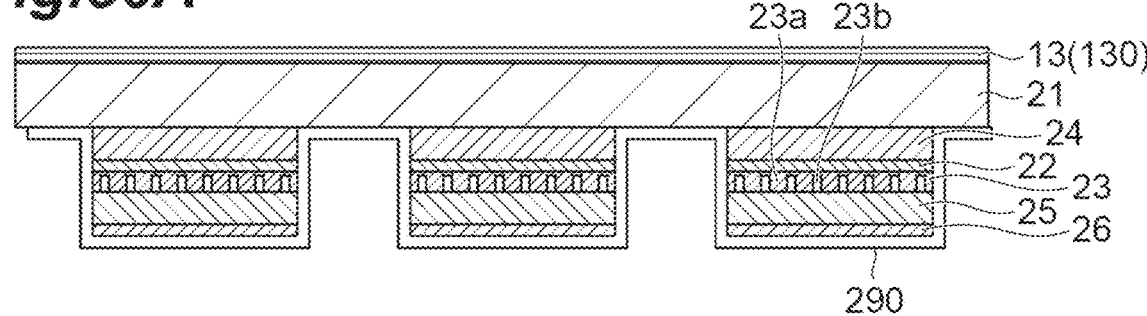
FIGS. 56A to 56D are diagrams for explaining the step of manufacturing the light-emitting device having the light confinement layer of the third structure illustrated in FIG. 54A as an example (part 2).

As illustrated in FIG. 55D, in the stacked portion provided on the GaAs substrate 21 as described above, element portions (the respective excitation light sources 200A each including a photonic crystal surface emitting laser) are patterned by a photolithography method and a wet etching method (unnecessary portions between elements are etched). Thereafter, as illustrated in FIG. 56A, the insulating layer 290 comprised of SiN is stacked on one surface (main surface 21a) of the GaAs substrate 21 and the surface of the stack by the plasma CVD method.

Figure 56B:
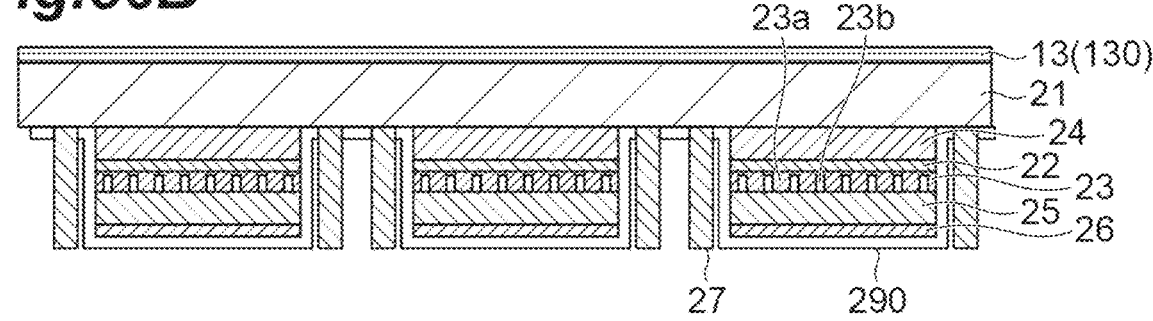
Figure 56C:
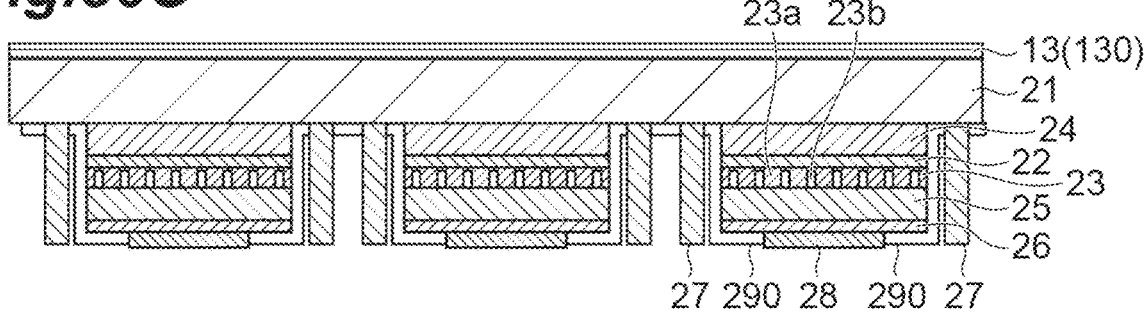

After the stacking of the insulating layer 290, a part of the insulating layer 290 located between the elements is removed (patterned) by a photolithography method and a wet etching method as illustrated in FIG. 56B, and the first electrode 27 (n-electrode) is further deposited by a photolithography method and a deposition method. After the vapor deposition, the first electrode 27 is alloyed in a hydrogen atmosphere. Subsequently, as illustrated in FIG. 56C, a part of the insulating layer 290 located on the stack where the contact layer 26 is located is removed (patterned) by a photolithography method and a wet etching method, and the second electrode 28 (p-electrode) is deposited by a photolithography method and a deposition method, and the excitation light source 200A side is completed.

Figure 56D:
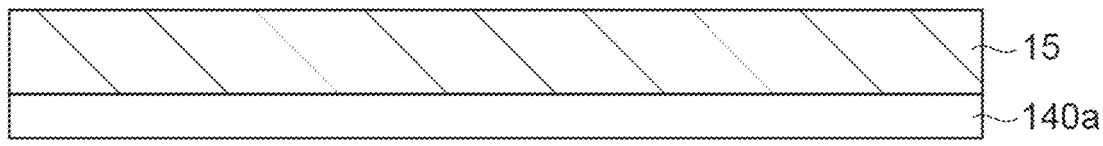

Next, the manufacturing of the resonator unit (optical device) will be described. As illustrated in FIG. 56D, an SiN layer 140a, which is to be the second light confinement layer 140, is stacked on one surface of the light transmissive substrate 15 (for example, a quartz plate) by the plasma CVD method. Further, as illustrated in FIG. 57A, a plurality of recesses for defining the plurality of modified refractive index regions 120b of the PC layer 120 are formed on the surface of the SiN layer 140a by an electron beam lithography method and a dry etching method. At this time, the surface region of the SiN layer 140a in which the plurality of recesses are formed becomes the base layer 120a, and the plurality of recesses become the plurality of modified refractive index regions 120b.

Subsequently, a TiO$_2$ layer 120c is formed by an atomic layer deposition method (ALD method) on the surface of the SiN layer 140a (the surface of the base layer 120a) and the inner walls and bottoms of the plurality of recesses (the plurality of modified refractive index regions 120b), and the second light confinement layer 140 is obtained as illustrated in FIG. 57B.

On the other hand, on the excitation light source side (FIG. 56C), as illustrated in FIG. 57C, in order to define a space, which is to be the UC layer 11, the partition member 111 comprised of an ultraviolet curing resin is formed on the first light confinement layer 130. The partition member 111 is formed by patterning an ultraviolet curable resin (the same as the constituent material of the UC layer 11) applied on the first light confinement layer 130. Further, as illustrated in FIG. 57D, a spacer 110 is disposed on the first light confinement layer 130 along the edge of the GaAs substrate 21. Specifically, an ultraviolet curable resin in which beads for the spacer 110 are dispersed is applied onto the first light confinement layer 130. At this stage, a resin injection opening 112 (opening into which the resin containing the upconversion material is injected) is opened. As described above, by applying the spacer 110, parallelism can be ensured in a wide range (wafer size).

Thereafter, as illustrated in FIG. 58A, the excitation light source side illustrated in FIG. 57D and the optical device side illustrated in FIG. 57B are combined and installed in vacuum. In this state, the space where the UC layer 11 is to be formed is surrounded by the spacer 110 (ultraviolet curable resin layer including a plurality of beads) (resin injection opening 112 is provided) as illustrated in FIG. 58B, and the partition member 111 is disposed inside the space.

Then, as illustrated in FIG. 58C, an ultraviolet curable resin (an ultraviolet curable resin containing the same upconversion material as the partition member 111) is injected into the space secured by the spacer 110 from the resin injection opening 112. Thereafter, an ultraviolet ray is radiated from the substrate 15 side, and the injected ultraviolet curable resin is cured. FIG. 58D is a plan view illustrating a state of the UC layer 11 after UV curing. Then, the product illustrated in FIG. 58C is cut at element separating positions indicated by cutting lines Sa and Sb by the dicing method, whereby the light-emitting device having the cross-sectional structure illustrated in FIG. 46A is obtained.

REFERENCE SIGNS LIST 1A to 1H, 1J light-emitting device
10A to 10E, 10A1, 100A to 100F optical device
11 UC layer (upconversion layer)
12A, 120 PC layer (photonic crystal layer)
12a, 120a base layer
11b, 12b, 12c, 120b modified refractive index region
120c TiO$_2$ layer
12B, 12C phase modulation layer
13 first light reflecting layer (first light confinement layer)
13a surface
14 second light reflecting layer (second light confinement layer)
110 spacer
111 partition member
112 resin injection opening
130 first light confinement layer
140 second light confinement layer
15 substrate
16 dichroic mirror
17 diffractive optical element

20*a*, 20*b*, 20*c*, 200*a* excitation light source
21 semiconductor substrate
21*a* main surface
21*b* back surface
22 active layer
23 PC layer
23*a* base layer
23*b* modified refractive index region
24 first cladding layer
25 second cladding layer
26 contact layer
27 first electrode (n-electrode)
27*a* opening
28 second electrode (p-electrode)
29 first DBR layer
30 second DBR layer
31 first electrode
33 slit
40 spatial light modulator
41 lens
42, 201, 202 excitation light source
290 insulating layer
500 submount
510 p-electrode pad
520 n-electrode pad
E1 first optical image portion
E2 second optical image portion
E3 0th-order light
D straight line
G center of gravity
Lex, Lex1, Lex2 excitation light
Lout light
Lout1 laser light
Lout2 optical image
O lattice point
Q center
R unit constituent region
RIN inner region
ROUT outer region
θ inclination angle

The invention claimed is:

1. An optical device comprising:
an upconversion layer containing an upconversion material configured to receive excitation light in a first wavelength range and output light in a second wavelength range shorter than the first wavelength range;
a first light reflecting layer having a light reflection characteristic of reflecting at least a part of light in the second wavelength range;
a second light reflecting layer having a light reflection characteristic of reflecting a part of light in the second wavelength range and transmitting the remainder, the second light reflecting layer being disposed such that the upconversion layer is located between the first light reflecting layer and the second light reflecting layer; and
a resonance mode forming layer provided between the upconversion layer and the first light reflecting layer or between the upconversion layer and the second light reflecting layer, the resonance mode forming layer including a base layer and a plurality of modified refractive index regions having a refractive index different from a refractive index of the base layer and two-dimensionally distributed on a reference surface perpendicular to a thickness direction of the resonance mode forming layer, and configured to form a resonance mode of the light in the second wavelength range along the reference surface.

2. An optical device comprising:
an upconversion layer containing an upconversion material configured to receive excitation light in a first wavelength range and output light in a second wavelength range shorter than the first wavelength range;
a first light confinement layer having a light reflection characteristic of reflecting at least a part of light in the second wavelength range;
a second light confinement layer having a light reflection characteristic of reflecting a part of light in the second wavelength range and transmitting the remainder, the second light confinement layer being disposed such that the upconversion layer is located between the first light confinement layer and the second light confinement layer; and
a resonance mode forming layer provided between the upconversion layer and the first light confinement layer or between the upconversion layer and the second light confinement layer, the resonance mode forming layer including a base layer and a plurality of modified refractive index regions having a refractive index different from a refractive index of the base layer and two-dimensionally distributed on a reference surface perpendicular to a thickness direction of the resonance mode forming layer, and configured to form a resonance mode of the light in the second wavelength range along the reference surface.

3. The optical device according to claim 2, wherein
each of the first light confinement layer and the second light confinement layer includes a light reflecting layer having a multilayer structure, or a single layer comprised of a single material having a substantially uniform refractive index distribution along a thickness direction from the first light confinement layer toward the second light confinement layer and having a refractive index lower than a refractive index of the upconversion layer.

4. The optical device according to claim 2, wherein
the second light confinement layer has a single-layer structure in which a part of the second light confinement layer including a layer surface facing the upconversion layer constitutes the base layer, and a plurality of recesses for defining the plurality of modified refractive index regions are provided on the layer surface.

5. An optical device comprising:
an upconversion layer containing an upconversion material configured to receive excitation light in a first wavelength range and output light in a second wavelength range shorter than the first wavelength range;
a first light confinement layer having a light reflection characteristic of reflecting at least a part of light in the second wavelength range;
a second light confinement layer having a light reflection characteristic of reflecting a part of light in the second wavelength range and transmitting the remainder, the second light confinement layer being disposed such that the upconversion layer is located between the first light confinement layer and the second light confinement layer, and having a single-layer structure in which a resonance mode of the light in the second wavelength range is formed; and
a resonance mode forming layer configured to form the resonance mode of the light in the second wavelength range, the resonance mode forming layer being provided on a side on which a layer surface of the second light confinement layer facing the upconversion layer is located, the resonance mode forming layer including a base layer constituting a part of the second light confinement layer, and a plurality of modified refractive index regions defined by a plurality of recesses two-dimensionally distributed on the layer surface of the second light confinement layer as a reference surface perpendicular to a thickness direction of the resonance mode forming layer, the plurality of recesses having a refractive index different from a refractive index of the base layer.

6. The optical device according to claim 1, wherein the resonance mode forming layer is a photonic crystal layer in which the plurality of modified refractive index regions are periodically arranged.

7. The optical device that outputs an optical image according to claim 1, wherein in a virtual square lattice set on the reference surface on which the plurality of modified refractive index regions are to be formed, each of the plurality of modified refractive index regions is arranged such that a line segment connecting a center of gravity of each of the plurality of modified refractive index regions and a corresponding lattice point among lattice points of the virtual square lattice has a rotation angle corresponding to the optical image with respect to the virtual square lattice in a state where the center of gravity is separated from the corresponding lattice point by a predetermined distance.

8. The optical device that outputs an optical image according to claim 1, wherein in a virtual square lattice set on the reference surface on which the plurality of modified refractive index regions are to be formed, a position of a center of gravity of each of the plurality of modified refractive index regions is located on a straight line that passes through a corresponding lattice point among lattice points of the virtual square lattice and that is inclined with respect to the square lattice, and a distance between the center of gravity and the corresponding lattice point is individually set according to the optical image.

9. The optical device according to claim 2, further comprising a diffractive optical element disposed on an opposite side of the upconversion layer with respect to the second light confinement layer.

10. The optical device according to claim 2, further comprising a spatial light modulator disposed on an opposite side of the upconversion layer with respect to the second light confinement layer.

11. The optical device according to claim 2, further comprising a dichroic mirror disposed on an opposite side of the upconversion layer with respect to the second light confinement layer, and having a light transmittance for light in the second wavelength range that is greater than a light transmittance for light in the first wavelength range.

12. The optical device according to claim 1, wherein the first wavelength range is a near-infrared range, and the second wavelength range is a visible range.

13. A light-emitting device comprising:
the optical device according to claim 2; and an excitation light source integrated with the optical device via the first light confinement layer, and configured to supply the excitation light to the upconversion layer.

14. The light-emitting device according to claim 13, wherein the excitation light source includes a photonic crystal surface emitting laser disposed on an opposite side of the upconversion layer with respect to the first light confinement layer, and a light transmittance of the first light confinement layer for light in the first wavelength range is greater than a light transmittance of the first light confinement layer for light in the second wavelength range.

15. The light-emitting device according to claim 14, wherein an area of a photonic crystal layer of the photonic crystal surface emitting laser as viewed from a stacking direction of the photonic crystal surface emitting laser is larger than an area of the upconversion layer as viewed from a stacking direction of the optical device.

16. The light-emitting device according to claim 15, wherein the photonic crystal surface emitting laser includes:
a semiconductor substrate having a main surface and a back surface;

a semiconductor stack provided on the main surface of the semiconductor substrate, the semiconductor stack including an active layer and a photonic crystal layer;

a first electrode comprised of metal and provided on the back surface of the semiconductor substrate; and a second electrode provided on the semiconductor stack, the first electrode has an opening through which the excitation light passes, and at least a part of the first light confinement layer is disposed within the opening of the first electrode.

17. The light-emitting device according to claim 14, wherein the excitation light source includes a plurality of photonic crystal surface emitting lasers arranged on an opposite side of the upconversion layer with respect to the first light confinement layer, and each having the same structure as the photonic crystal surface emitting laser, and the plurality of photonic crystal surface emitting lasers are arranged one-dimensionally or two-dimensionally along a surface of the first light confinement layer.

18. The light-emitting device according to claim 14, wherein the photonic crystal surface emitting laser includes:
a semiconductor substrate having a main surface and a back surface;

a semiconductor stack provided on the main surface of the semiconductor substrate, the semiconductor stack including an active layer and a photonic crystal layer;

a first electrode formed of a transparent conductive film and provided on the back surface of the semiconductor substrate;

a second electrode provided on the semiconductor stack, and the excitation light passes through the first electrode and reaches the first light confinement layer.

19. The light-emitting device according to claim 14, wherein an area of a photonic crystal layer of the photonic crystal surface emitting laser as viewed from a stacking direction of the photonic crystal surface emitting laser is smaller than an area of the upconversion layer as viewed from a stacking direction of the optical device.

20. The light-emitting device according to claim 19, wherein the photonic crystal surface emitting laser includes:

a semiconductor substrate having a main surface and a back surface;

a semiconductor stack provided on the main surface of the semiconductor substrate, the semiconductor stack including an active layer and a photonic crystal layer;

a first electrode provided on a region of the main surface of the semiconductor substrate, the region being exposed without being covered with the semiconductor stack; and a second electrode provided on the semiconductor stack, and the first light confinement layer is disposed on the back surface of the semiconductor substrate.

21. The light-emitting device according to claim 20, wherein the excitation light source includes a plurality of photonic crystal surface emitting lasers arranged on an opposite side of the upconversion layer with respect to the first light confinement layer, and each having the same structure as the photonic crystal surface emitting laser, and the plurality of photonic crystal surface emitting lasers are arranged one-dimensionally or two-dimensionally along a surface of the first light confinement layer.

22. The light-emitting device according to claim 17, wherein the photonic crystal surface emitting laser includes:

a semiconductor substrate having a main surface and a back surface;

a semiconductor stack provided on the main surface of the semiconductor substrate, the semiconductor stack including an active layer and a photonic crystal layer;

a first electrode formed of a transparent conductive film and provided on the back surface of the semiconductor substrate;

a second electrode provided on the semiconductor stack, and the excitation light passes through the first electrode and reaches the first light confinement layer.

* * * * *